US010170870B2

(12) United States Patent
Little et al.

(10) Patent No.: US 10,170,870 B2
(45) Date of Patent: *Jan. 1, 2019

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Hsueh-Lung Hsiao, New Taipei (TW); Ming-Lun Szu, New Taipei (TW); Chao-Chieh Chen, New Taipei (TW)

(73) Assignee: FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 15/688,920

(22) Filed: Aug. 29, 2017

(65) Prior Publication Data
US 2018/0109042 A1 Apr. 19, 2018

Related U.S. Application Data

(63) Continuation-in-part of application No. 15/346,642, filed on Nov. 8, 2016, now Pat. No. 9,912,111, and a
(Continued)

(51) Int. Cl.
*H01R 24/60* (2011.01)
*H01R 13/6585* (2011.01)
(Continued)

(52) U.S. Cl.
CPC ....... *H01R 13/6587* (2013.01); *H01R 12/724* (2013.01); *H01R 13/405* (2013.01);
(Continued)

(58) Field of Classification Search
CPC .......... H01R 13/6585; H01R 24/60; H01R 23/7073; H01R 23/6873; H01R 13/65802
(Continued)

(56) References Cited

U.S. PATENT DOCUMENTS 5,073,130 A 12/1991 Hosiden
6,755,689 B2 1/2004 Zhang et al.
(Continued)

FOREIGN PATENT DOCUMENTS

CM CN201868687 U 6/2011
CN 1253402 A 5/2000
(Continued)

OTHER PUBLICATIONS

Universal Serial Bus Type-C Cable and Connector Specification Revision 0.7 Working Draft Jan. xx, 2014, p. 13-14,20-21,33,38.
(Continued)

*Primary Examiner* — Gary Paumen
(74) *Attorney, Agent, or Firm* — Wei Te Chung; Ming Chieh Chang

(57) ABSTRACT

A receptacle connector includes an insulating housing including a base and a mating tongue extending from the base and the mating tongue defining a thicken step portion at a root near to the base, two rows of contacts with contacting section exposing to opposite surfaces of the mating tongue in front of the step portion and tail sections extending out of the base, and a pair of separate metallic collars respectively disposed upon the opposite surface of the step portion. Two opposite ends of each metallic collar are embedded in the step portion of the insulating housing via an inserting mold process.

18 Claims, 66 Drawing Sheets

Related U.S. Application Data continuation-in-part of application No. 15/338,323, filed on Oct. 29, 2016, now Pat. No. 9,748,702, said application No. 15/346,642 is a continuation-in-part of application No. 14/839,880, filed on Aug. 28, 2015, now Pat. No. 9,490,579, which is a continuation-in-part of application No. 14/688,993, filed on Apr. 16, 2015, now Pat. No. 9,496,664, said application No. 15/338,323 is a continuation of application No. 14/688,993, filed on Apr. 16, 2015, now Pat. No. 9,496,664, which is a continuation-in-part of application No. 14/558,732, filed on Dec. 3, 2014, now Pat. No. 9,490,594, said application No. 14/839,880 is a continuation-in-part of application No. 14/558,732, filed on Dec. 3, 2014, now Pat. No. 9,490,594, which is a continuation-in-part of application No. 14/542,550, filed on Nov. 15, 2014, now Pat. No. 9,350,126, said application No. 15/338,323 is a continuation-in-part of application No. 14/517,941, filed on Oct. 20, 2014, now Pat. No. 9,496,662, said application No. 14/542,550 is a continuation-in-part of application No. 14/517,941, filed on Oct. 20, 2014, now Pat. No. 9,496,662, said application No. 14/558,732 is a continuation-in-part of application No. 14/497,205, filed on Sep. 25, 2014, now Pat. No. 9,472,910, said application No. 14/688,993 is a continuation-in-part of application No. 14/497,205, filed on Sep. 25, 2014, now Pat. No. 9,472,910, said application No. 15/338,323 is a continuation-in-part of application No. 14/477,889, filed on Sep. 5, 2014, now Pat. No. 9,525,223, said application No. 14/497,205 is a continuation-in-part of application No. 14/477,889, filed on Sep. 5, 2014, now Pat. No. 9,525,223, said application No. 15/338,323 is a continuation-in-part of application No. 14/454,737, filed on Aug. 8, 2014, now Pat. No. 9,525,227, said application No. 14/477,889 is a continuation-in-part of application No. 14/454,737, filed on Aug. 8, 2014, now Pat. No. 9,525,227, said application No. 14/497,205 is a continuation-in-part of application No. 14/337,180, filed on Jul. 21, 2014, now Pat. No. 9,318,853, said application No. 14/454,737 is a continuation-in-part of application No. 14/337,180, filed on Jul. 21, 2014, now Pat. No. 9,318,853.

(60) Provisional application No. 62/044,195, filed on Aug. 30, 2014, provisional application No. 62/001,084, filed on May 21, 2014, provisional application No. 61/989,508, filed on May 6, 2014, provisional application No. 61/981,217, filed on Apr. 18, 2014, provisional application No. 61/949,232, filed on Mar. 6, 2014, provisional application No. 61/947,232, filed on Mar. 3, 2014, provisional application No. 61/943,310, filed on Feb. 22, 2014, provisional application No. 61/940,815, filed on Feb. 17, 2014, provisional application No. 61/926,270, filed on Jan. 11, 2014, provisional application No. 61/919,681, filed on Dec. 20, 2013, provisional application No. 61/917,363, filed on Dec. 18, 2013, provisional application No. 61/916,147, filed on Dec. 14, 2013, provisional application No. 61/899,276, filed on Nov. 3, 2013, provisional application No. 61/875,096, filed on Sep. 8, 2013, provisional application No. 61/867,584, filed on Aug. 19, 2013, provisional application No. 61/866,037, filed on Aug. 14, 2013, provisional application No. 61/863,896, filed on Aug. 8, 2013, provisional application No. 61/857,687, filed on Jul. 23, 2013, provisional application No. 61/856,077, filed on Jul. 19, 2013.

(51) Int. Cl.
  *H01R 13/6587* (2011.01)
  *H01R 43/24* (2006.01)
  *H01R 12/72* (2011.01)
  *H01R 13/405* (2006.01)
  *H01R 13/6581* (2011.01)
  H05K 1/18 (2006.01)
  H05K 1/11 (2006.01)
  H01R 24/28 (2011.01)
  H01R 107/00 (2006.01)
  H01R 13/6594 (2011.01)

(52) U.S. Cl.
  CPC ..... *H01R 13/6581* (2013.01); *H01R 13/6585* (2013.01); *H01R 24/60* (2013.01); *H01R 43/24* (2013.01); *H01R 13/6594* (2013.01); *H01R 24/28* (2013.01); *H01R 2107/00* (2013.01); *H05K 1/117* (2013.01); *H05K 1/184* (2013.01); *H05K 2201/09063* (2013.01); *H05K 2201/10189* (2013.01); *Y10T 29/4922* (2015.01)

(58) Field of Classification Search
  USPC ............ 439/607.35–607.4, 607.05, 660
  See application file for complete search history.

(56) References Cited

U.S. PATENT DOCUMENTS

| | | | |
|---|---|---|---|
| 7,320,618 B2 | 1/2008 | Cho Hsuan Tai | |
| 7,758,379 B2 | 7/2010 | Chen | |
| 7,922,534 B2* | 4/2011 | Lin | H01R 13/64 439/544 |
| 8,087,944 B2 | 1/2012 | Kumamoto et al. | |
| 8,454,388 B2* | 6/2013 | Song | H01R 12/707 439/607.36 |
| 8,517,766 B2* | 8/2013 | Golko | H01R 13/516 439/607.41 |
| 8,517,773 B2 | 8/2013 | Lee et al. | |
| 8,968,031 B2 | 3/2015 | Simmel et al. | |
| 9,281,642 B1 | 3/2016 | Tseng et al. | |
| 9,300,095 B2 | 3/2016 | Lin et al. | |
| 9,312,641 B2 | 4/2016 | Wang et al. | |
| 9,318,856 B2 | 4/2016 | MacDougall et al. | |
| 9,350,126 B2* | 5/2016 | Little | H01R 24/60 |
| 9,379,499 B2 | 6/2016 | Miyoshi et al. | |
| 9,472,910 B2* | 10/2016 | Little | H01R 24/60 |
| 9,490,579 B2* | 11/2016 | Little | H01R 13/642 |
| 9,490,594 B2* | 11/2016 | Little | H01R 24/60 |
| 9,496,664 B2* | 11/2016 | Little | H01R 13/6587 |
| 9,525,223 B2* | 12/2016 | Little | H01R 13/6658 |
| 9,748,702 B2* | 8/2017 | Little | H01R 13/6587 |
| 2007/0049100 A1 | 3/2007 | Tsai | |
| 2008/0003881 A1 | 1/2008 | Wu | |
| 2009/0156027 A1 | 6/2009 | Chen | |
| 2010/0267261 A1 | 10/2010 | Lin et al. | |
| 2013/0095702 A1 | 4/2013 | Golko et al. | |
| 2014/0024257 A1 | 1/2014 | Castillo et al. | |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tzviskos et al. | |
| 2015/0340813 A1 | 11/2015 | Ng et al. | |
| 2015/0340815 A1 | 11/2015 | Gao et al. | |

(56) References Cited

U.S. PATENT DOCUMENTS

| | | | |
|---|---|---|---|
| 2015/0340825 A1 | 11/2015 | Ng et al. | |
| 2016/0118752 A1 | 4/2016 | Guo et al. | |

FOREIGN PATENT DOCUMENTS

| | | | |
|---|---|---|---|
| CN | 2454802 | Y | 10/2001 |
| CN | 2655454 | Y | 11/2004 |
| CN | 2724249 | Y | 9/2005 |
| CN | 2728006 | Y | 9/2005 |
| CN | 2821921 | Y | 9/2006 |
| CN | 201029143 | Y | 2/2008 |
| CN | 201078847 | Y | 6/2008 |
| CN | 201107821 | Y | 8/2008 |
| CN | 201178194 | | 1/2009 |
| CN | 201230066 | Y | 4/2009 |
| CN | 101573840 | A | 11/2009 |
| CN | 201387960 | Y | 1/2010 |
| CN | 201430237 | Y | 3/2010 |
| CN | 201498627 | U | 6/2010 |
| CN | 201623280 | U | 11/2010 |
| CN | 201708399 | U | 1/2011 |
| CN | 201717435 | U | 1/2011 |
| CN | 201741935 | U | 2/2011 |
| CN | 201741937 | U | 2/2011 |
| CN | 201868687 | U | 6/2011 |
| CN | 201966346 | U | 9/2011 |
| CN | 102280732 | B | 12/2011 |
| CN | 202076514 | U | 12/2011 |
| CN | 102437482 | A | 5/2012 |
| CN | 102456967 | A | 5/2012 |
| CN | 103107439 | A | 5/2012 |
| CN | 202217831 | U | 5/2012 |
| CN | 202231226 | U | 5/2012 |
| CN | 202282514 | U | 6/2012 |
| CN | 102544812 | A | 7/2012 |
| CN | 102655293 | A | 9/2012 |
| CN | 202423735 | | 9/2012 |
| CN | 202513384 | U | 10/2012 |
| CN | 202737282 | | 2/2013 |
| CN | 202856089 | U | 4/2013 |
| CN | 103081253 | A | 5/2013 |
| CN | 203242848 | U | 10/2013 |
| CN | 103401087 | A | 11/2013 |
| CN | 103427263 | A | 12/2013 |
| CN | 203326282 | U | 12/2013 |
| CN | 103515790 | A | 1/2014 |
| CN | 103579820 | A | 2/2014 |
| CN | 103647172 | A | 3/2014 |
| CN | 203481540 | U | 3/2014 |
| CN | 103762479 | A | 4/2014 |
| CN | 203521683 | | 4/2014 |
| CN | 203521683 | U | 4/2014 |
| CN | 104377509 | A | 2/2015 |
| CN | 204243365 | U | 4/2015 |
| CN | 204577669 | U | 8/2015 |
| KR | 2020100004799 | U | 5/2010 |
| TW | 371520 | | 10/1999 |
| TW | 452247 | | 8/2001 |
| TW | M266600 | | 6/2005 |
| TW | M288035 | | 2/2006 |
| TW | M299952 | | 10/2006 |
| TW | M357077 | | 5/2009 |
| TW | M386661 | | 8/2010 |
| TW | M387401 | | 8/2010 |
| TW | M391213 | | 10/2010 |
| TW | M398256 | | 2/2011 |
| TW | M398262 | | 2/2011 |
| TW | M426911 | | 4/2011 |
| TW | I427870 | | 6/2011 |
| TW | M414692 | | 10/2011 |
| TW | M443957 | | 12/2012 |
| TW | M453995 | | 5/2013 |
| TW | M454654 | | 6/2013 |
| TW | 201328064 | A | 7/2013 |
| TW | M471688 | | 2/2014 |
| TW | M475728 | | 4/2014 |
| WO | WO2009147791 | | 12/2009 |
| WO | WO2013/020359 | | 2/2013 |

OTHER PUBLICATIONS

USB Type-C Specification 0.9c05—May 18, 2014, p. 24-44,47,53-64,84-86.
Universal Serial Bus Type-C Cable and Connector Specification Revision 1.0 Aug. 11, 2014, p. 18-19,28-48,51,55,58,59-63,65-67,70,93,96-99.107,110-113.

* cited by examiner

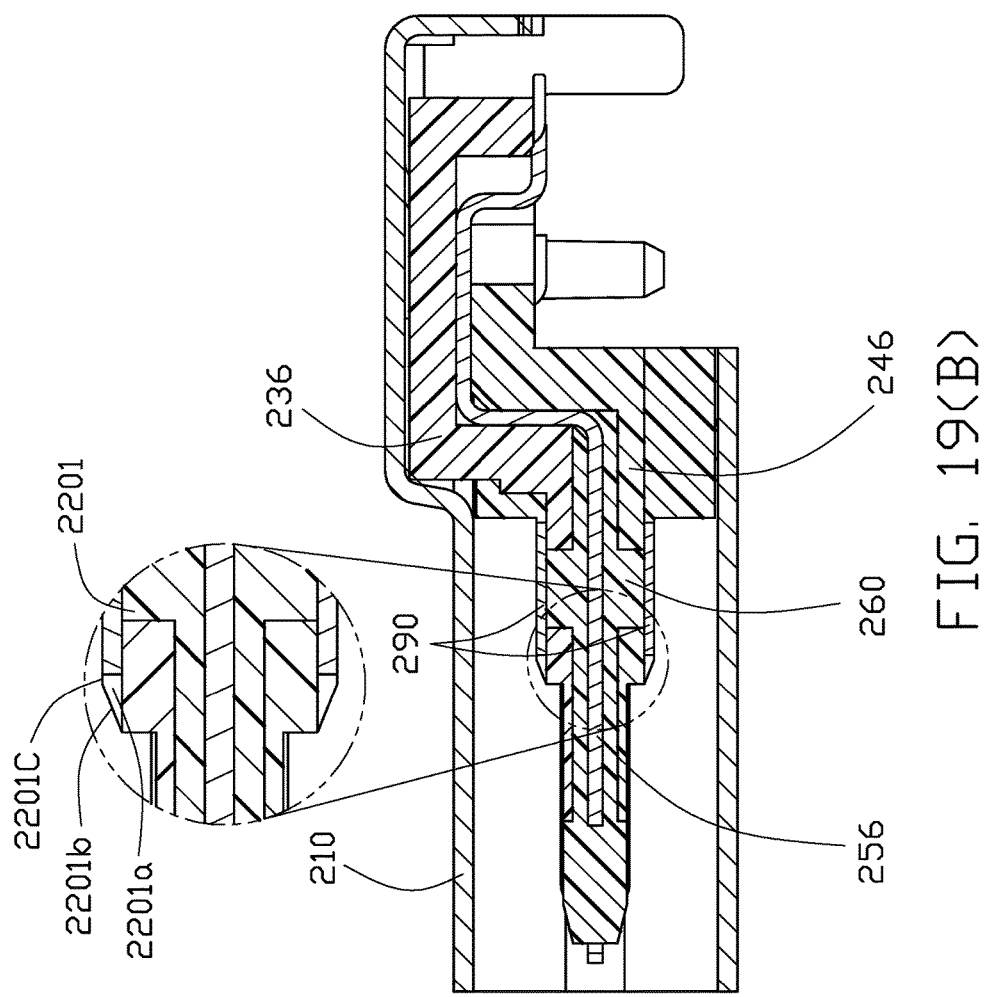

FLIPPABLE ELECTRICAL CONNECTOR

CROSS REFERENCE TO RELATED APPLICATIONS

This application is a continuation-in-part of the co-pending application Ser. No. 15/346,642 filed Nov. 8, 2016, and Ser. No. 15/338,323 filed Oct. 29, 2016, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to a receptacle connector, comprising an insulating housing comprising a base and a mating tongue extending from the base, the mating tongue defining a thicken step portion at a root near to the base; two rows of contacts with contacting section exposing to opposite surfaces of the mating tongue in front of the step portion and tail sections extending out of the base; a pair of separate metallic collars respectively disposed upon the opposite surface of the step portion. Two opposite ends of each metallic collar are embedded in the step portion of the insulating housing via an inserting mold process.

Accordingly, the object of the present invention is to a receptacle connector adapted for mounting on a printed circuit board, comprising an insulating housing defining a base and a mating tongue forwardly extending therefrom in a front-to-back direction with a thicken step structure formed around a root thereof in transverse direction and a vertical direction perpendicular to the front-to-back direction, the mating tongue defining an upper and lower surfaces thereof; a row of upper contacts and a row of lower contacts disposed in the insulative housing with contacting sections exposed upon the upper and lower surfaces of the mating tongue respectively; a shielding plate embedded in the mating tongue and the base, the shielding plate defines a pair of lateral locking side edges, and a metallic shield retained on the base and surrounding the mating tongue to define a mating cavity among the shield and the mating tongue. A rear wall covers a back side of a lower portion of the base of the insulative housing so as to efficiently prevent EMI which invades through the mating cavity from rearwardly entering an interior around the printed circuit board.

Other objects, advantages and novel features of the invention will become more apparent from the following detailed description when taken in conjunction with the accompanying drawings.

BRIEF DESCRIPTION OF THE DRAWINGS

FIG. 19(B) is a side cross-sectional view of the receptacle connector of FIG. 9;

DETAILED DESCRIPTION OF THE PREFERRED EMBODIMENT

Figure 1:
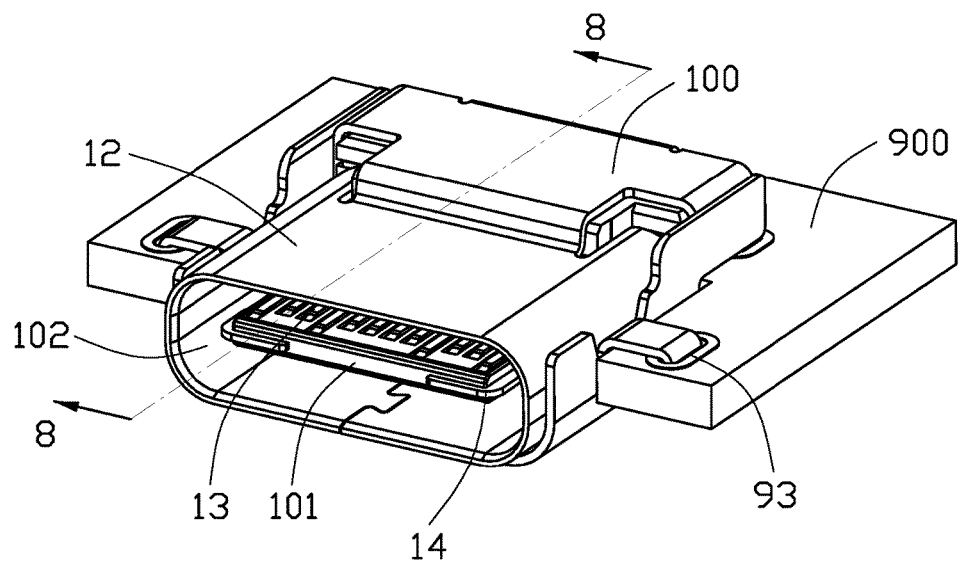
FIG. 1 is a perspective view of a receptacle connector of a first embodiment of the instant invention, which is mounted upon a printed circuit board (PCB) in a sink manner.
Figure 2:
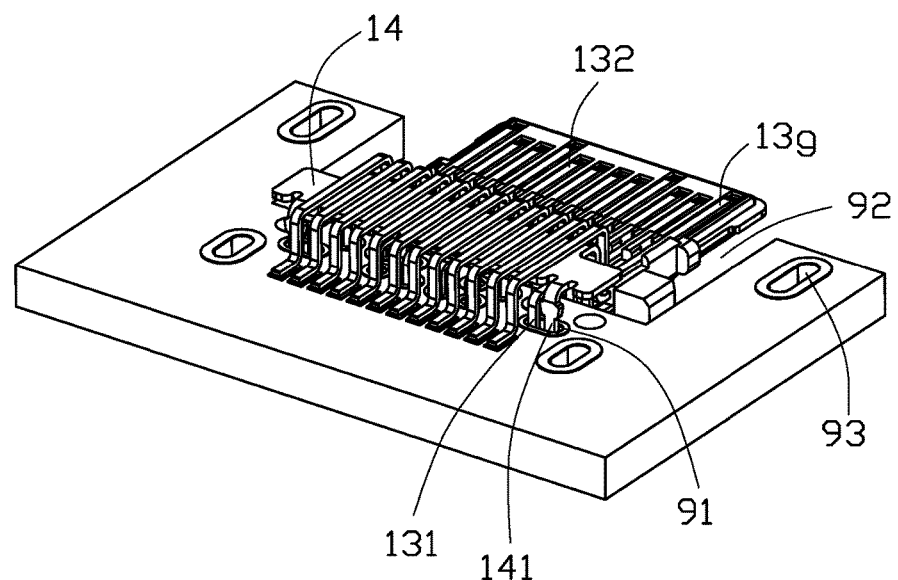
FIG. 2 is a perspective view of the partial receptacle connector and the PCB.
Figure 3:
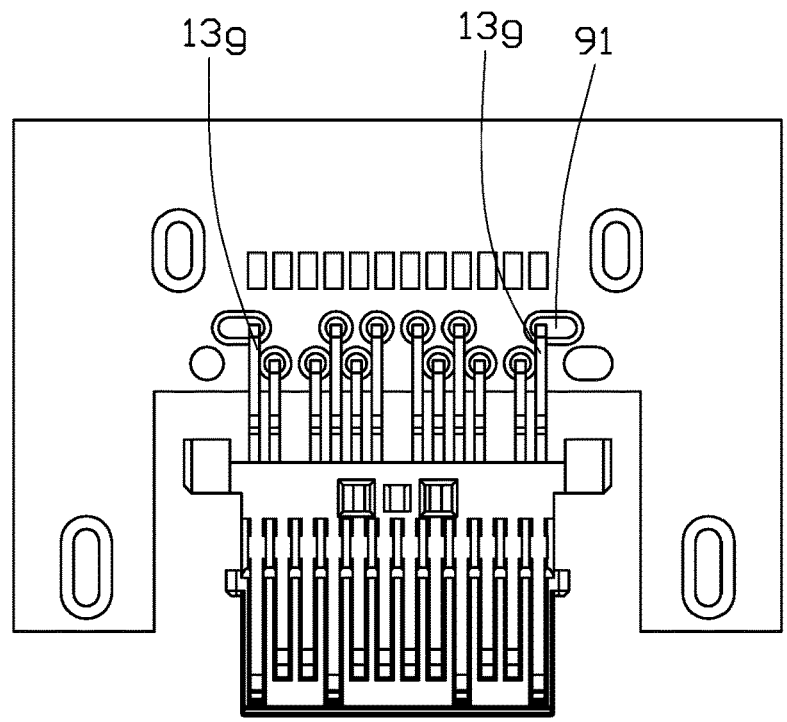
FIG. 3 is a top view of the partial receptacle connector and the PCB of FIG. 2 wherein upper contacts and the shielding plate are taken away.
Figure 4:
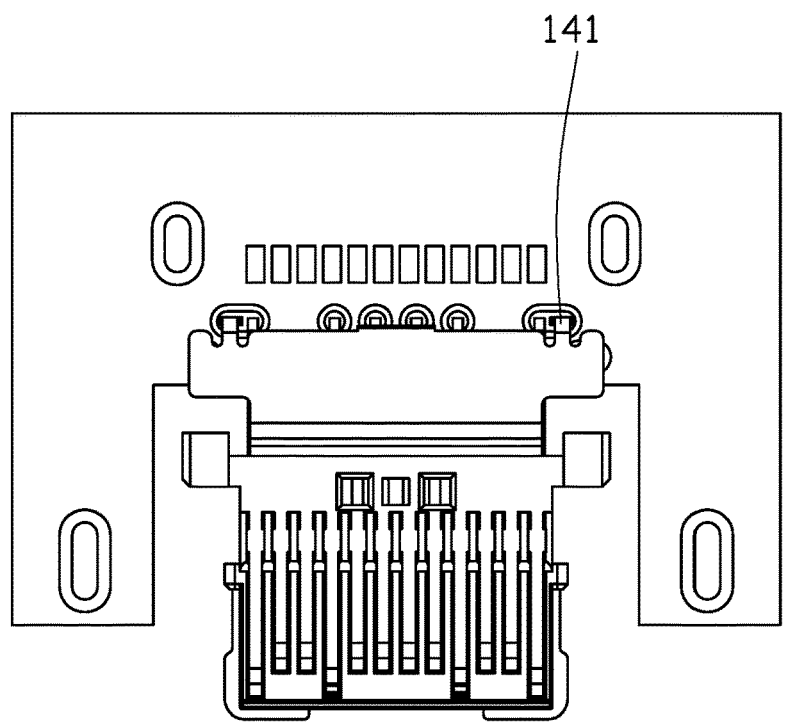
FIG. 4 is a top view of the partial receptacle connector and the PCB of FIG. 2 wherein the upper contacts are taken away.
Figure 5:
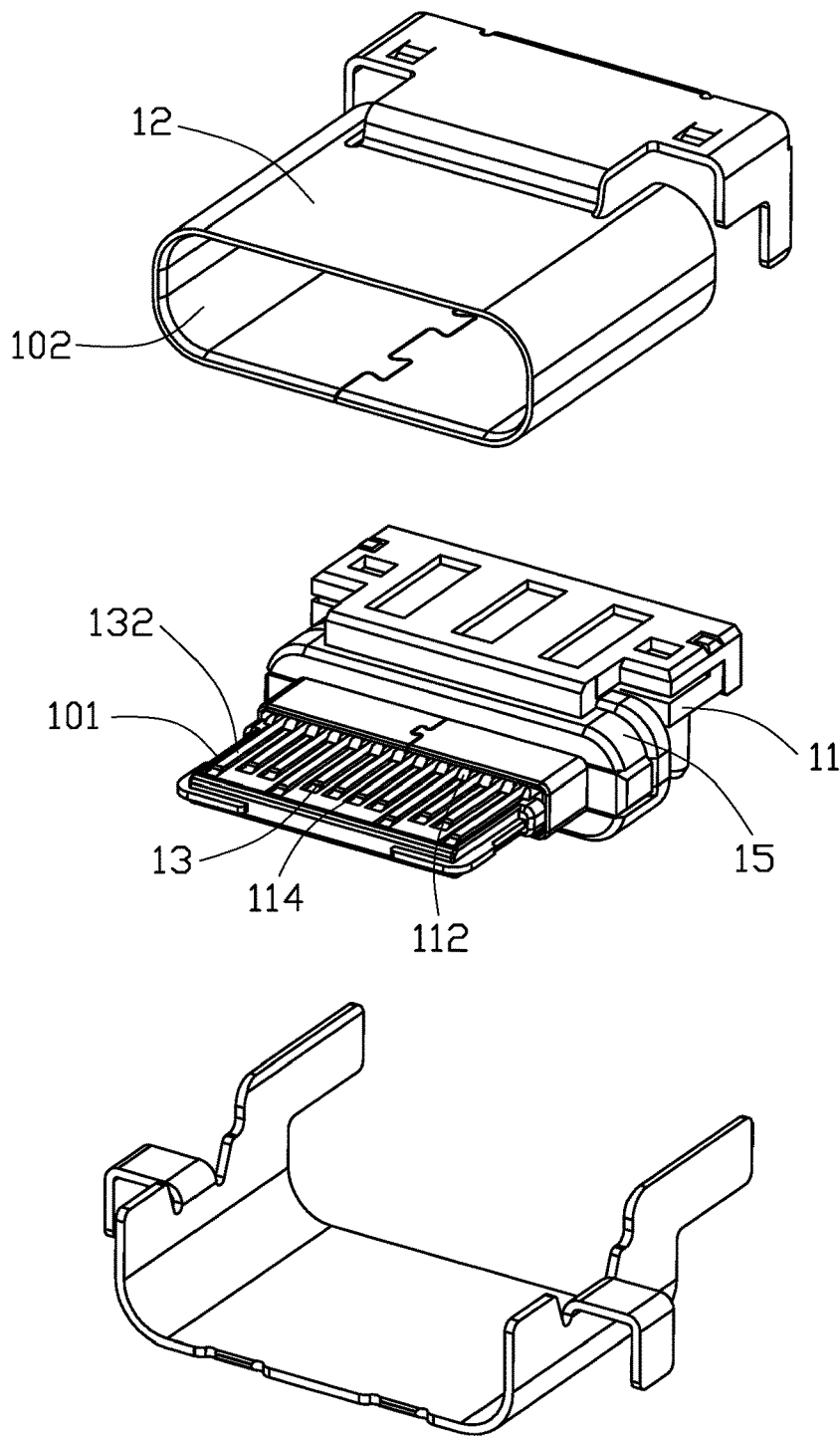
FIG. 5 is a front and top partially exploded perspective view of the receptacle connector of FIG. 1.

Reference will now be made in detail to the preferred embodiment of the present invention.

FIGS. 1-8 show a plug connector 10 mated with a receptacle connector 50 mounted in a notch 102 of a printed circuit board. 100, of a first embodiment of this present invention.

The receptacle connector 50 includes an insulative housing 52 with a mating tongue 54 forwardly extending in a capsular mating cavity 57 of a metallic shield 56 which encloses the housing 52.

Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto.

Figure 15:
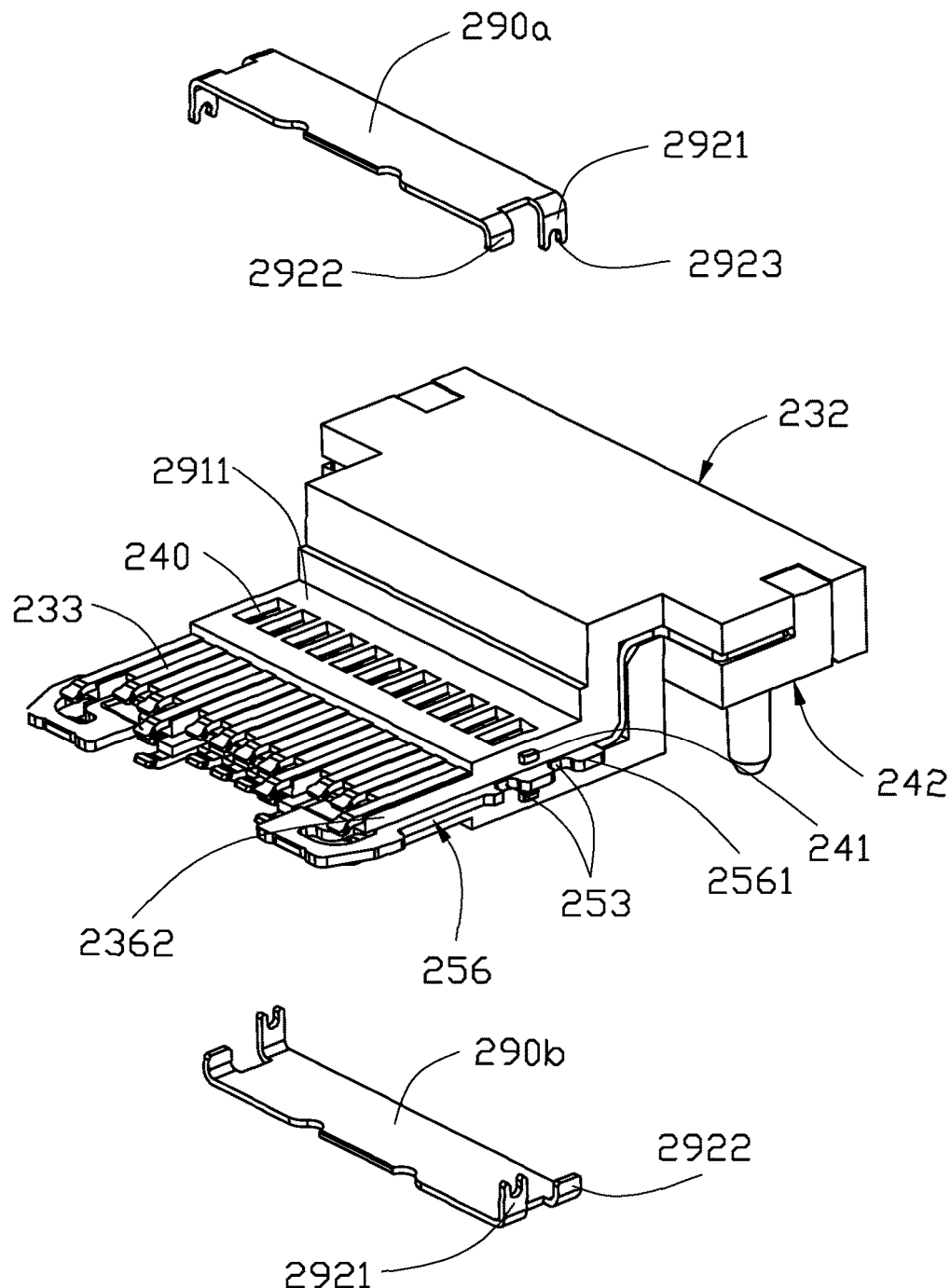
FIG. 15 is a further front assembled perspective view of the portion of the terminal module of the receptacle connector of FIG. 14.
Figure 16A:
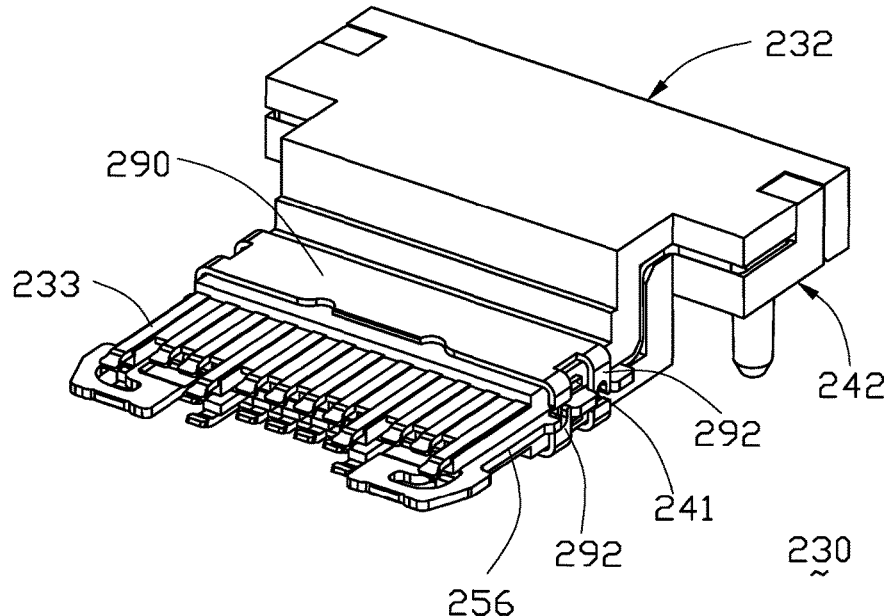
FIG. 16(A) is a further front assembled perspective view of a portion of the terminal module of the receptacle connector of FIG. 15 before the second molding process.
Figure 16B:
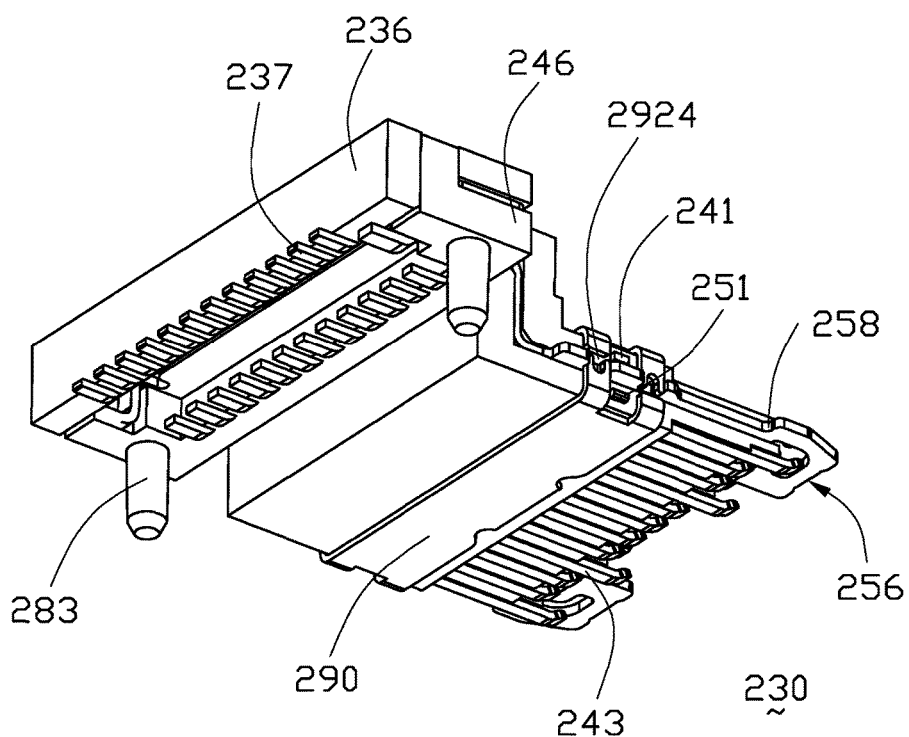
FIG. 16(B) is a rear assembled perspective view of the portion of the terminal module of the receptacle connector of FIG. 15 before the second insert molding process.

A step structure 62 is formed around a root of the mating tongue 54. A one piece metallic EMI collar 64 includes a loop structure 66 intimately surrounding the step structure 62. The collar 64 further includes an L-shaped extending plate 65 equipped with embossments 63 thereon and received in the recess 61 of the lower piece 72 of the housing 52 (illustrated later) for mechanically and electrically connecting to the shield 56. The detailed structures of EMI collar 64 may be also referred to the embodiment disclosed in FIG. 15.

The housing 52 is composed of the upper piece 70 and a lower piece 72 commonly sandwiching therebetween a middle piece 74 which forms the mating tongue 54. The upper row contacts 58 are associated with the upper piece 70, the lower row contacts 58 are associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. Understandably, the housing 52 and the associated contacts 58 may be deemed wholly as a so-called terminal module implying the terminals being integrally formed within an insulator. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. In an alternate embodiment, the thinner area 78 may be totally removed from the shielding plate 76. The lower piece 72 includes a pair of mounting posts 80 receiving in the corresponding through hole for mounting the housing 52 to the printed circuit board 100. The lower piece 72 further forms a pair of recessions 49 to receive the corresponding retention tangs 37 of the shield 56.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethrough as an alignment spacer. Notably, the shielding plate 76 forms a front edge section 69 extending forwardly beyond a front edge of the mating tongue 54 for anti-mismating consideration, and a pair of lateral edge sections 67 for locking with a latch 39 of the plug connector 10 (illustrated later). In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes an upside-down U-shaped structure (not labeled) on a rear portion covering the rear portion of the housing 52 with a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Figure 6:
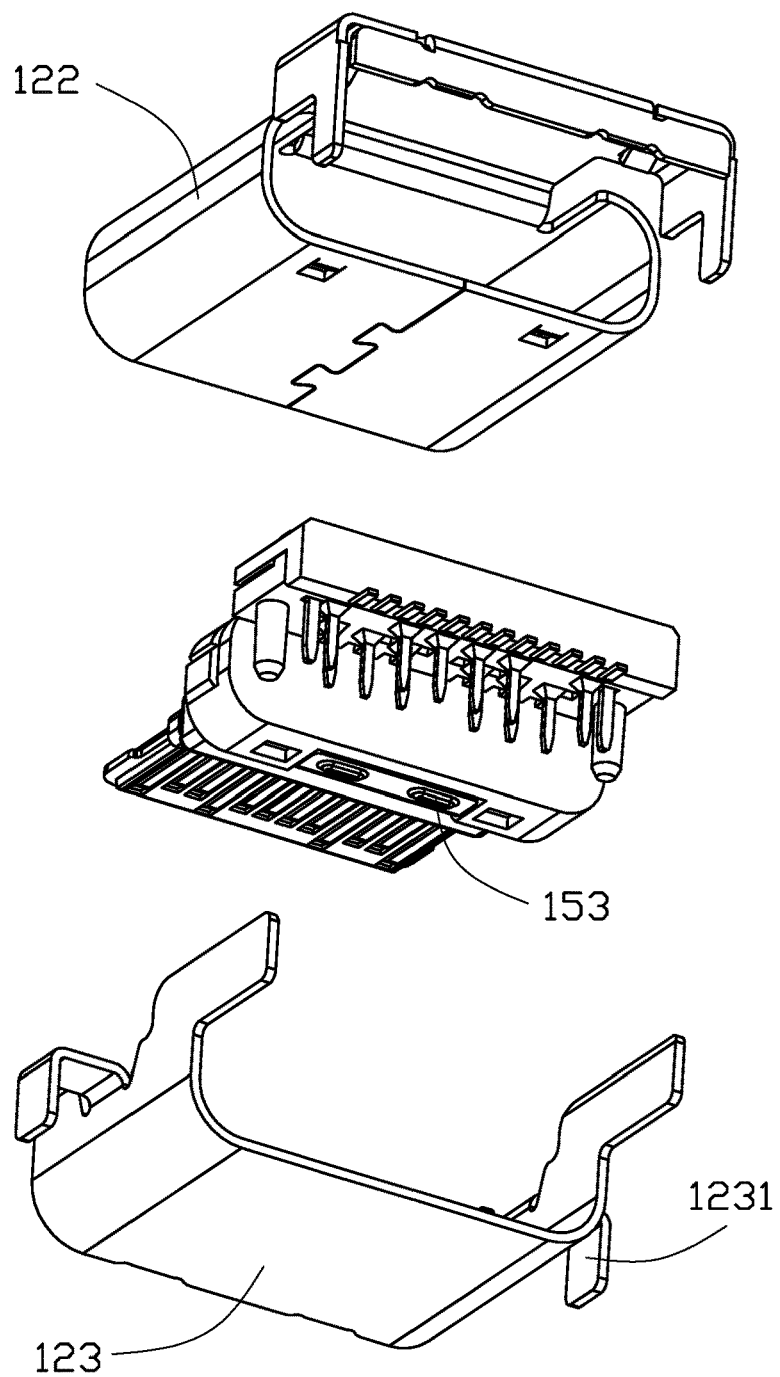
FIG. 6 is a rear and bottom partially exploded perspective view of the receptacle connector of FIG. 1.

Referring to FIGS. 9-19(B), according to a second embodiment of the invention the receptacle connector 200 includes a terminal module 220 enclosed in the metallic shield 210, the terminal module 220 includes a vertical base 2205, a horizontal base 2206 and a mating tongue 294 extends forwards from the vertical base 2205. The terminal module 220 essentially includes a main basis 230 as a semi-finished part, and a filler 260 applied upon and filled within the main basis 230 via second insert molding process. The main basis 230 includes an upper part 232 and a lower part 242 commonly sandwiching a shielding plate 256 therebetween. The upper part 232 includes a plurality of upper contacts 234 embedded within an upper insulator 236 via a first insert molding process with the contacting sections 233 exposed upon an upper surface of the upper insulator 236, the tail sections 237 exposed behind the upper insulator 236, and retention protrusions 235 located between the contacting sections 233 and the tail sections 247 in the front-to-back direction and embedded within the upper insulator 236. Notably, the upper insulator 236 essentially forms a Z-shaped structure in a side view with an additional rear wall and further defines a plurality of grooves 238 extending along the front-to-back direction while hidden under the upper surface of the upper insulator 236, and a plurality of through holes 240 in the vertical direction and in communication with the corresponding grooves 238, respectively. The through holes 240 are formed for receiving mold cores which are used to press against contacts carries during the first inserted mold process and then the contact carriers are cut to separate the contacts by cutting-tools going through the through holes 240. Furthermore, the reason why the through holes 240 communicate with the corresponding grooves 238 respectively, is for the second insert molding process illustrated later. A pair of protrusions 241 is formed on two opposite lateral sides of the upper insulator 236 for the second insert molding process. The upper insulator 236 is further equipped with a downward protrusion 239 and a recession 231 for coupling to the counterparts of the lower part 242 during assembling to the final main basis 230. Understandably, as shown in FIGS. 18(A) and 18(B), the upper insulator 236 forms a zigzag structure in a cross-sectional view to receive the corresponding contacting sections 233 and to form the corresponding grooves 238 so that the contacting sections 233 and the grooves 238 are not aligned with in the vertical direction but being laterally offset from each other. Furthermore, a transverse groove 280 is formed in the upper insulator 236 to intersect with the plurality of grooves 238 and under the upper surface of the upper insulator 236 for integration/reinforcement consideration during the second insert molding process. It is noted that the upper insulator 236 is terminated behind the corresponding tips 2331 of the contacting sections 233 so as to expose only the corresponding tips of the contacting sections 233 compared with the full contacting sections of the first embodiment as shown in FIG. 6.

Figure 18A:
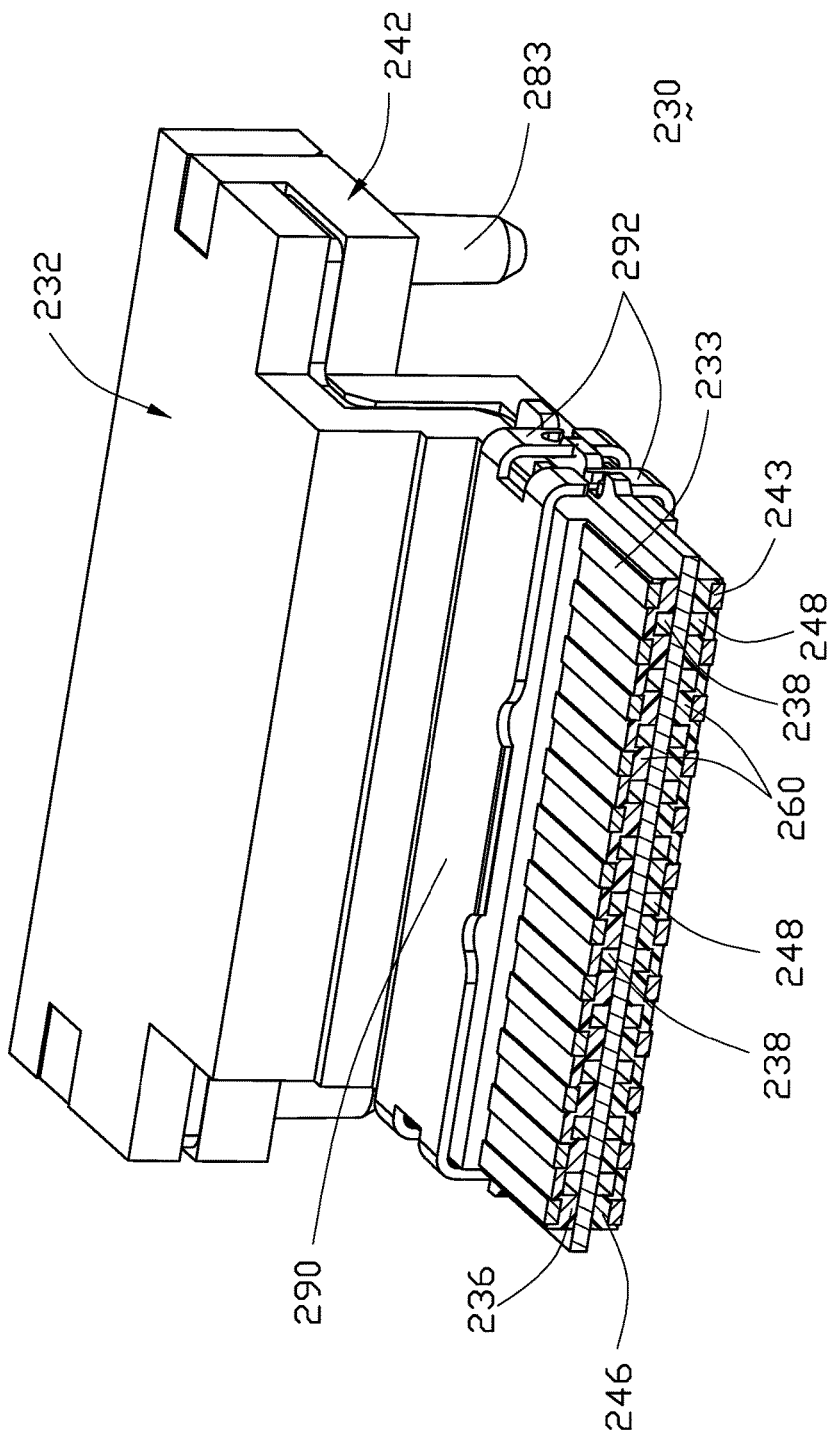
FIG. 18(A) is a front perspective view of the portion of the terminal module of the receptacle connector of FIG. 16(A) to show the structures thereof wherein a front section is removed to expose the corresponding grooves therein.
Figure 18B:
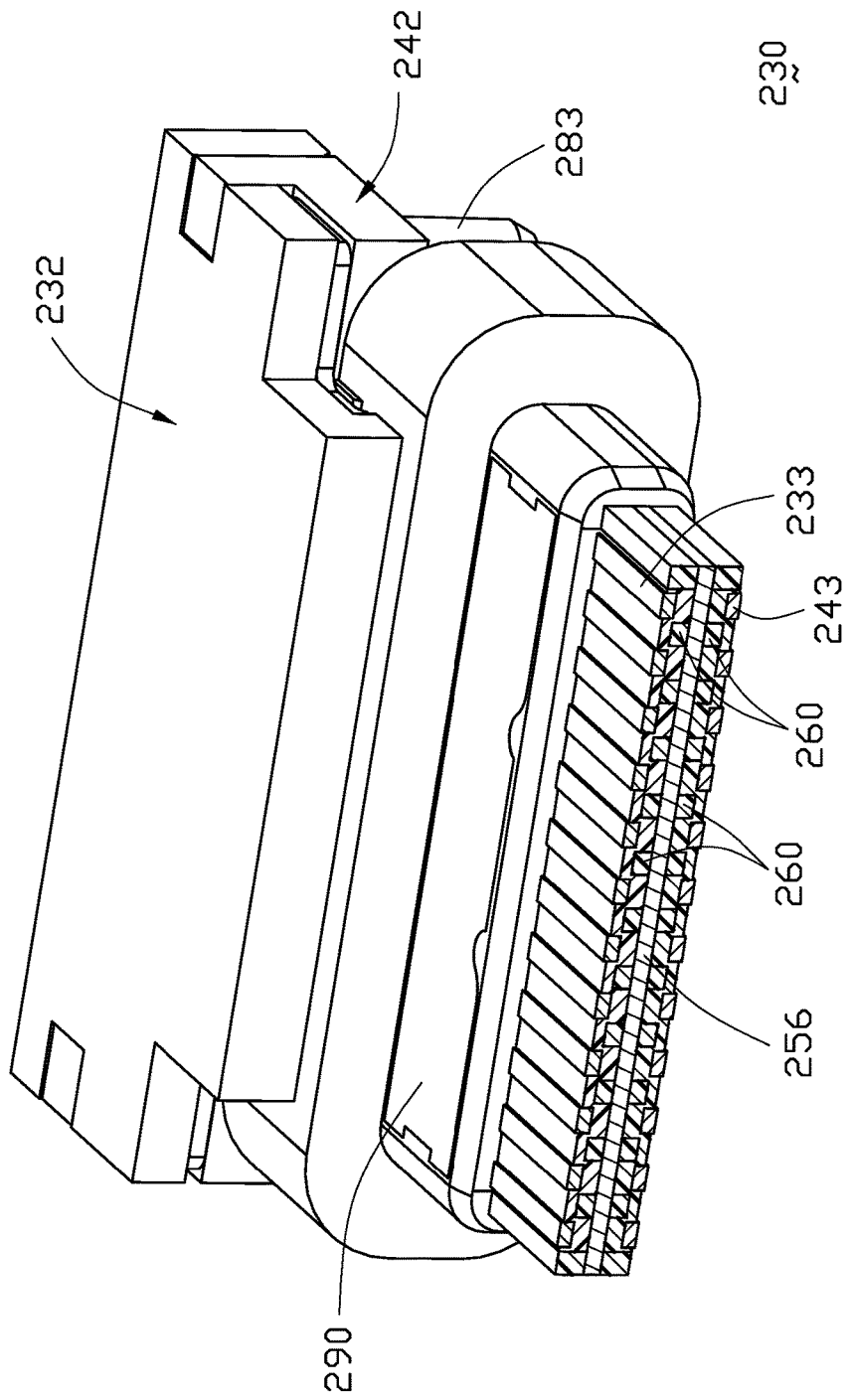
FIG. 18(B) is a front perspective view of the portion of the terminal module of the receptacle connector of FIG. 17 to show the corresponding grooves are filled with the insulative material after the second molding process.

The arrangement of the lower part 242 are similar to that of the upper part 232 only with some minor differences. The lower part 242 includes a plurality of lower contacts 244 embedded with a lower insulator 246 via another first insert molding process with the lower contacting sections 243 exposed upon a lower surface of the lower insulator 246, the lower tail sections 247 exposed behind the lower insulator 246, and the retention protrusions 245 located between the contacting sections 243 and the tail sections 247 in the front-to-back direction and embedded within the lower insulator 246. Notably, the lower insulator 246 forms a Z-shaped structure in a side view and defines a plurality of grooves 248 extending along the front-to-back direction and hidden above the bottom surface of the lower insulator 242, and a plurality of through holes 250 communicating with the corresponding grooves 248 in the vertical direction, respectively. A pair of protrusions 251 are formed on two opposite lateral sides of the lower insulator 246 for the second insert molding process. The lower insulator 246 is further equipped with an upward protrusion 249 and a recession 261 for coupling to the corresponding recession 231 and the downward protrusion 239 of the upper part 232 during assembling to the final main basis 230. Understandably, as shown in FIGS. 18(A) and 18(B), the lower insulator 246 forms a zigzag structure in a cross-sectional view to receive the corresponding contacting sections 243 and to form the corresponding grooves 248 so that the contacting sections 243 and the grooves 248 are not aligned with in the vertical direction but being laterally offset from each other. Furthermore, a transverse groove 282 is formed in the upper insulator 246 to intersect with the plurality of grooves 248 and under the lower surface of the upper insulator 246 for integration/reinforcement consideration during the second insert molding process. It is noted that the lower insulator 246 is terminated behind the corresponding tip sections of the contacting sections 243 so as to expose only the corresponding tip sections 2431 of the contacting sections 243 compared with the full contacting sections of the first embodiment as shown in FIG. 6. A pair of downwardly extending mounting posts 283 are located on a rear side of the lower insulator 246.

The shielding plate 256 forms a pair of locking side edges 258 for locking with the corresponding latches of the corresponding plug connector as shown in the first embodiment, and a central large through opening 257 and a pair of small through openings 259 in a front portion for allowing the fillers 260 to occupy therein during the second insert molding process. A pair of legs 255 are formed on a rear portion of the shielding plate 256, a pair of notches 253 are formed in a side-projecting portion 2561 of each lateral side of the shielding plate 256, and a large cutout 254 is formed in a front portion of the shielding plate 256. A pair of metallic collars 290 are respectively mounted upon the upper insulator 236 and the lower insulator 246, respectively. Each of collars 290 includes a pair of retention lugs 292 respectively located on two opposite lateral sides and embedded in the insulative housing.

During assembling the main basis 230, the upper part 232 and the lower part 242 are assembled with each other along the vertical direction with the shielding plate 256 sandwiched therebetween in the vertical direction wherein the protrusions 239 and 249 extend through the central opening 247 to be received within the corresponding recessions 261 and 231, and the retention lugs 292 are received in the corresponding notches 253

The retention lug 290 at each end of the collar 290 includes a first lug 2921 with a half-circle notch 2923 at each free end of the first lug and a second lug 2922. The upper collar 290a and the lower collar 290b are sidewardly assembly to a root of the tongue portions 2911 of the assembled upper and lower parts. The first and second lugs of the upper and lower collars are received in the corresponding notches 253, the first and second lugs in the same notch 253 are aligned with each other and spaced from each other with a gap 2924 which will be fully filled with the filler 260. The protrusions 241, 251 are located between the retention lugs.

Figure 17:
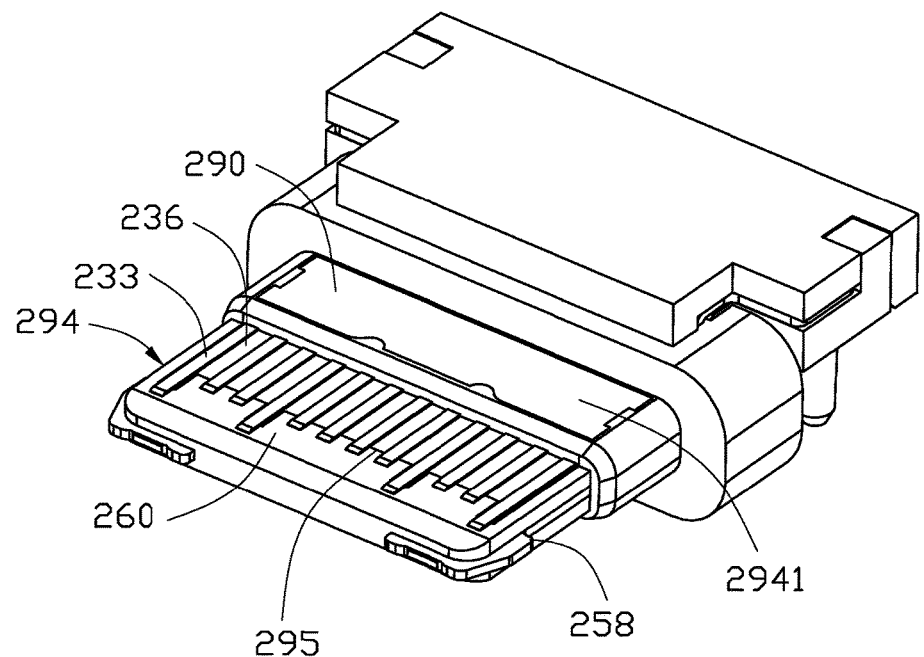
FIG. 17 is a front assembled perspective view of the terminal module of the receptacle connector of FIG. 16(A) after the second insert molding process.
Figure 17A:
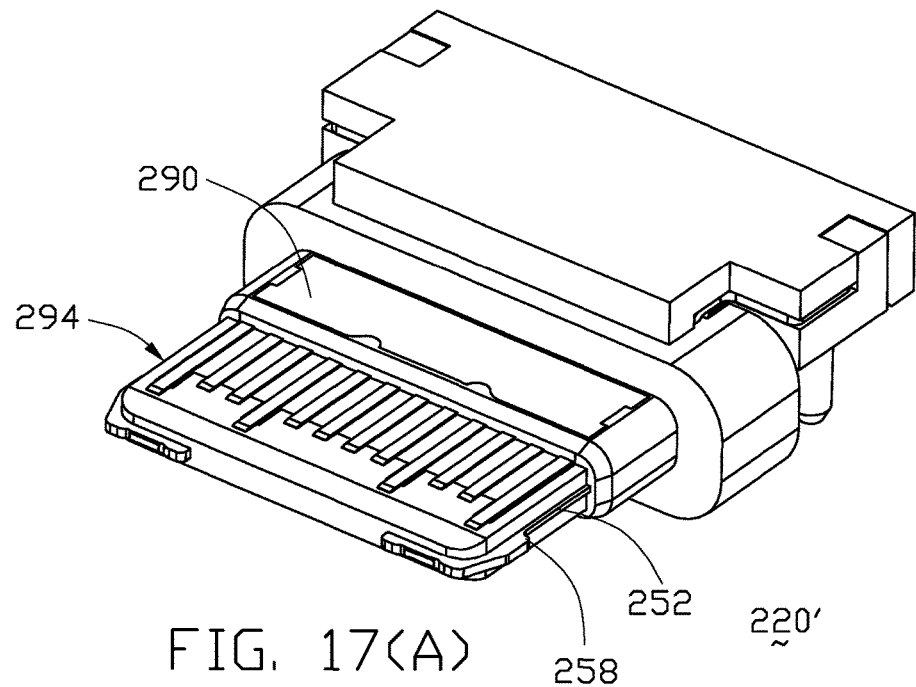
FIG. 17(A) is a front assembled perspective view of another embodiment of the terminal module of the receptacle connector of FIG. 16.

The filler 260 is applied upon and into the main basis 230 to form the complete terminal module 220 via the second insert molding process. The filler 260 fills the grooves 238, 248, the through openings 240, 250, the transverse grooves 280, 282, the central opening 257, the pair of openings 259, the large cutout 254, and also covers two opposite lateral side portions and the front side portion of the main basis 230 while exposing the pair locking side edges 258. FIG. 17(A) shows another embodiment similar to the first embodiment where the lateral sides 252 of the shielding plate 256 are fully exposed to an exterior along the forwardly extending mating tongue 294 of which the contacting sections 233, 243 are exposed on two opposite surfaces. The collars 290 are exposed to an exterior for mating with the spring plates of the corresponding plug connector.

Figure 7:
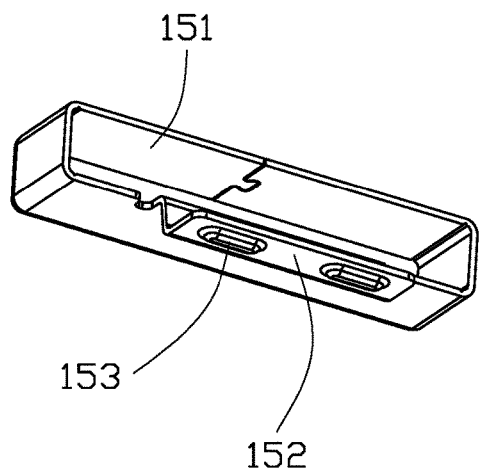
FIG. 7 is an enlarged perspective view of the metallic EMI collar of the receptacle connector.
Figure 8:
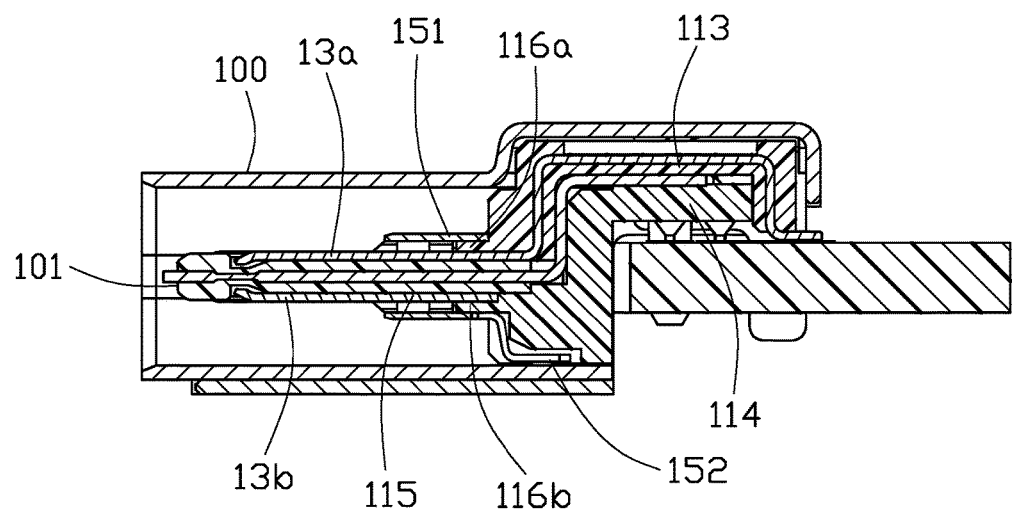
FIG. 8 is a cross-sectional view of the receptacle connector taken along lines 8-8 in FIG. 1.
Figure 9:
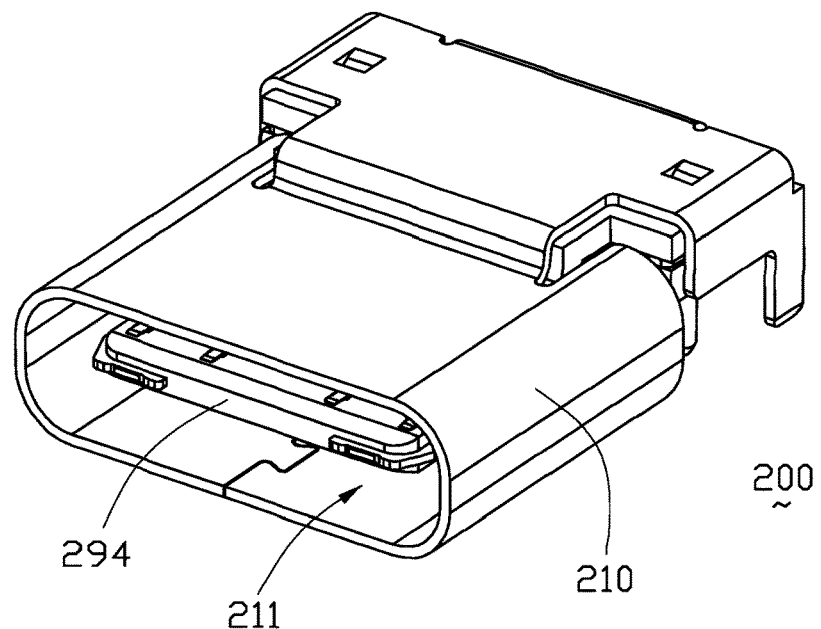
FIG. 9 is a front assembled perspective view of a second embodiment of the receptacle connector mounted to the printed circuit board.
Figure 10A:
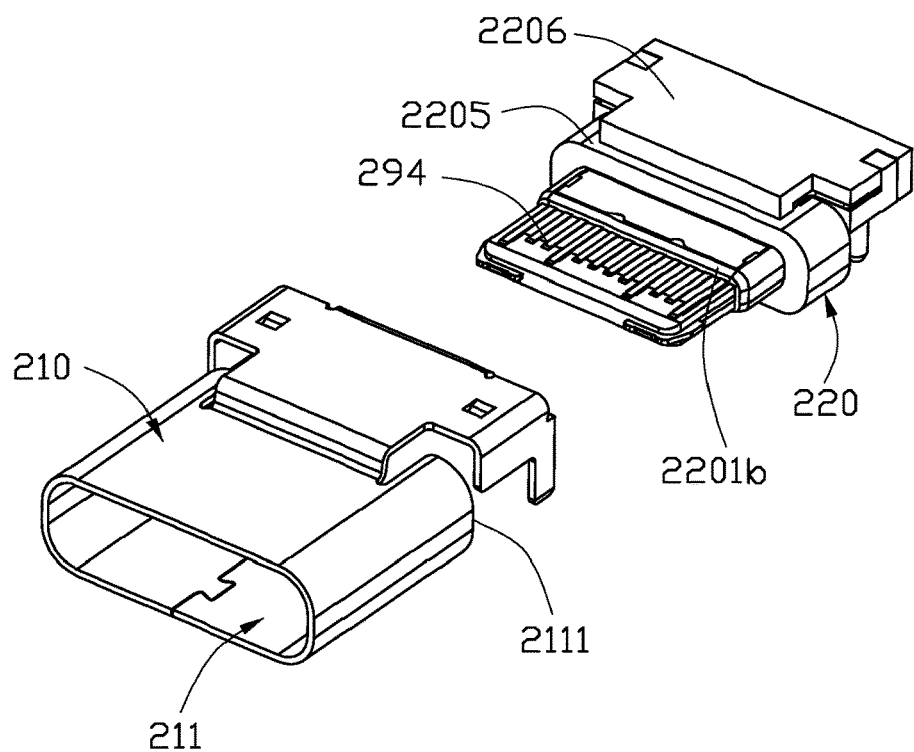
FIG. 10(A) is a front partially exploded downward perspective view of the receptacle connector mounted upon the printed circuit board of FIG. 9.
Figure 10B:
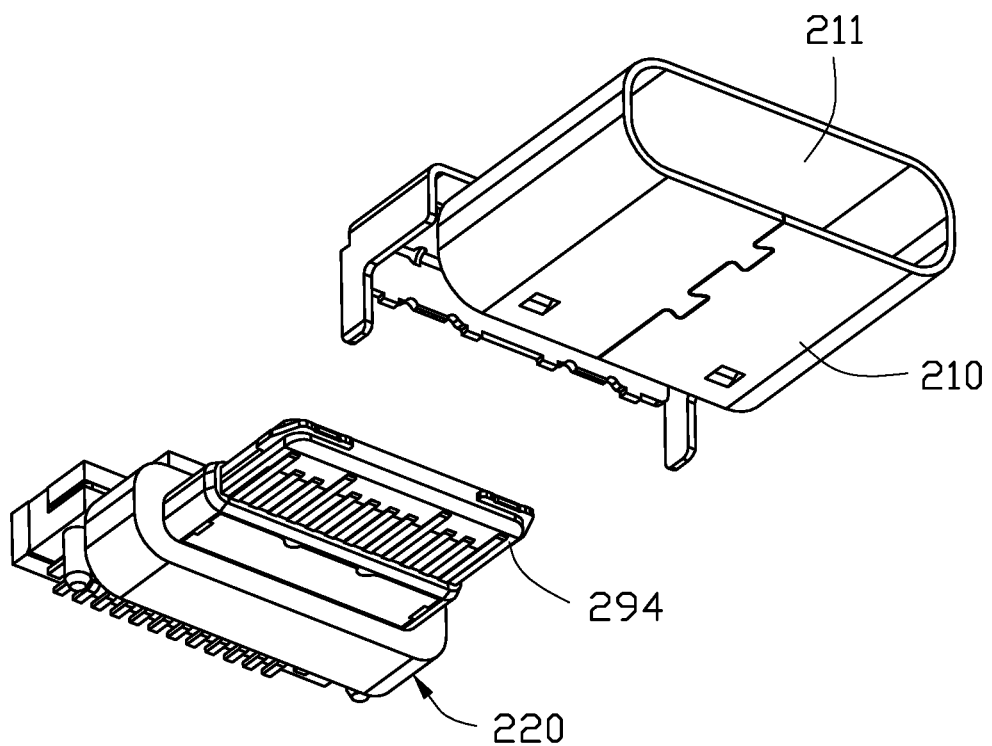
FIG. 10(B) is a rear partially exploded upward perspective view of the receptacle connector of FIG. 9.
Figure 11A:
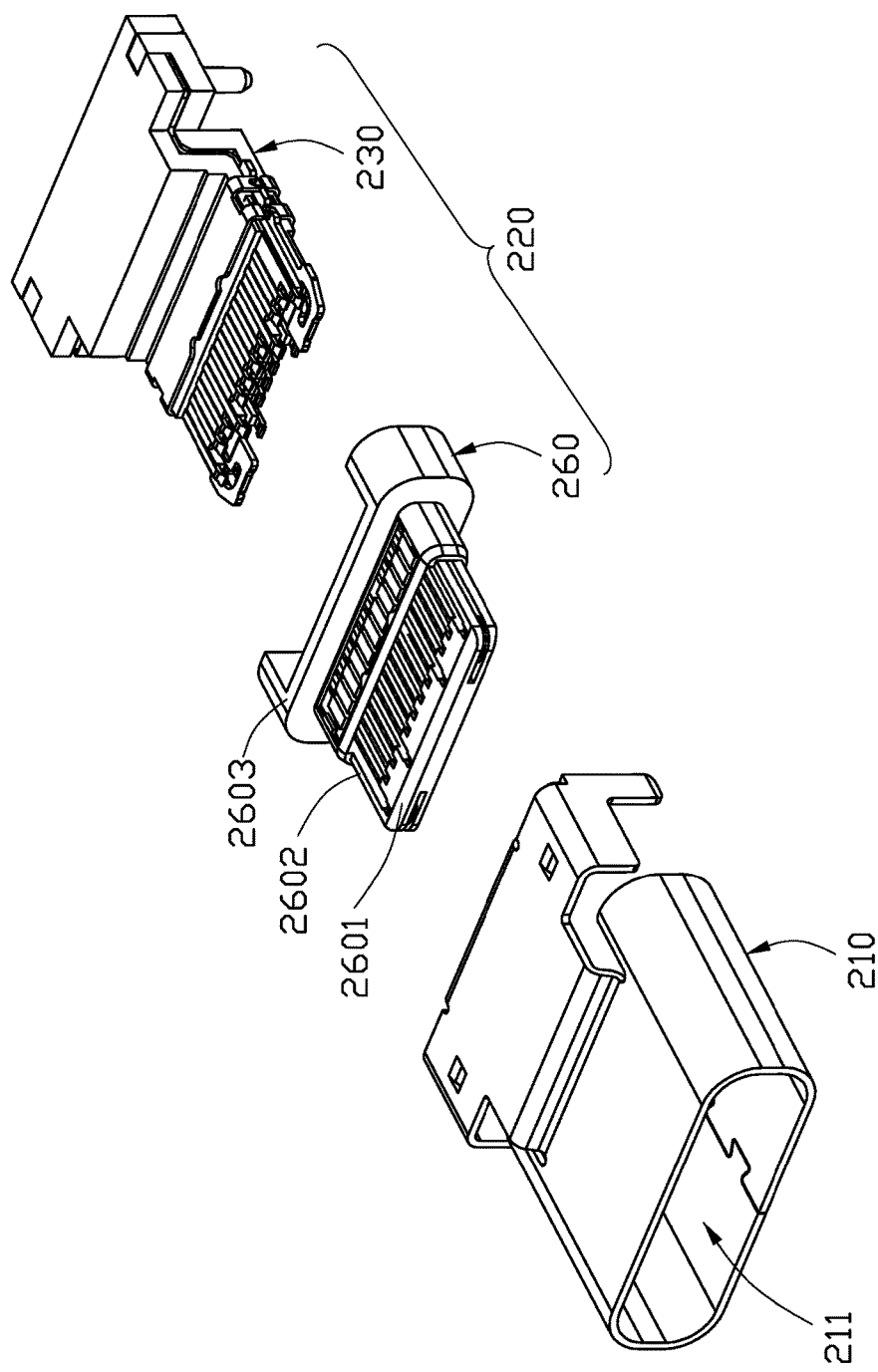
FIG. 11(A) is a further front partially exploded downward perspective view of the receptacle connector of FIG. 10(A)
Figure 11B:
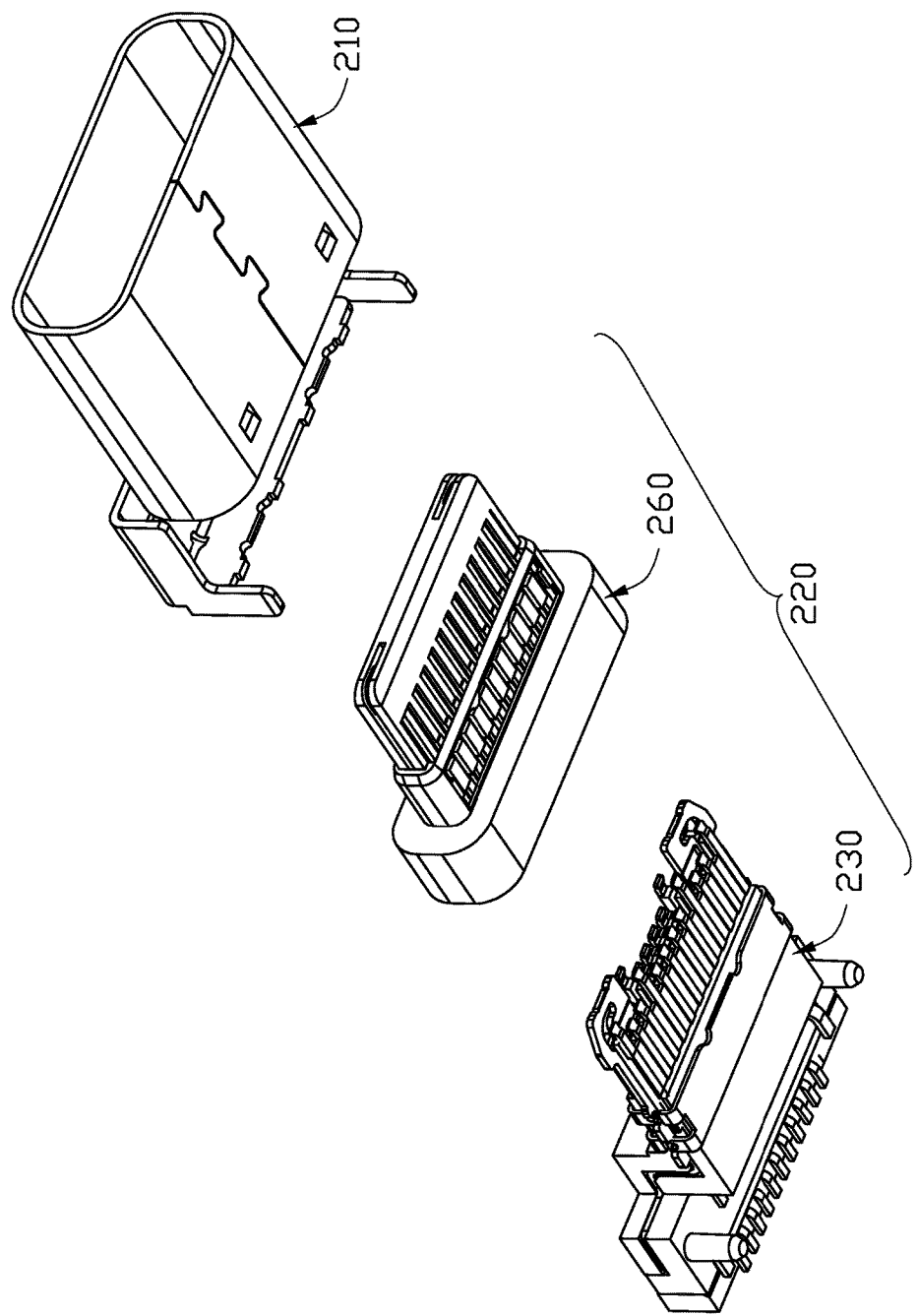
FIG. 11(B) is a further front partially exploded upward perspective view of the receptacle connector of FIG. 10(B)
Figure 12A:
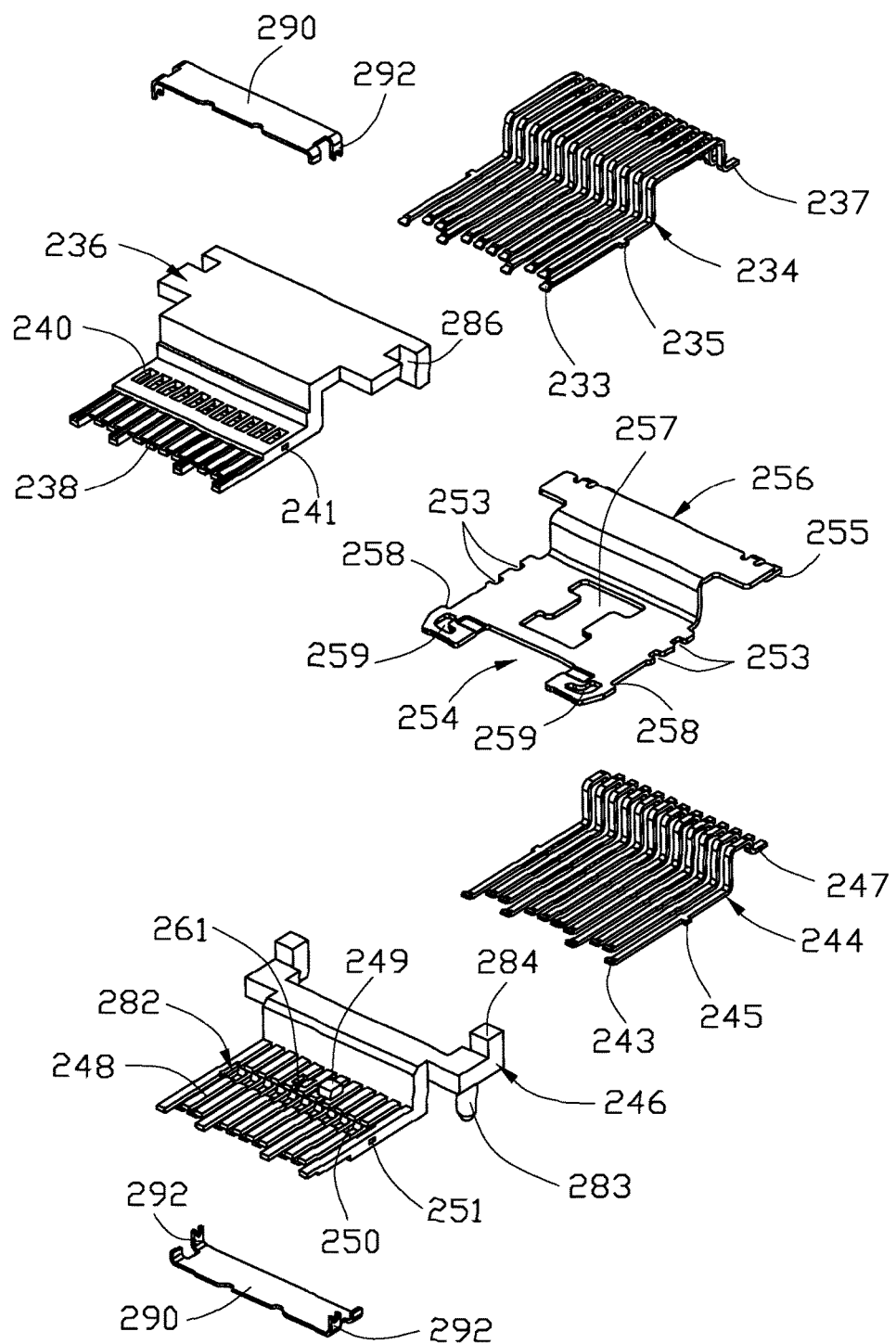
FIG. 12(A) is a front exploded downward perspective view of the portion of the terminal module of the receptacle connector of FIG. 11(A) before the second molding process.
Figure 12B:
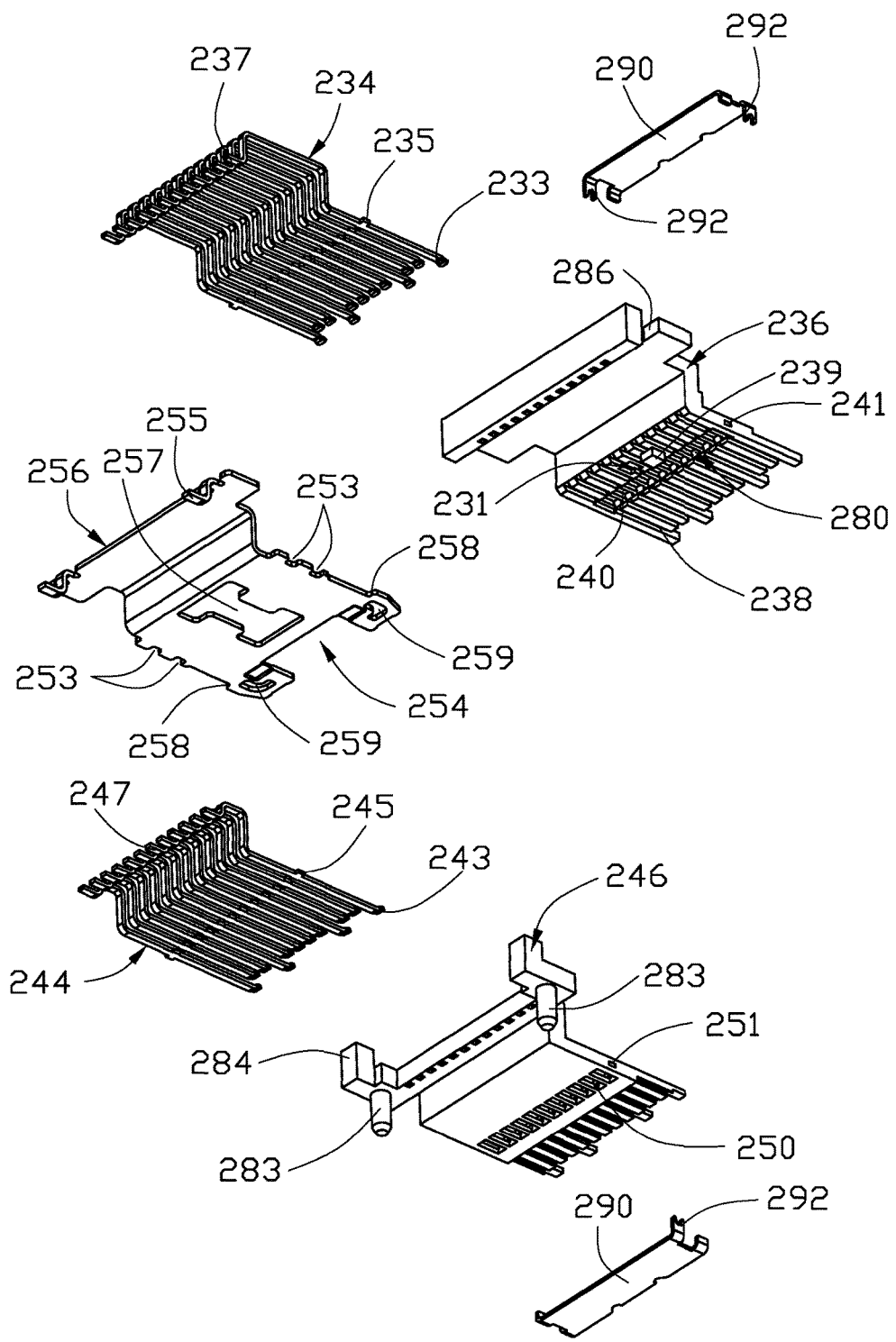
FIG. 12(B) is a rear exploded upward perspective view of the portion of the terminal module of the receptacle connector of FIG. 11(B) before the second molding process.
Figure 13A:
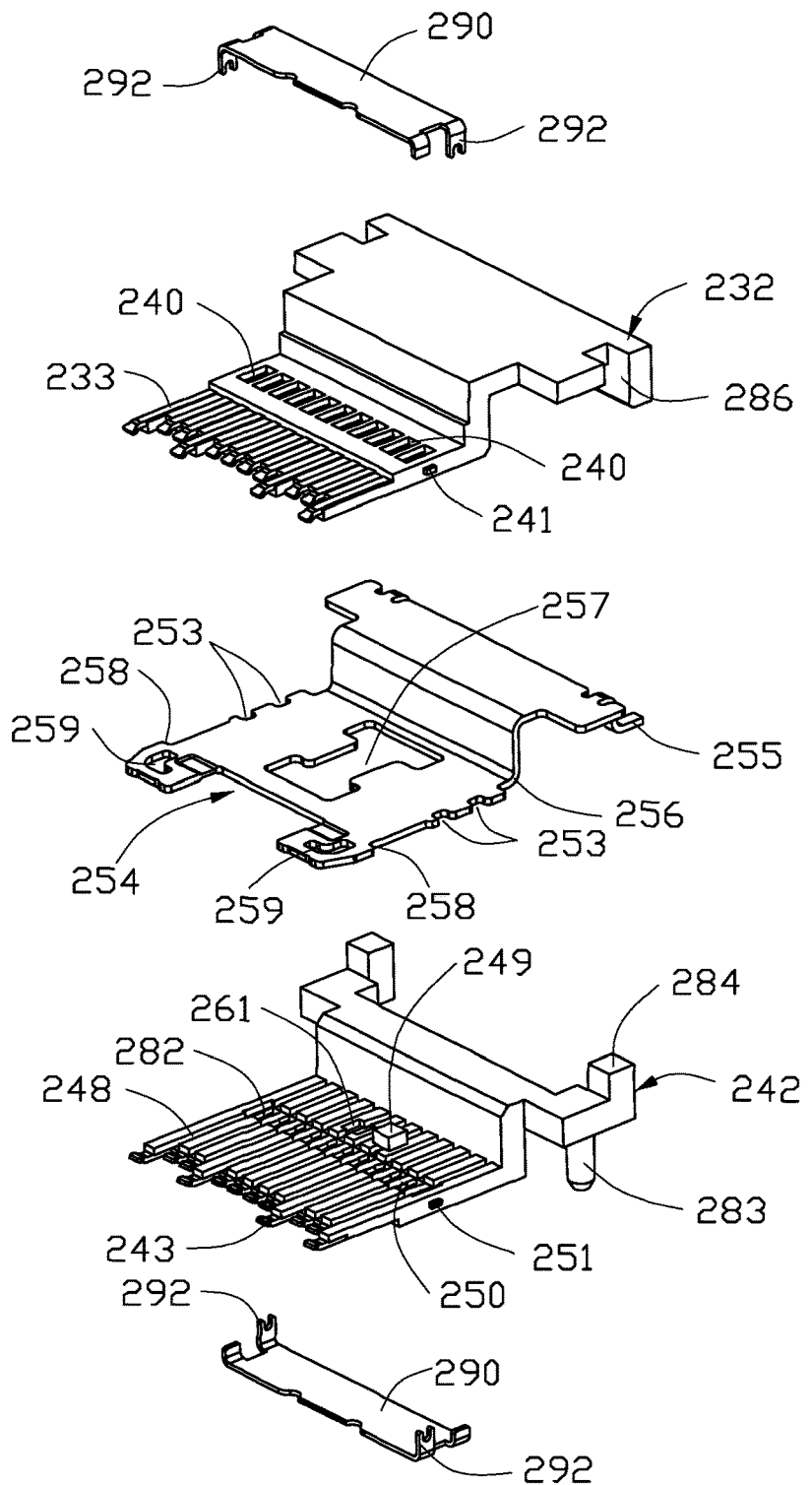
FIG. 13(A) is a front exploded downward perspective view of the portion of the terminal module of the receptacle connector of FIG. 11(A) wherein the housing and the contacts are pre-assembled together before the second molding process.
Figure 13B:
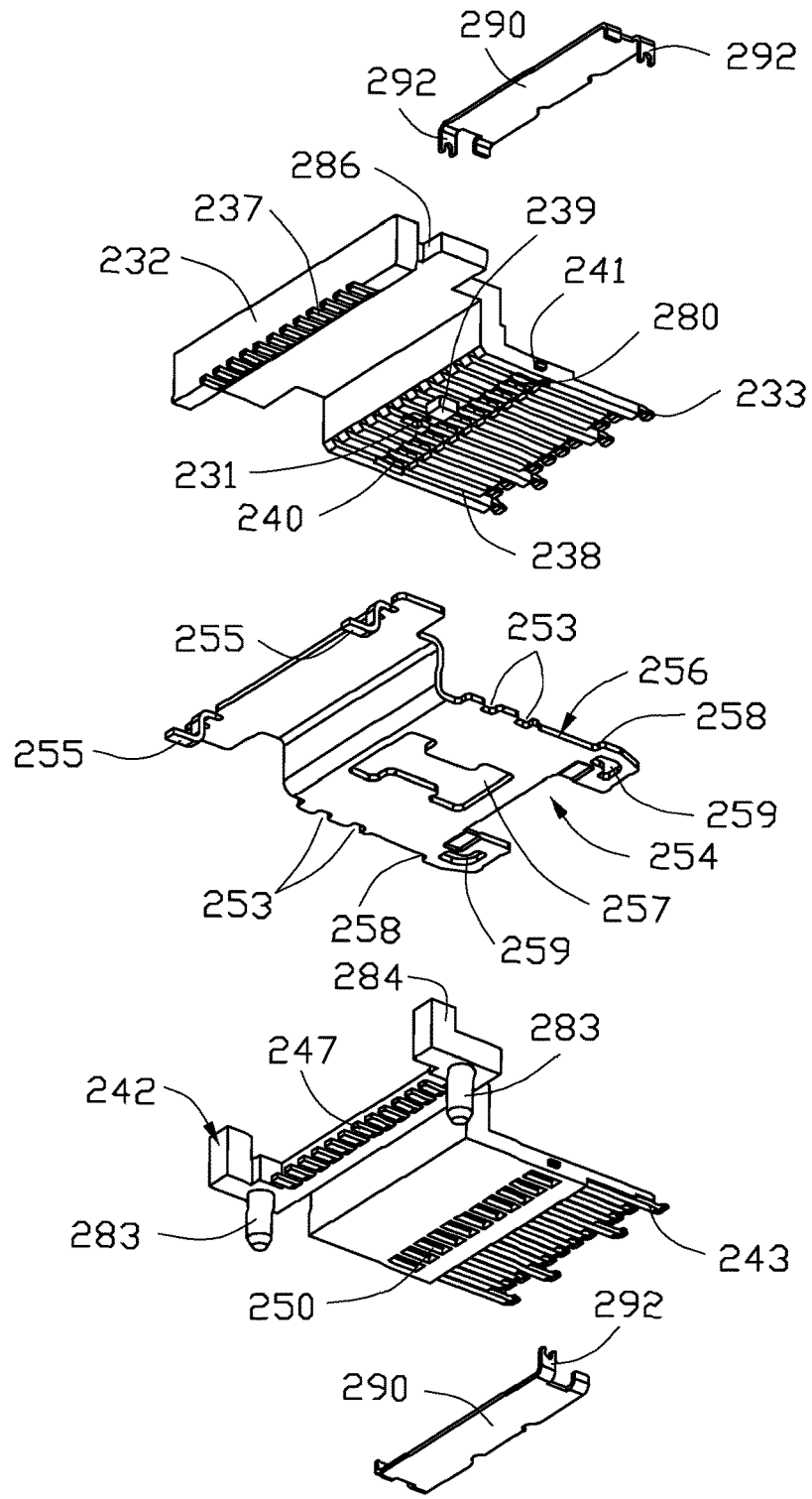
FIG. 13(B) is a further rear exploded upward perspective view of the portion of the terminal module of the receptacle connector of FIG. 11(B) wherein the housing and the contacts are pre-assembled together before the second molding process.
Figure 14:
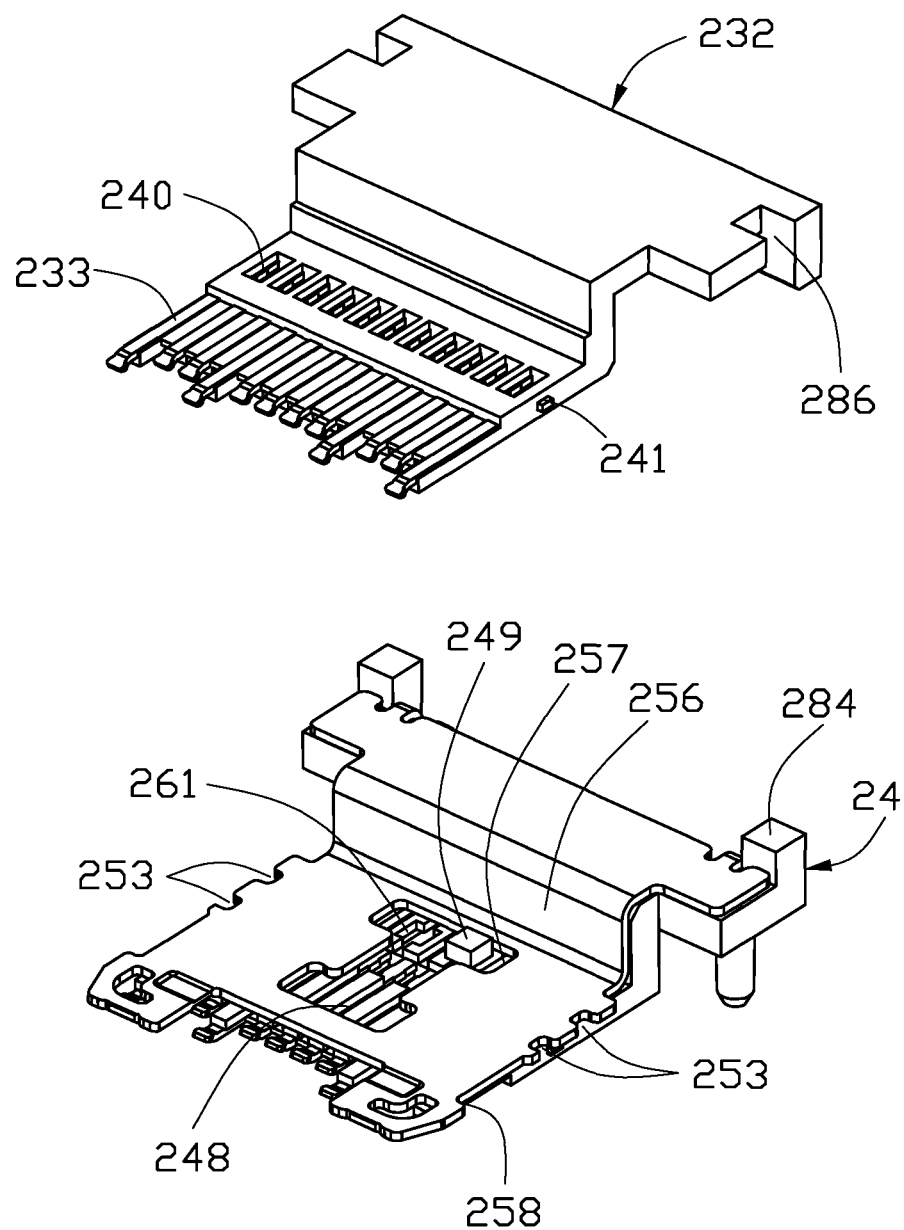
FIG. 14 is a front assembled perspective view of the portion of the terminal module of the receptacle connector of FIG. 13(A)
Figure 19A:
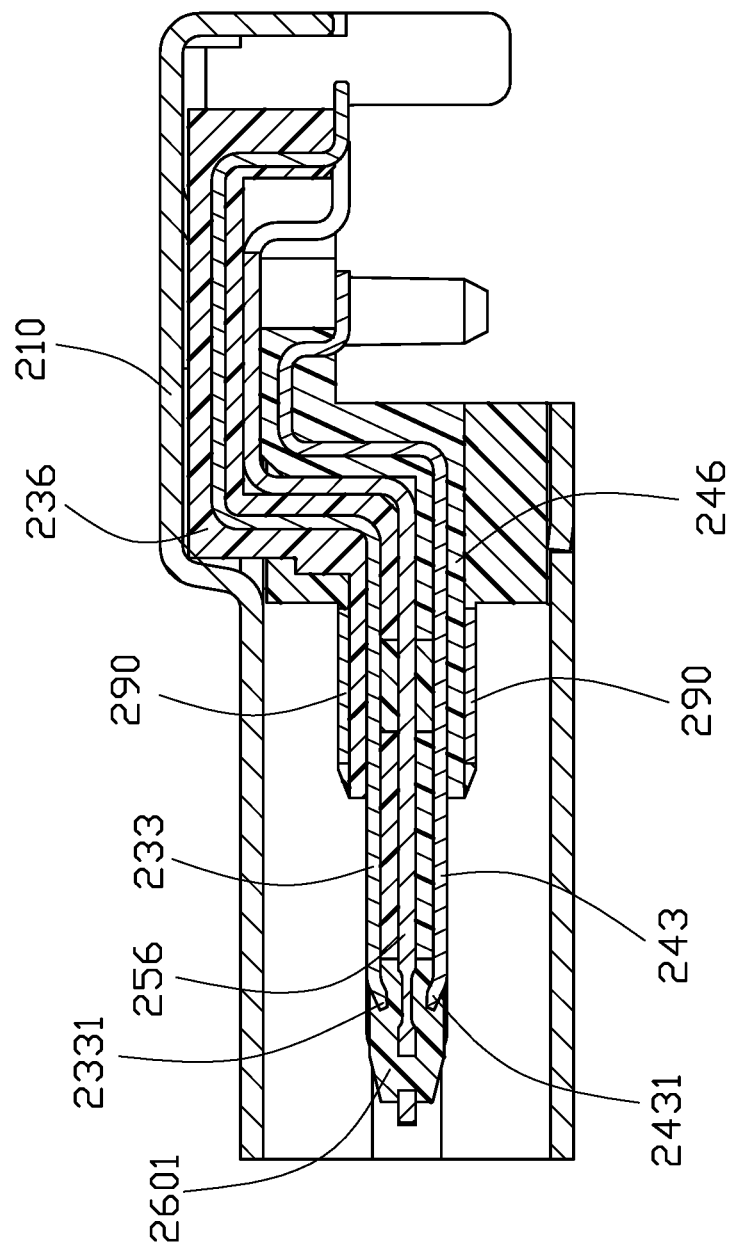
FIG. 19(A) is a side cross-sectional view of the receptacle connector of FIG. 9.
Figure 20:
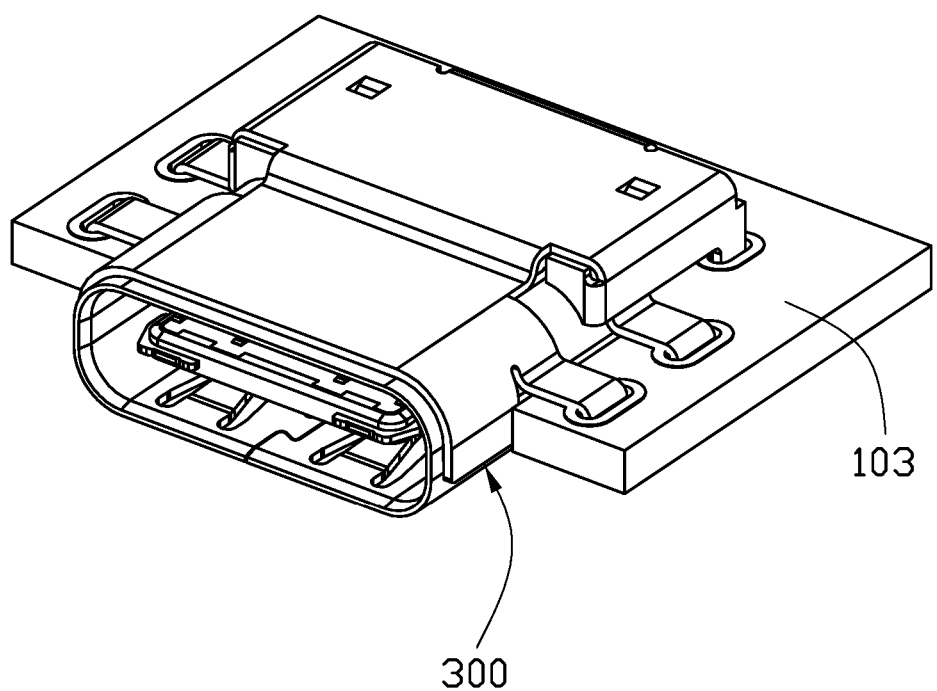
FIG. 20 is a front assembled perspective view of a third embodiment of the receptacle connector mounted upon the printed circuit board according to the invention.
Figure 21:
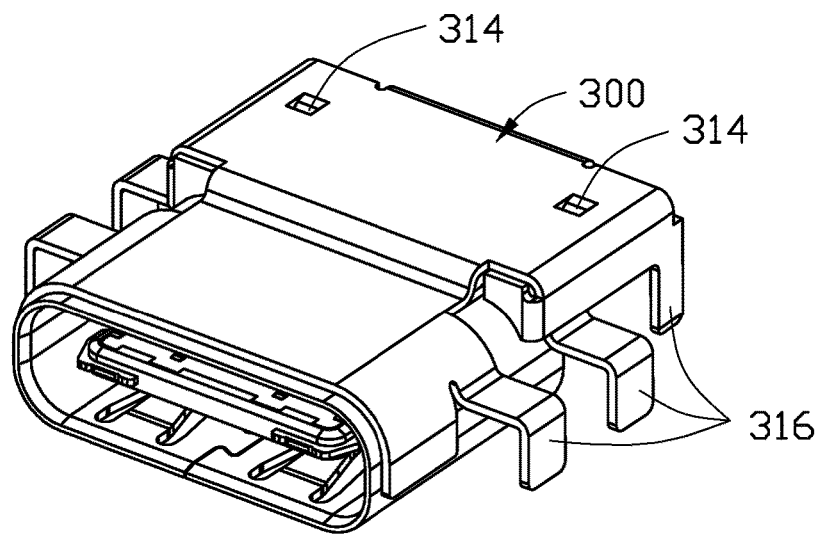
FIG. 21 is a front exploded perspective view of the receptacle connector taken away from the printed circuit board of FIG. 20.
Figure 21:
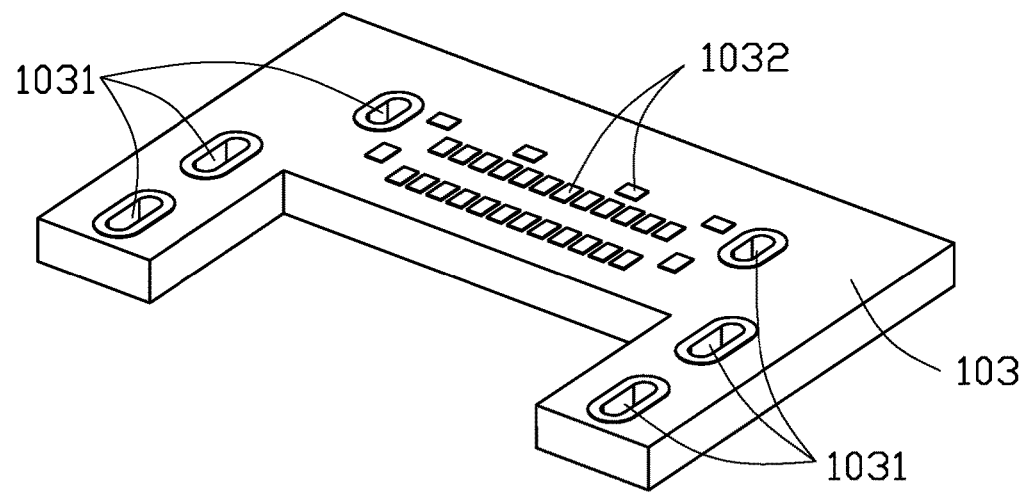
Figure 22A:
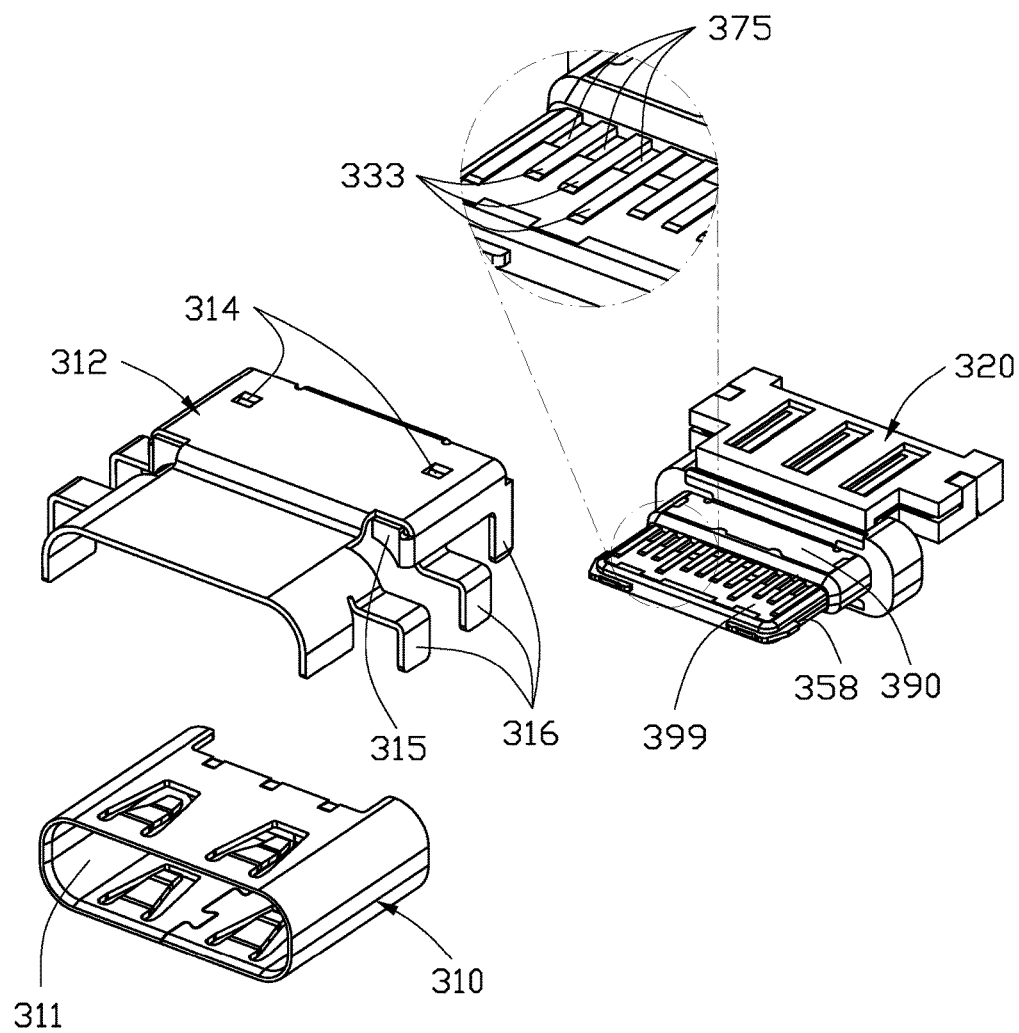
FIG. 22(A) is a further front exploded perspective view of the receptacle connector of FIG. 21 after the second insert molding process.
Figure 22B:
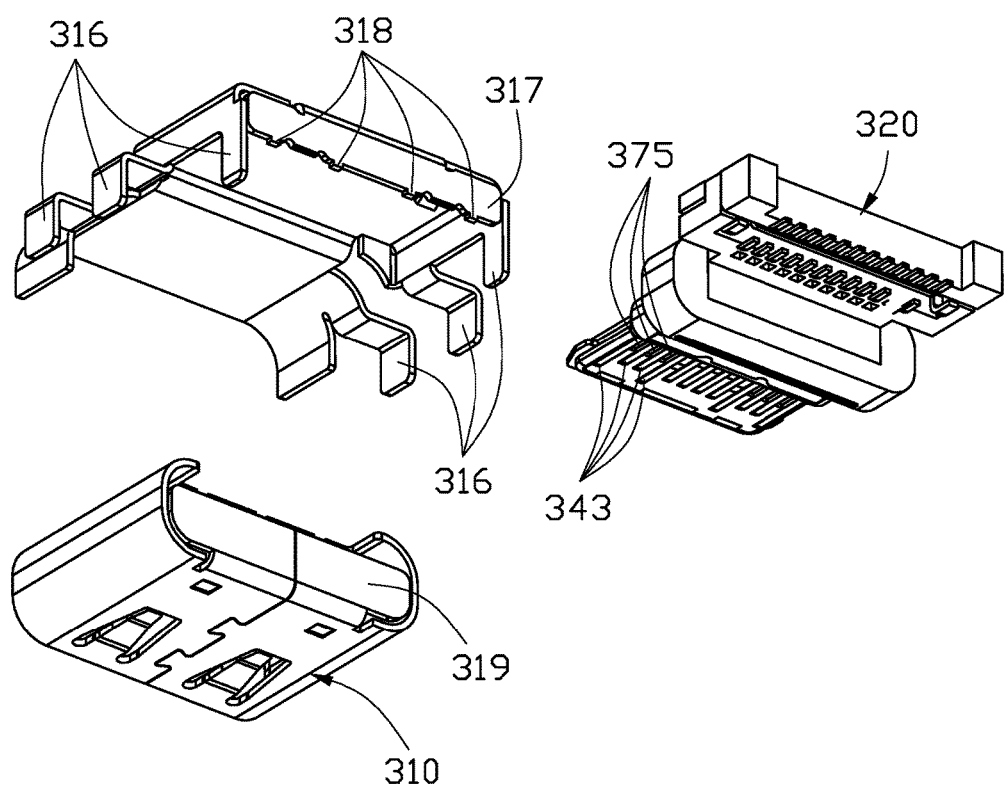
FIG. 22(B) is a further rear exploded perspective view of the receptacle connector of FIG. 21 after the second insert molding process.
Figure 23:
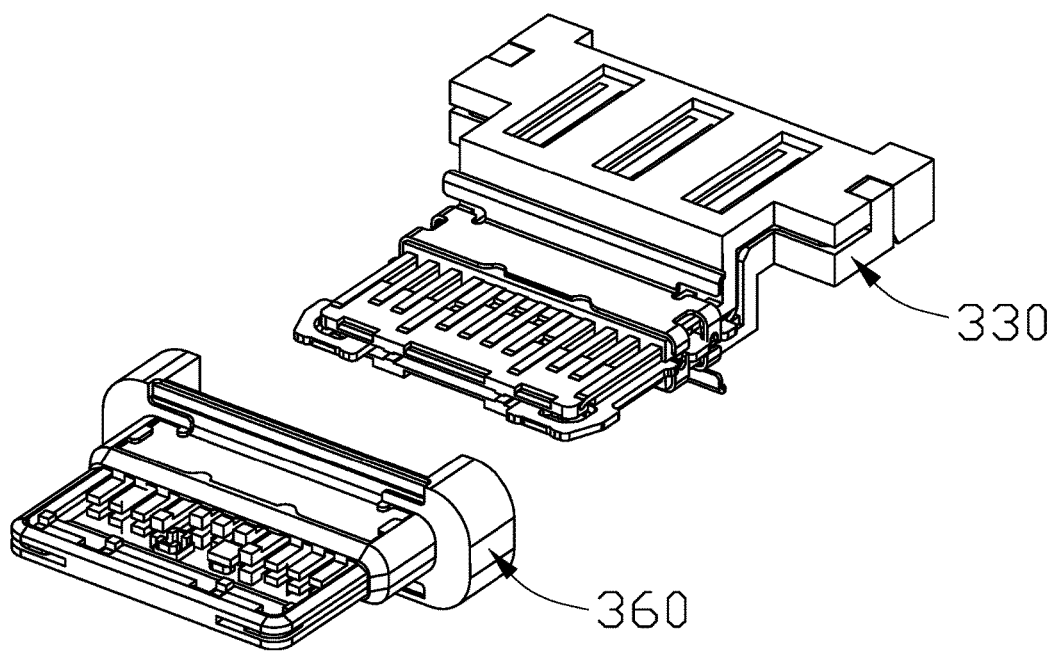
FIG. 23 is a further front exploded perspective view of the receptacle connector of FIG. 21 after the first insert molding process.
Figure 24:
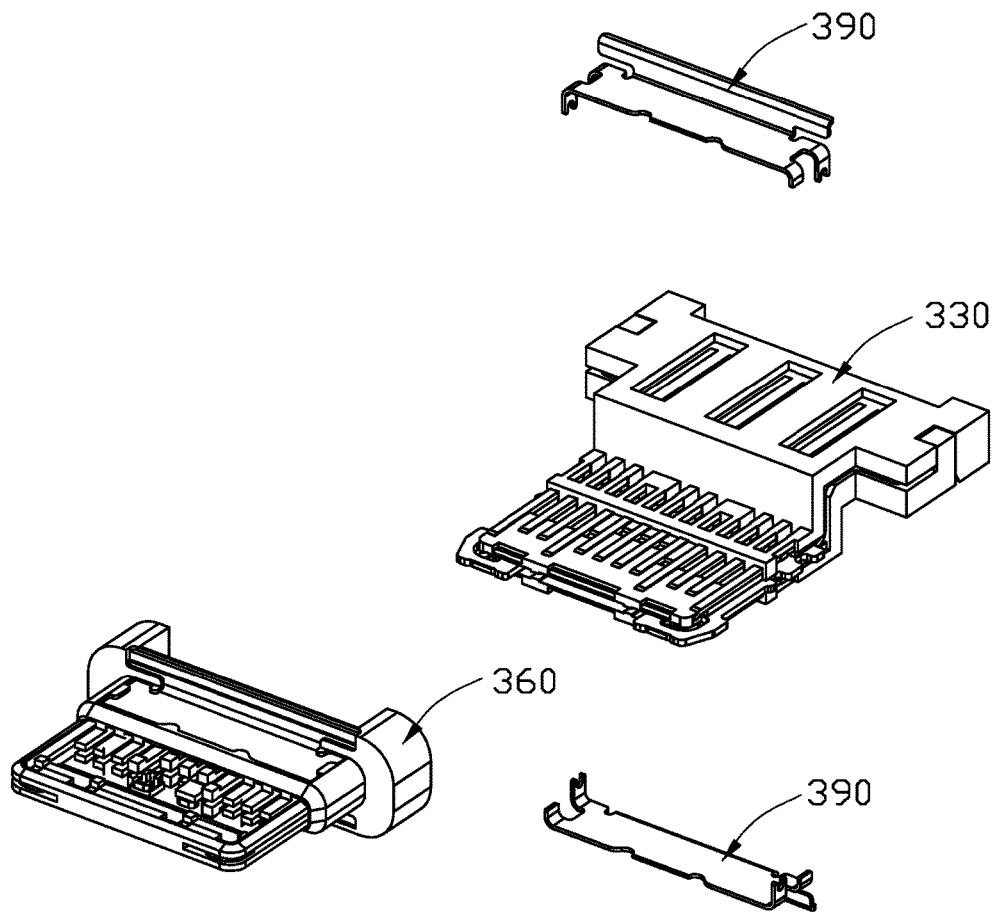
FIG. 24 is a further front exploded perspective view of the terminal module of the receptacle connector of FIG. 23 after the first insert molding process.
Figure 25A:
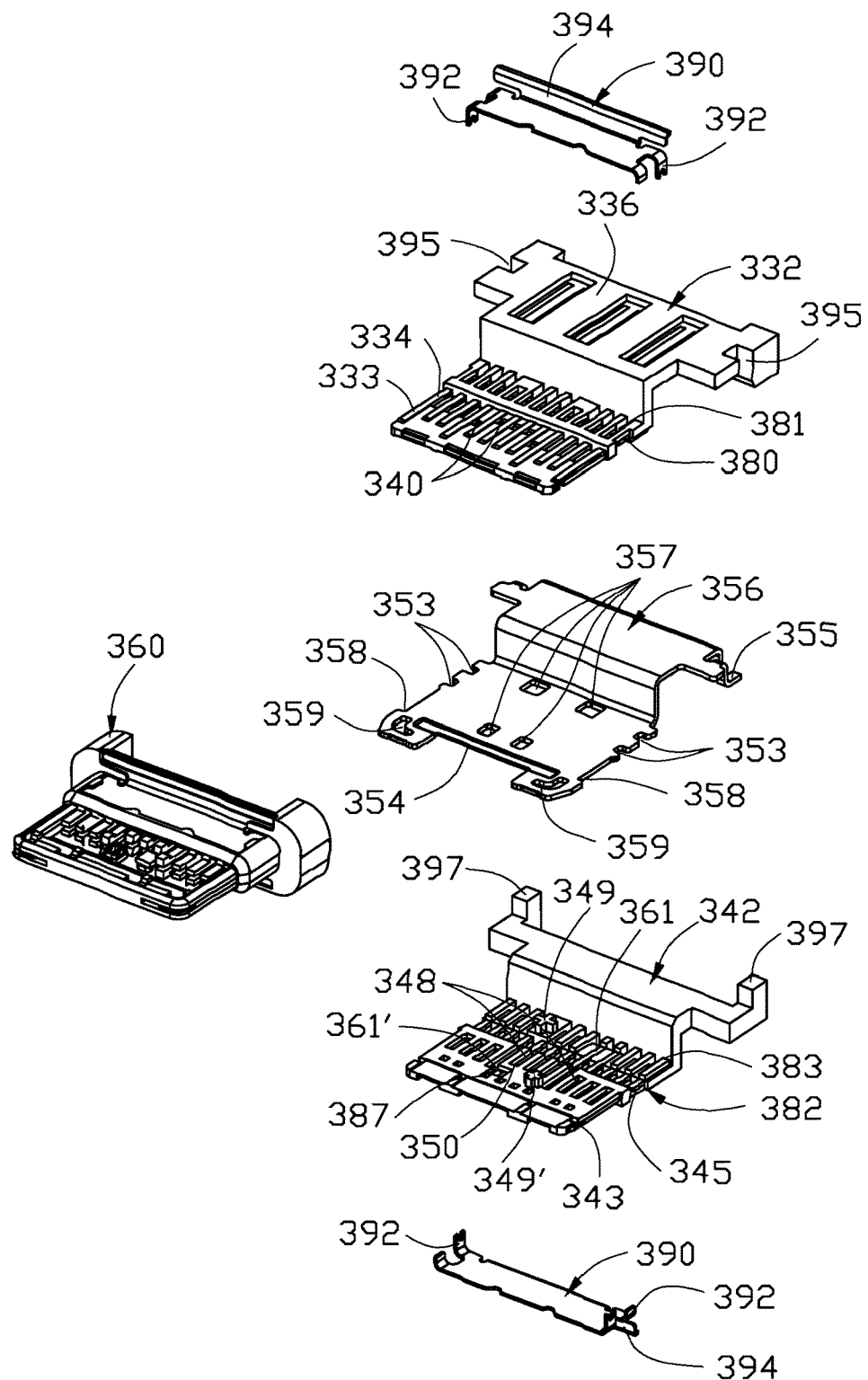
FIG. 25(A) is further front exploded perspective view of the terminal module of the receptacle connector of FIG. 24 after the first insert molding process.
Figure 25B:
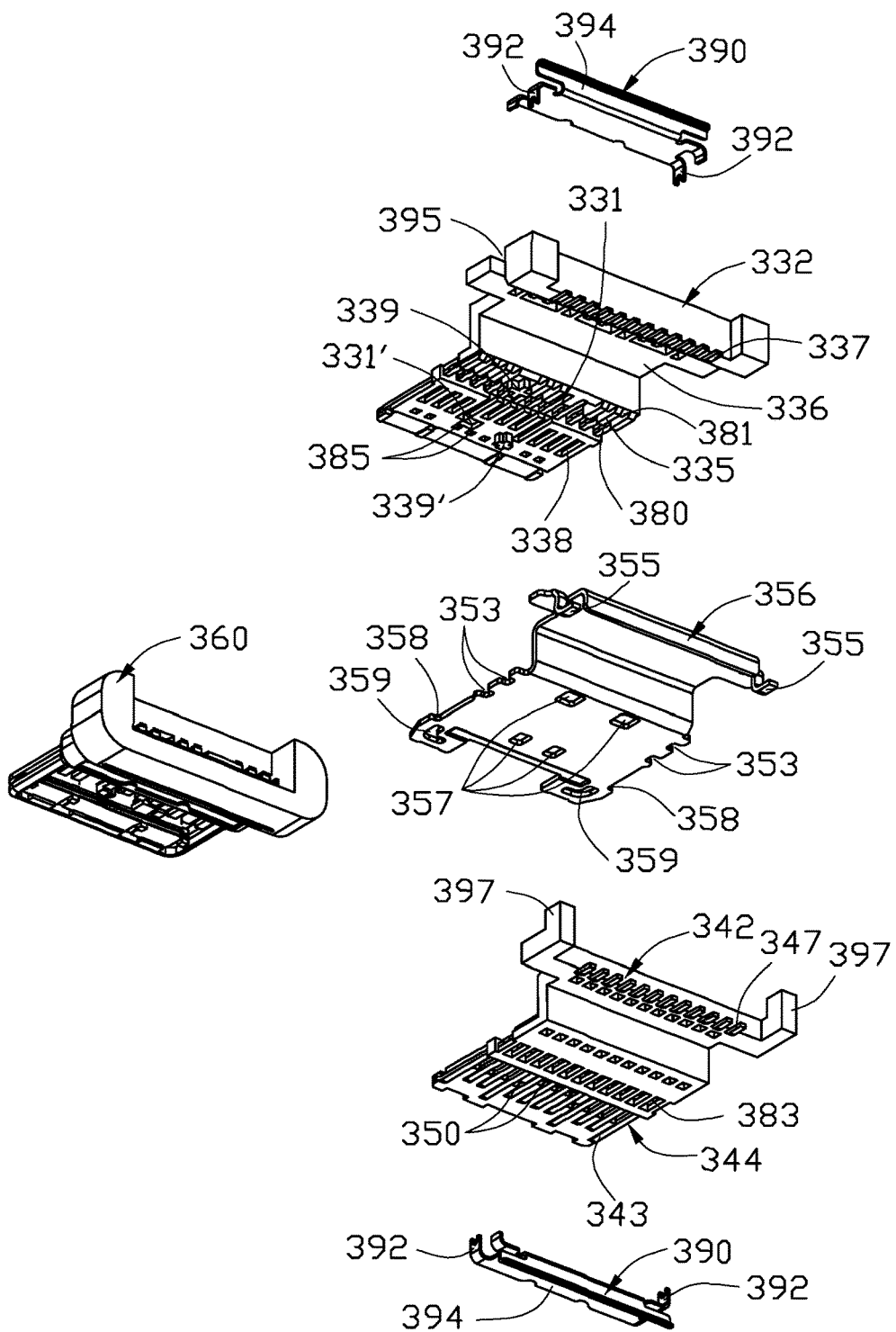
FIG. 25(B) is a further rear exploded perspective view of the terminal module of the receptacle connector of FIG. 24 after the first insert molding process.
Figure 26A:
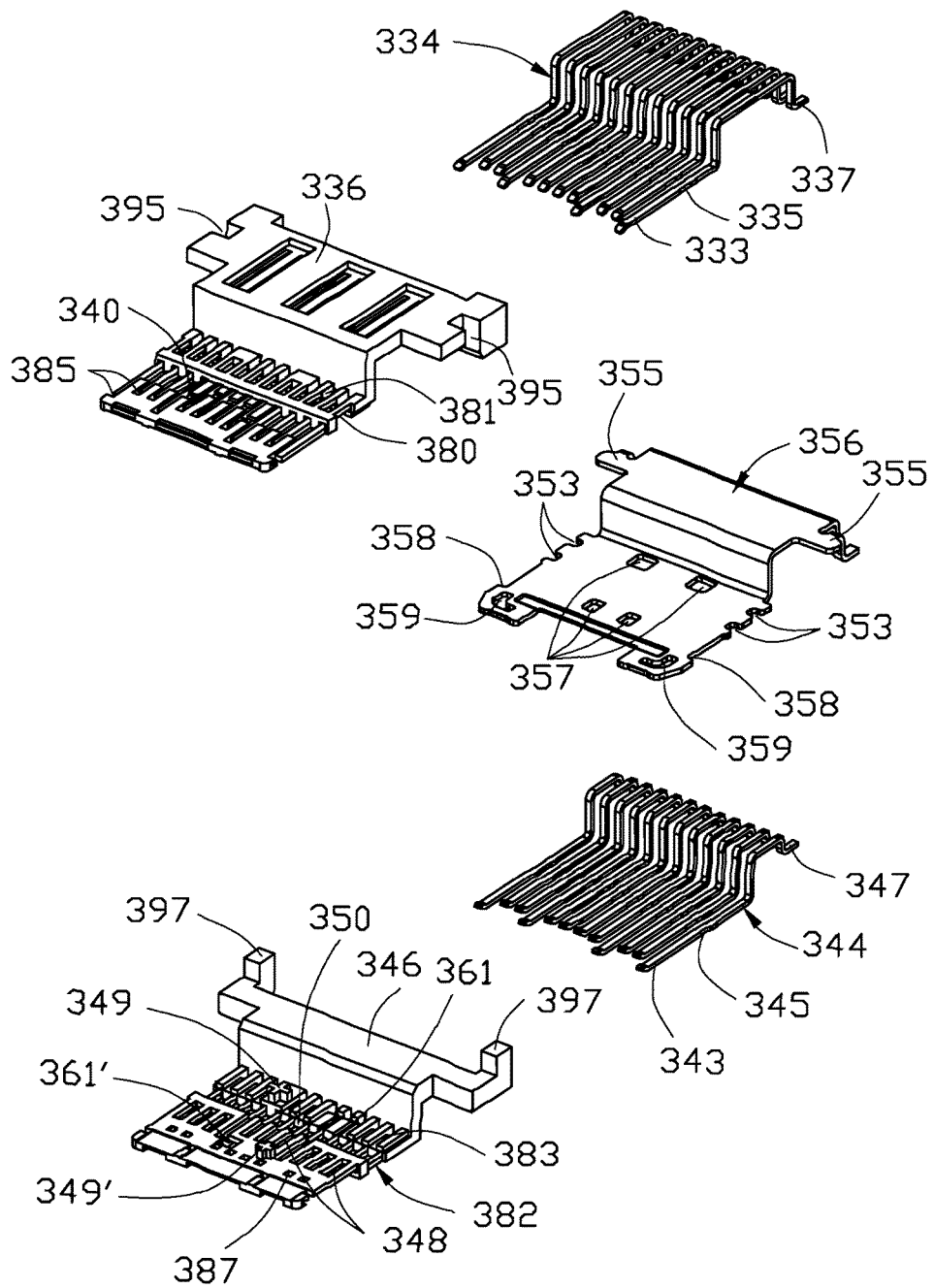
FIG. 26(A) is a further front exploded perspective view of the terminal module of the receptacle connector of FIG. 25(A)
Figure 26B:
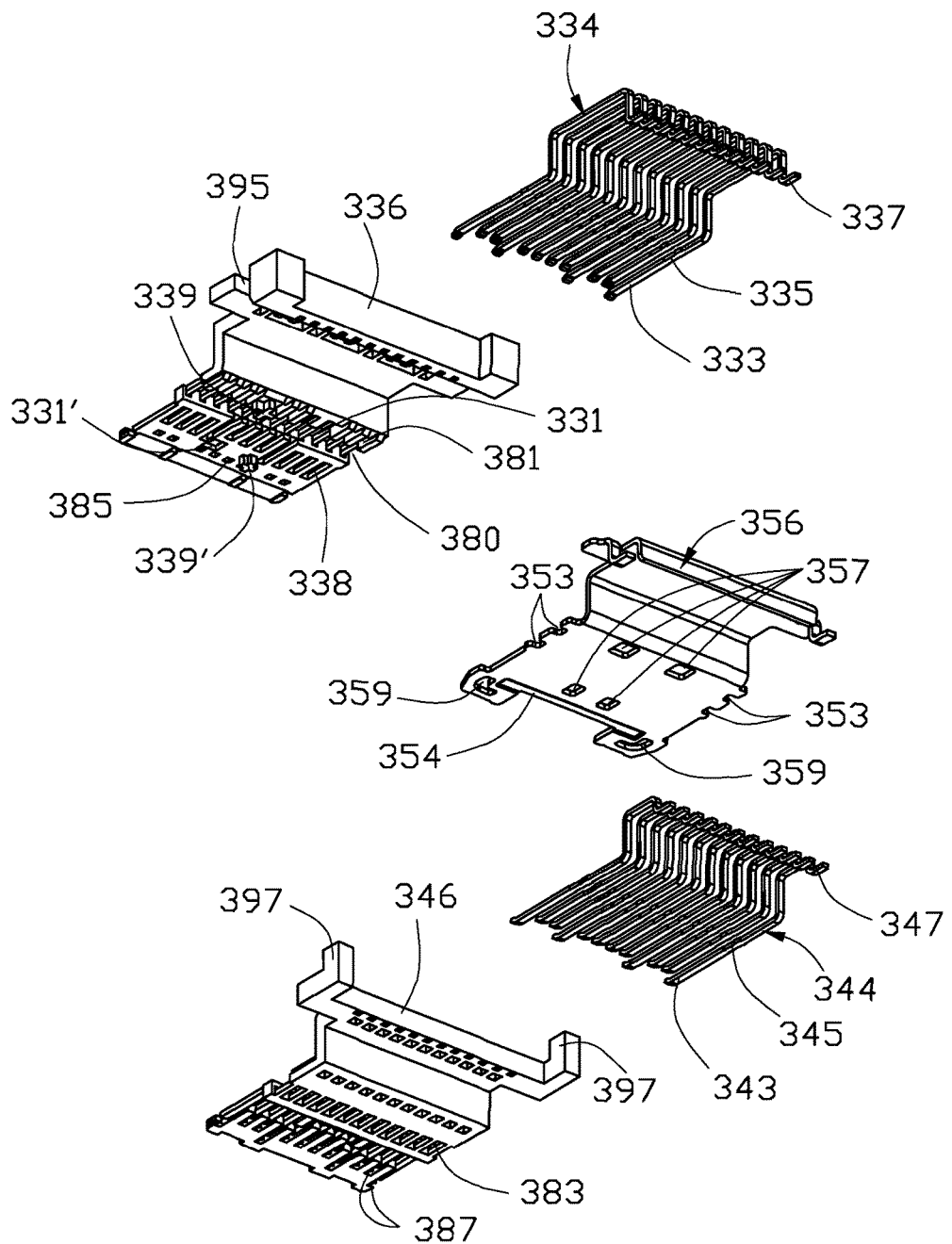
FIG. 26(B) is a further rear exploded perspective view of the terminal module of the receptacle connector of FIG. 25(A)

Notably, the line 295 is a boundary line between the filler 260 and the upper insulator 236 wherein the filler 260 share the same upper surface with the upper insulator 236 and the same lower surface with the lower insulator 236 on the mating tongue 294. Clearly, the tip sections 2331 of the contacting sections 233 are retained by the filler 260 via the second insert molding process while the remaining portions of the contacting sections are retained by the upper insulator 236 via the first insert molding process. So are the contacting sections 243. Referring to FIGS. 19(A) and 19(B), the front tip section 2331 of the contacting section 233 and the front tip section 2431 of the contacting section 243 are embedded within the filler 260, which is different from that in the first embodiment as shown in FIG. 7 with better retention performance On the other hand, because the filler 260 fills everywhere of the main basis 230 in three dimensions internally and/or externally under the second insert molding process, the whole terminal module 220 is efficiently consolidated including the front mating tongue 294, the area around the collars 290 and the rear main body behind the collars 290. Therefore, the so-call two-shot or double insert moldings method, i.e., the initial one for forming each of upper part 232 and lower part 242 and the successive one for integrating the terminal module 220, used in this embodiment achieves the strong structure than the assembling type. As indicated before, an advantage of this embodiment is to prevent the tip of the contacting sections of the contacts from pop-up due to retention of the filler 260. It is also noted that because only the very short tip section of the contacting section 233/243 is exposed outside of the upper/lower insulators 236/246 after the first insert molding process, such tip section of the contacting section is not subject to tilting during the second insert molding process. Understandably, if the boundary line 295 is far away from the tip of the contacting section 233/243, the front section of the contacting section 233/243 is subject to tilting during the second insert molding process due to the high molding pressure disadvantageously. Same to the collars 290, the collars 290 especially two opposite ends thereof are embedded in the step portion formed by the fillers 260, only exposing upper and lower plates 2941 of collars 290 to the mating surfaces of the mating tongue. The upper and lower plates are flushed with the step portions of the filler 260. As shown in FIG. 10(A), the filler 260 surrounding the upper and lower parts form the mating tongue 294 and the vertical base 2205, while the horizontal base 2206 are exposed to an external without any filler 260 for lower cost. As shown in FIG. 11(A), the filler 260 includes a front bridge 2601 which surrounding front edges of the tongues of the insulators as best shown in FIG. 19(A), and other tongue portion 2602 and a base portion 2603 surrounding corresponding tongues and base of the insulator. As best shown in FIG. 19(B) and FIG. 10(A), the step portion 2201 at a root of the mating tongue has a front portion 2201a located in front of the collars 290 to resist the collars and the front portion 2201a has a front tilt face 2201b and a horizontal face 2201c flushed with the collars. The mating tongue defines two opposite mating surfaces at an upper and a lower surface thereof. A rear edge 2111 of the shielding 210 is retained around the vertical base 2205. Similar to the first embodiment, after assembled the mating tongue 294 extends in the capsular mating cavity 211 defined in the shield 210 for allowing the corresponding plug connector to be inserted therein in a flippable manner, i.e., concerning no orientations. Similar to the first embodiment, the lower insulator 246 has a pair of alignment posts 284 respectively received within the corresponding recesses 286 of the upper insulator 236 so as to guide vertical assembling between the upper insulator 236 and the lower insulator 246 in the vertical direction to sandwich shielding plate 256 therebetween as mentioned before.

FIGS. 20-29 show a third embodiment similar to a second embodiment wherein the receptacle connector 300 mounted upon the printed circuit board 103 includes a terminal module 320 enclosed in the metallic shield 310 which is soldered to a metallic bracket 312. The terminal module 320 essentially includes a main basis 330 as a semi-finished part, and a filler 360 applied upon and filled within the main basis 330 via a second insert molding process. The main basis 330 includes an upper part 332 and a lower part 342 commonly sandwiching a shielding plate 356 therebetween. The upper part 332 includes a plurality of upper contacts 334 embedded within an upper insulator 336 via a first insert molding process with the contacting sections 333 exposed upon an upper surface of the upper insulator 336, the tail sections 337 exposed behind the upper insulator 336, and retention protrusions 335 located between the contacting sections 333 and the tail sections 337 in the front-to-back direction and embedded within the filler 360 after the second insert molding process. Notably, the upper insulator 336 essentially forms a Z-shaped structure in a side view with an additional rear wall and further defines a plurality of grooves 338 extending along the front-to-back direction while hidden under the upper surface of the upper insulator 336, a plurality of grooves 381 extending along the front-to-back direction and exposed upon the upper surface of the upper insulator 336, and a plurality of through holes 340 in the vertical direction and in communication with the corresponding grooves 338, respectively. It is noted that the grooves 338 and the grooves 381 and the through holes 340 are used for having the core pins therein during the first insert molding process to retain/sandwich the contacting sections 333 of the corresponding contacts 334 in the transverse direction. Another set of through holes 385 are formed in the upper insulator 336 right under the contacting sections 333 of the corresponding contacts 334 for receiving the molding core pins during the first insert molding process to support the contacting sections 333 in the vertical direction. Anyhow, those grooves 338, 381 and the through holes 340, 385 will be filled with the filler 360 during the second insert molding process. The upper insulator 336 is further equipped with two downward protrusion 339, 339' and two recession 331, 331' for coupling to the counterparts of the lower part 342 during assembling to the final main basis 330. Furthermore, a transverse groove 380 is formed in the upper insulator 336 to intersect with the plurality of grooves 381 and under the upper surface of the upper insulator 336 for integration/reinforcement consideration during the second insert molding process. It is noted that compared with the similar second embodiment described in the previously filed application 61/989,508 which implements the two insert molding processes while still leaving shortened tips of the corresponding contacting sections at the front, in this embodiment the upper insulator 336 fully covers the front tips of the contacting sections 333 of the corresponding contacts 334, thus avoiding the possible tilting of the front tips of the contacting sections of the corresponding contact during the second insert molding process. The upper insulator 336 further forms a pair of notches 395 in two opposite lateral sides. It should be noted that using the two-insert-molding process or the so-called two-shot process to form a complete tongue like part is essentially not novel, referring to the copending application Ser. No. 14/531,978 having the same assignee thereof.

The arrangement of the lower part 342 are similar to that of the upper part 332 only with some minor differences. The lower part 342 includes a plurality of lower contacts 344 embedded with a lower insulator 346 via another first insert molding process with the lower contacting sections 343 exposed upon a lower surface of the lower insulator 346, the lower tail sections 347 exposed behind the lower insulator 346, and the retention protrusions 345 located between the contacting sections 343 and the tail sections 347 in the front-to-back direction and embedded within the filler 360 after the second insert molding process. Notably, the lower insulator 346 forms a Z-shaped structure in a side view and defines a plurality of grooves 348 extending along the front-to-back direction and hidden above the bottom surface of the lower insulator 342, a plurality of grooves 383 extending along the front-to-back direction and a plurality of through holes 350 communicating with the corresponding grooves 348 in the vertical direction, respectively. Another set of through holes 387 are formed in the lower insulator 346 right above the contacting sections 343 of the corresponding contacts 344 for receiving the molding core pins during the first insert molding process to support the contacting sections 343 in the vertical direction. The filler 360 fills the grooves 348, 383 and the through holes 350, 387 during the second insert molding process. The lower insulator 346 is further equipped with upward protrusions 349, 349' and recessions 361, 361 for coupling to the corresponding recessions 331, 331' and the downward protrusions 339, 339' of the upper part 332 during assembling to the final main basis 330. Furthermore, a transverse groove 382 is formed in the lower insulator 346 to intersect with the plurality of grooves 383 and above the lower surface of the lower insulator 346 for integration/reinforcement consideration during the second insert molding process. It is noted that the lower insulator 346 fully covers the contacting sections 343 of the contacts 344 and formed a pair of legs 397.

The shielding plate 356 forms a pair of locking side edges 358 for locking with the corresponding latches of the corresponding plug connector as shown in the first embodiment, and two pairs of large through opening 357 for extension of the corresponding protrusions 349. 349' and 339, 339', and a pair of small through openings 359 in a front portion for allowing the fillers 360 to occupy therein during the second insert molding process. A pair of legs 355 are formed on a rear portion of the shielding plate 356, a pair of notches 353 are formed in each lateral side of the shielding plate 356, and a large cutout 354 is formed in a front portion of the shielding plate 356. A pair of metallic collars 390 are respectively mounted upon the upper insulator 336 and the lower insulator 346, respectively. Each of collars 390 includes a pair of retention lugs 392 respectively located on two opposite lateral sides, and an extension 394 in the vertical direction to mechanically and electrically connect the shield 310.

During assembling the main basis 330, the upper part 332 and the lower part 342 are assembled with each other along the vertical direction with the shielding plate 356 sandwiched therebetween in the vertical direction and also in the front-to-back direction wherein the protrusions 339, 339' and 349, 349' extend through the central opening 347 to be received within the corresponding recessions 361, 361' and 331, 331', the legs 297 are received in the corresponding notches 395, and the retention lugs 392 are received in the corresponding notches 353.

The filler 360 is applied upon and into the main basis 330 to form the complete terminal module 320 via the second insert molding process. The filler 360 fills the grooves 338, 348, the through openings 340, 350, the transverse grooves 380, 382, the pair of openings 359, the large cutout 354, and also covers the vertical portions of both the upper part 332 and the lower part 342, two opposite lateral side portions and the front side portion of the main basis 330 while exposing the pair locking side edges 358. The collars 390 are exposed to an exterior for mating with the spring plates of the corresponding plug connector. The shield 310 encloses the terminal module 320 and soldered to the bracket 312. The bracket 312 includes retention tabs 314 received in the corresponding recess of the upper insulator 336 for securing the terminal module 320 thereto, a plurality of mounting legs 316 for mounting into the though holes 1031 in the printed circuit board 103, and a plurality of tabs 318 on the rear wall 317 electrically and mechanically connected to the corresponding pad. Notably, compared with the two previous embodiments, in this embodiment the shield 310 only has the front capsular section without the rear raised rectangular section. Therefore, the corresponding bracket 312 is required to further form a rear raised section to shield the base of the housing. Anyhow, similar to what is disclosed in the provisional application 61/977,115, the bracket 312, which as a front partially capsular section (not labeled) and the rear partially rectangular raised section (not labeled), is equipped with the lateral extension 315 (FIG. 22(A)) extending from the rear raised section to shield, in the front-to-back direction, the corresponding upper insulator which is originally exposed forwardly to the exterior.

Figure 27:
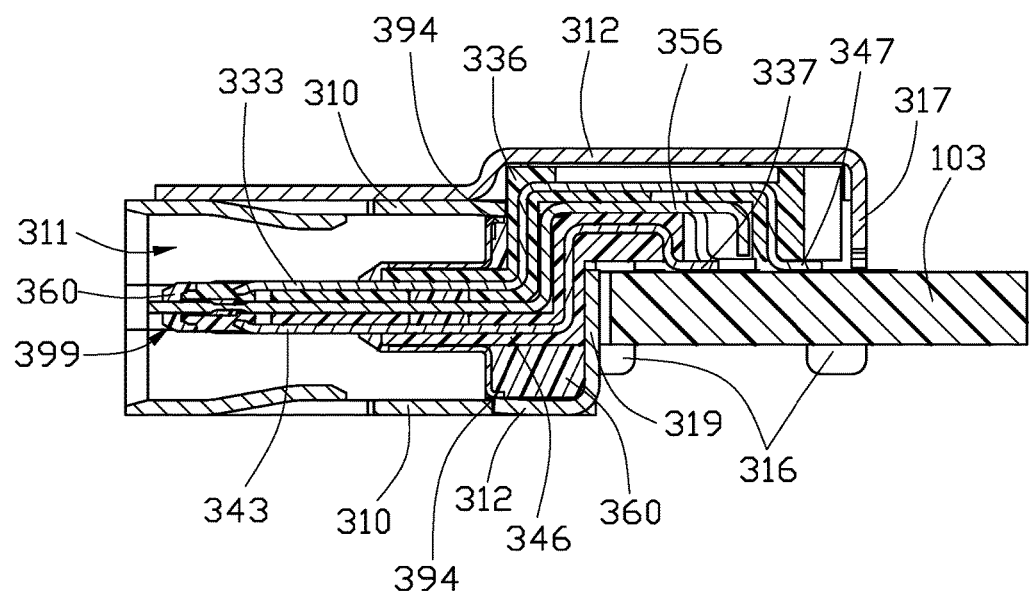
FIG. 27 is a cross-sectional view of the receptacle connector mounted upon the printed circuit board of FIG. 20.
Figure 28:
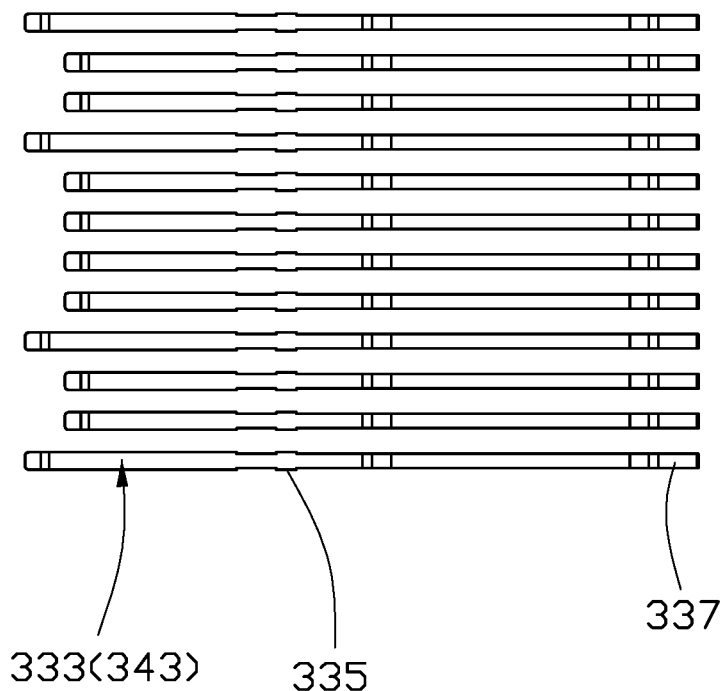
FIG. 28 is a top view of the contacts of the receptacle connector of FIG. 20 to show width variation of the contacts.
Figure 29:
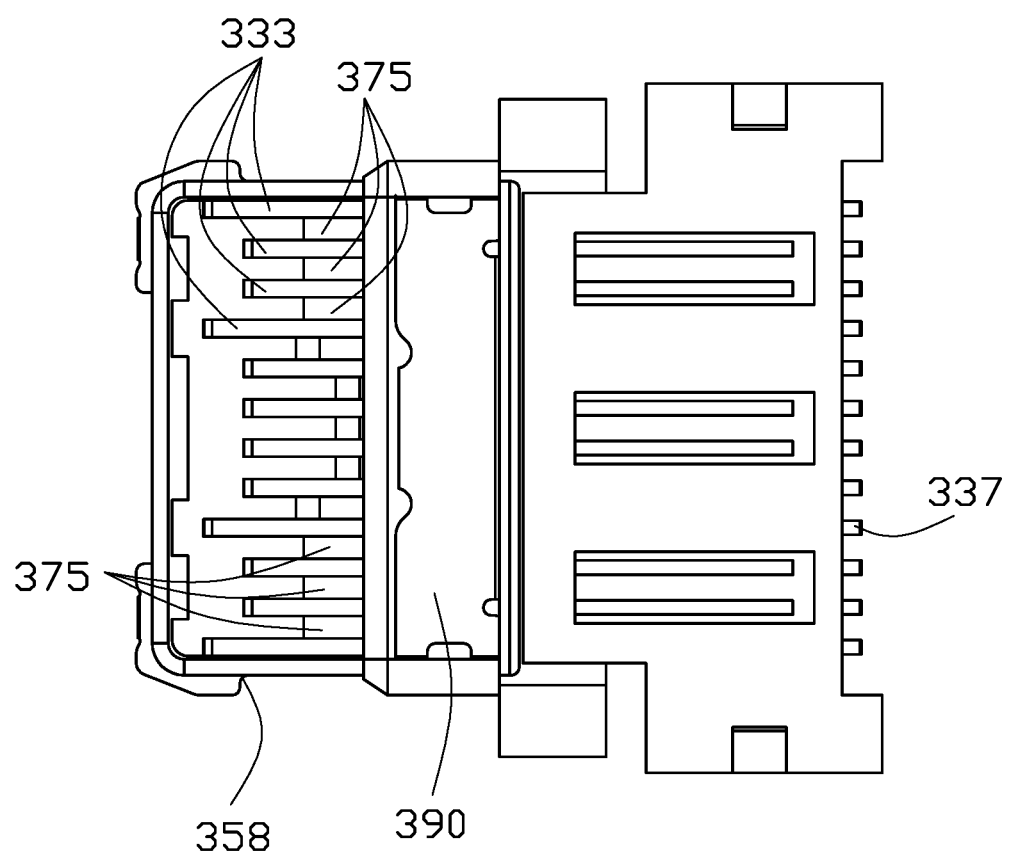
FIG. 29 is a top view of the terminal module of the receptacle connector of FIG. 20.
Figure 30:
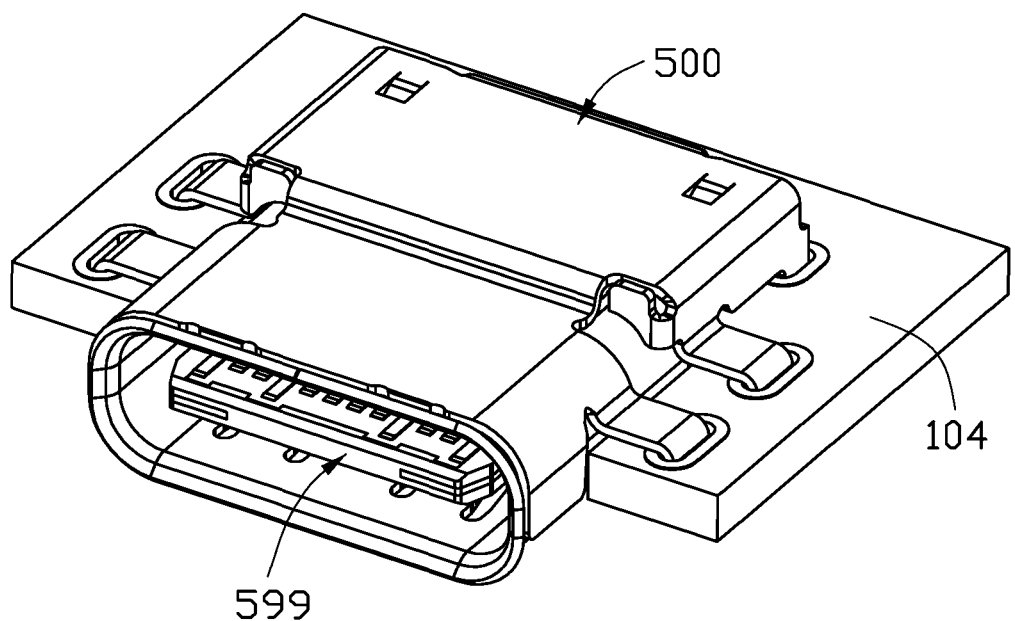
FIG. 30 is an assembled perspective view of a fourth embodiment of the receptacle connector mounted upon the printed circuit board according to the invention.
Figure 31:
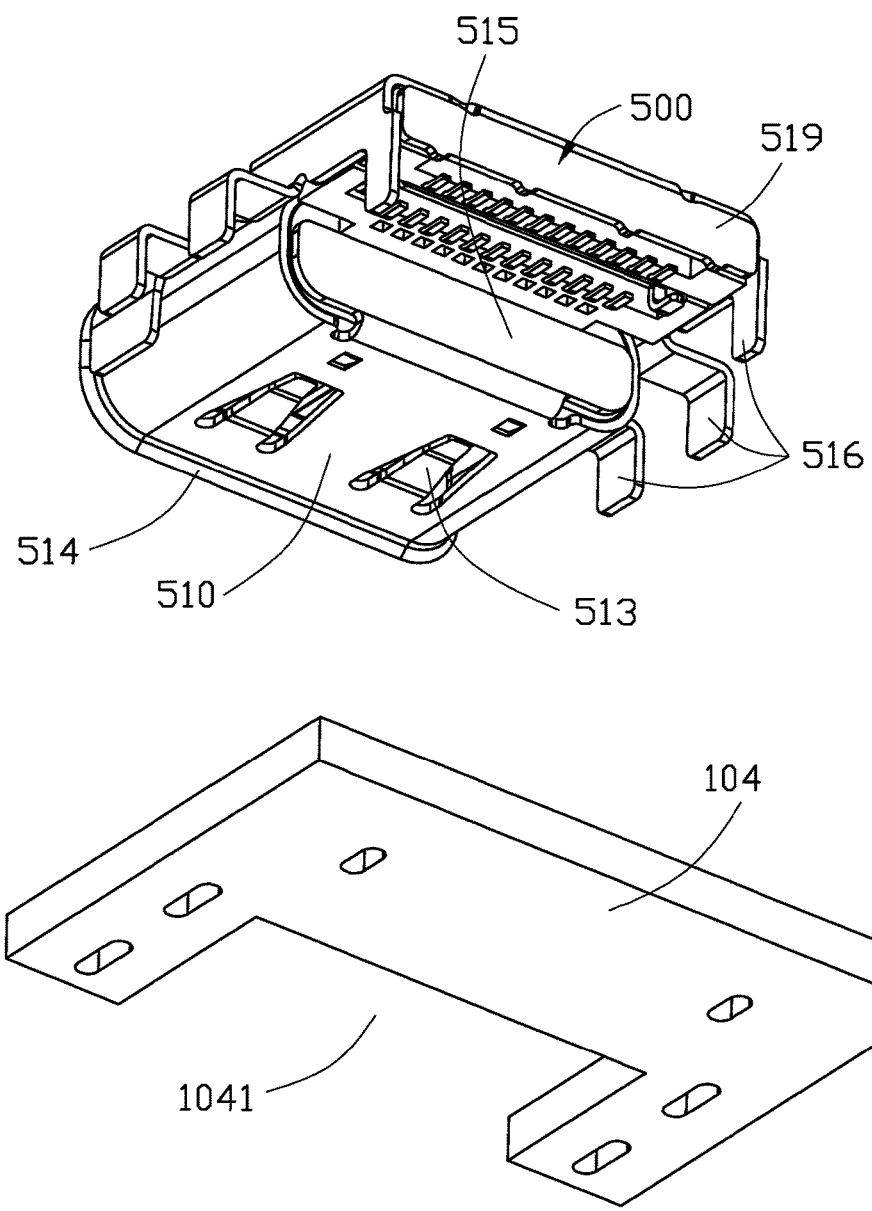
FIG. 31 is a rear exploded view of the receptacle connector taken away from the printed circuit board of FIG. 30.
Figure 32A:
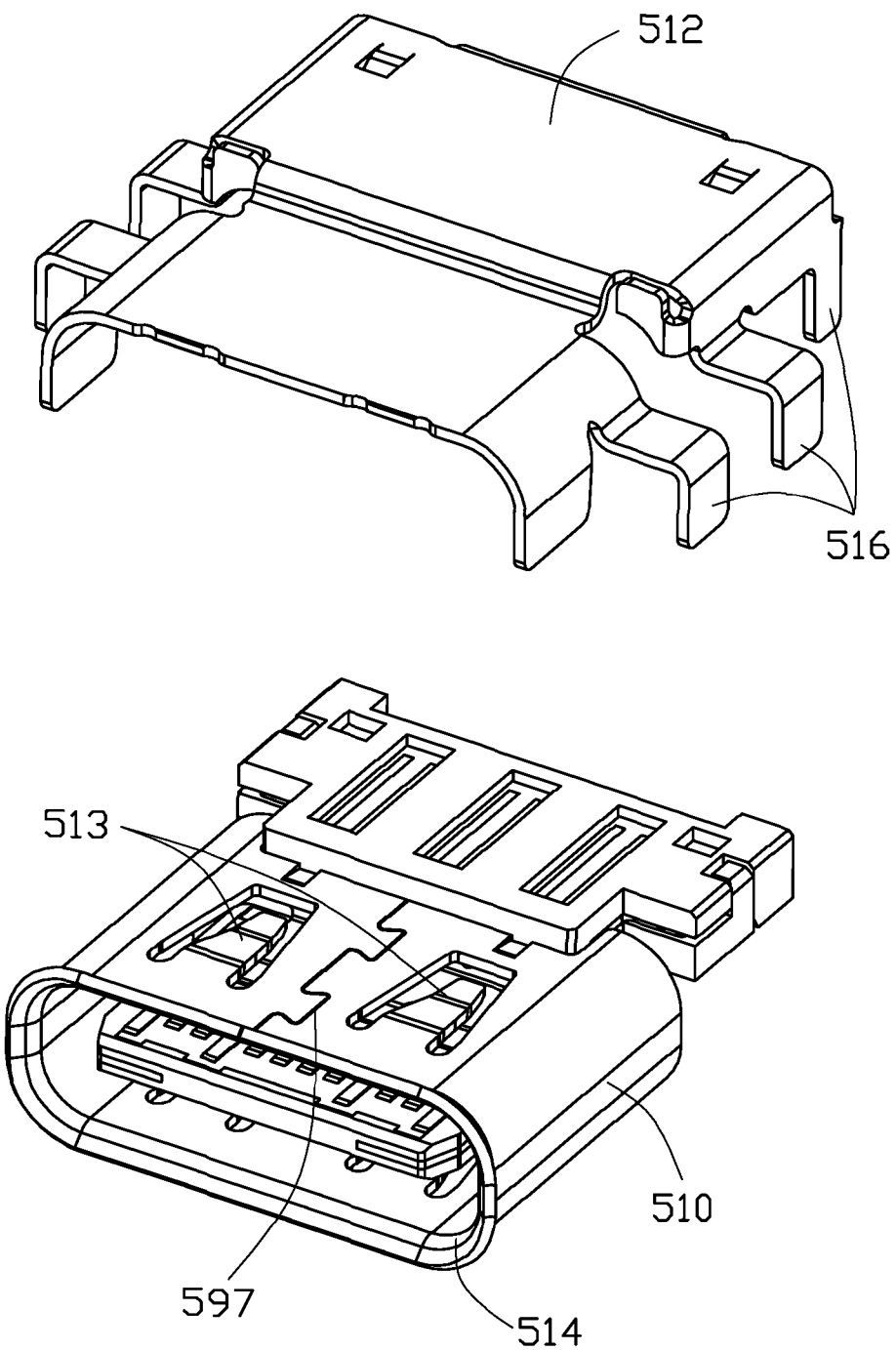
FIG. 32(A) is a further front exploded view of the receptacle connector of FIG. 30.
Figure 32B:
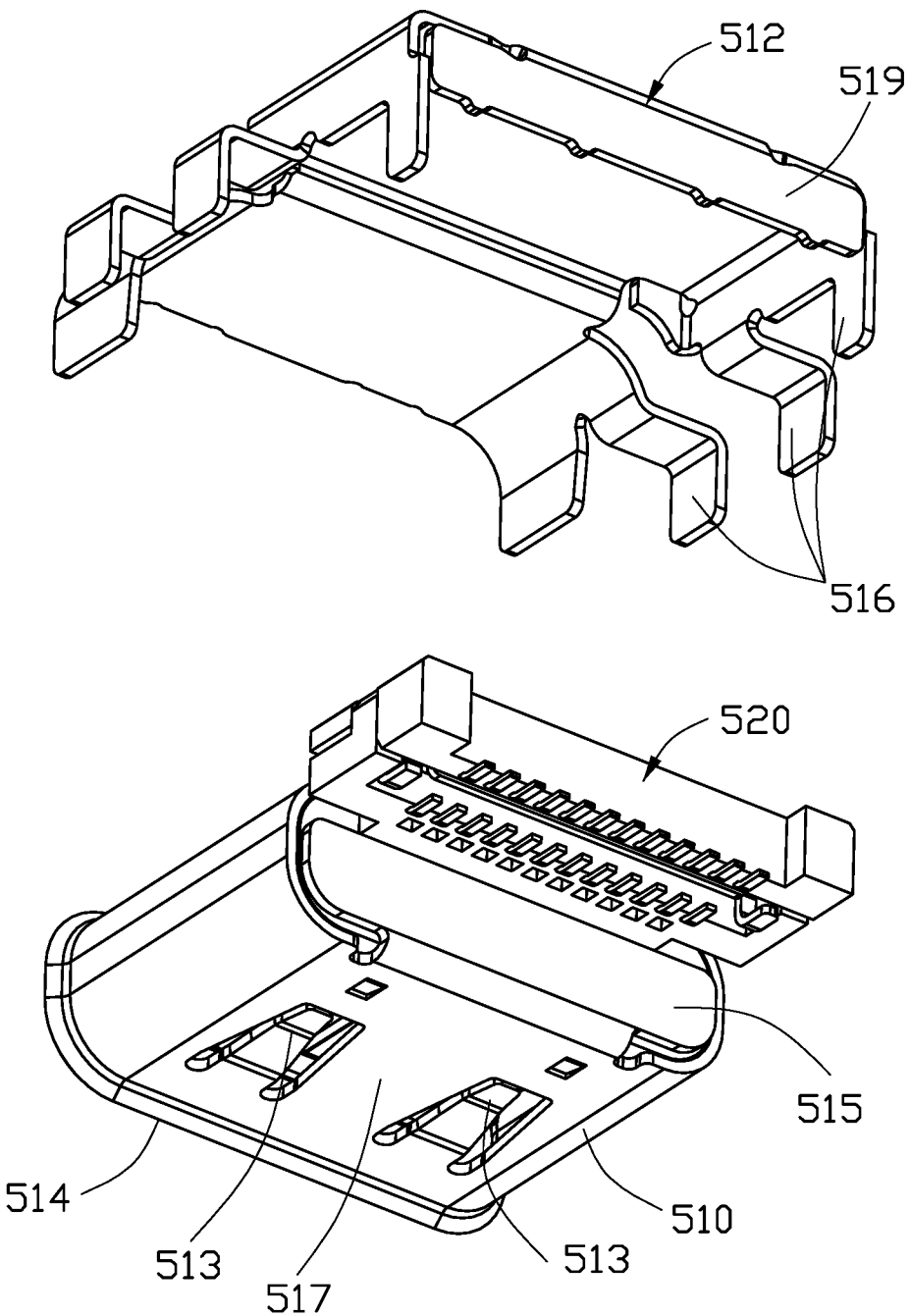
FIG. 32(B) is a further rear exploded view of the receptacle connector of FIG. 31.
Figure 33A:
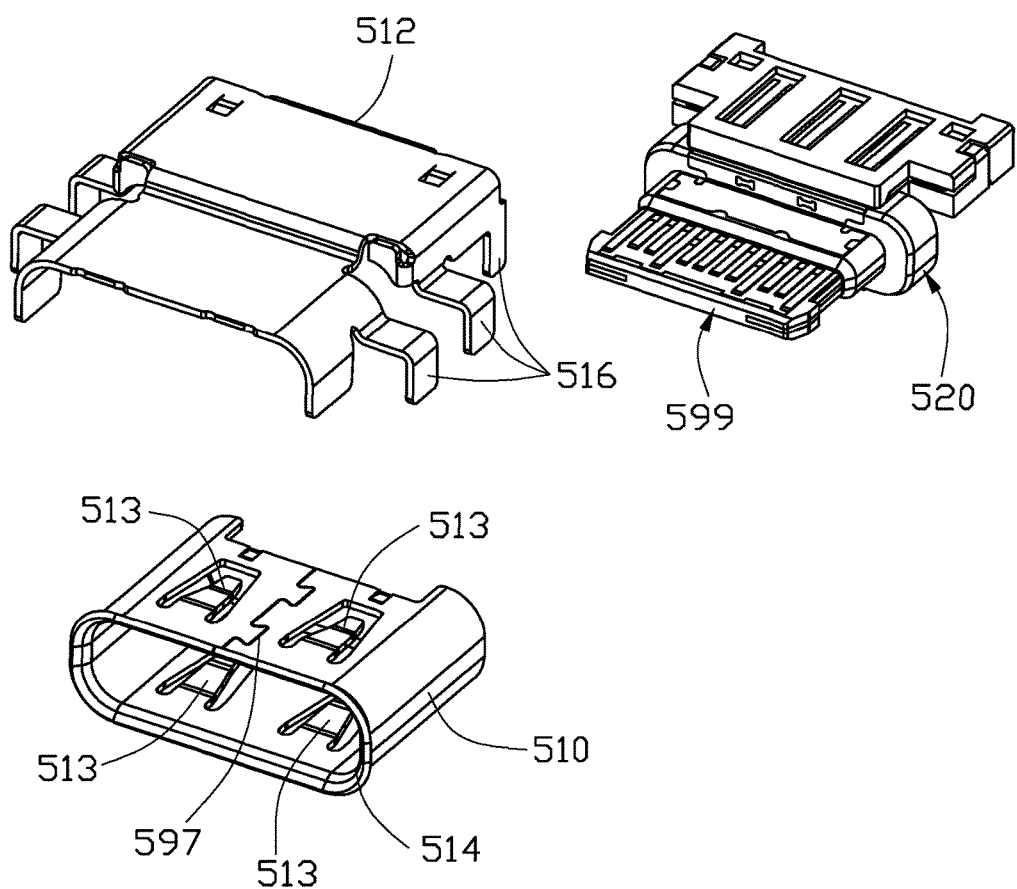
FIG. 33(A) is a further front exploded view of the receptacle connector of FIG. 32(A)
Figure 33B:
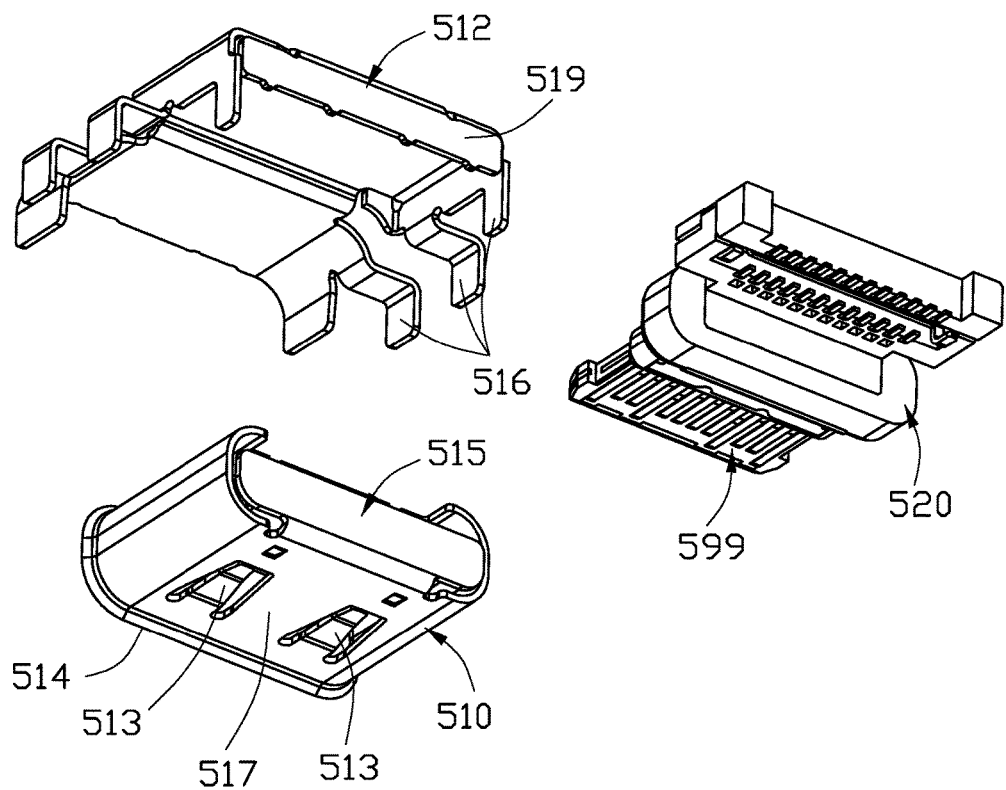
FIG. 33(B) is a further rear exploded view of the receptacle connector of FIG. 32(B)
Figure 34:
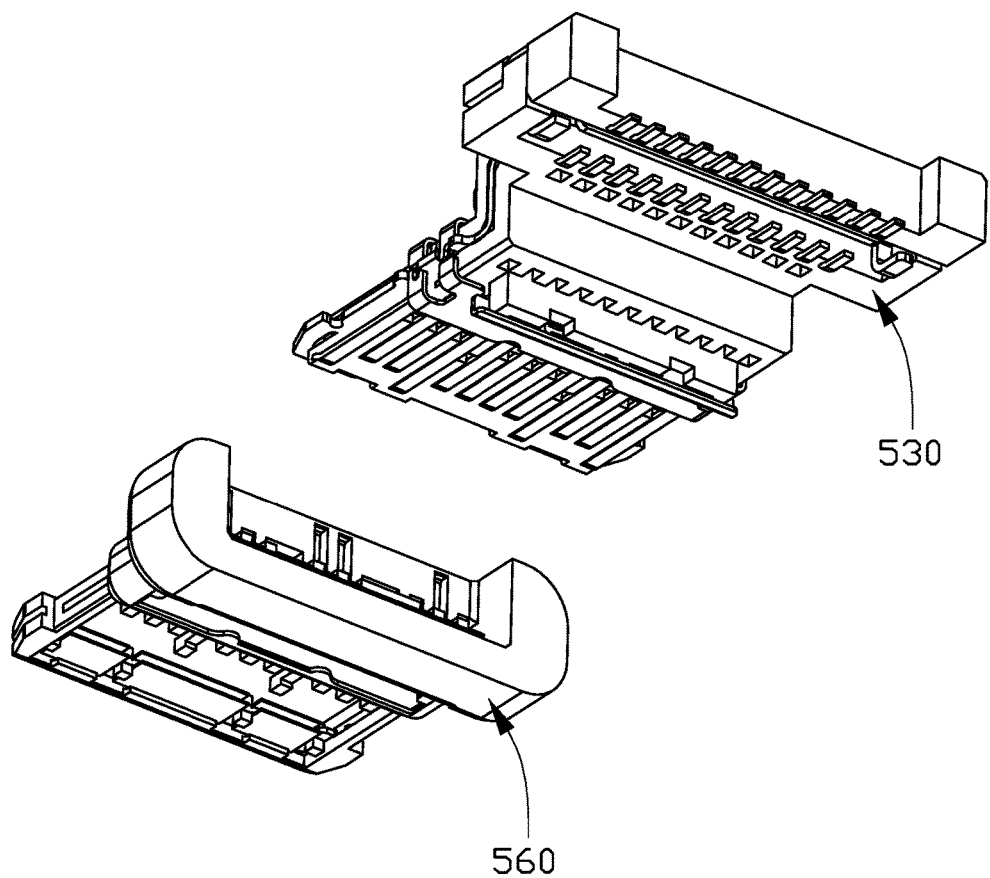
FIG. 34 is a further rear exploded view of the receptacle connector of FIG. 33(B)
Figure 35A:
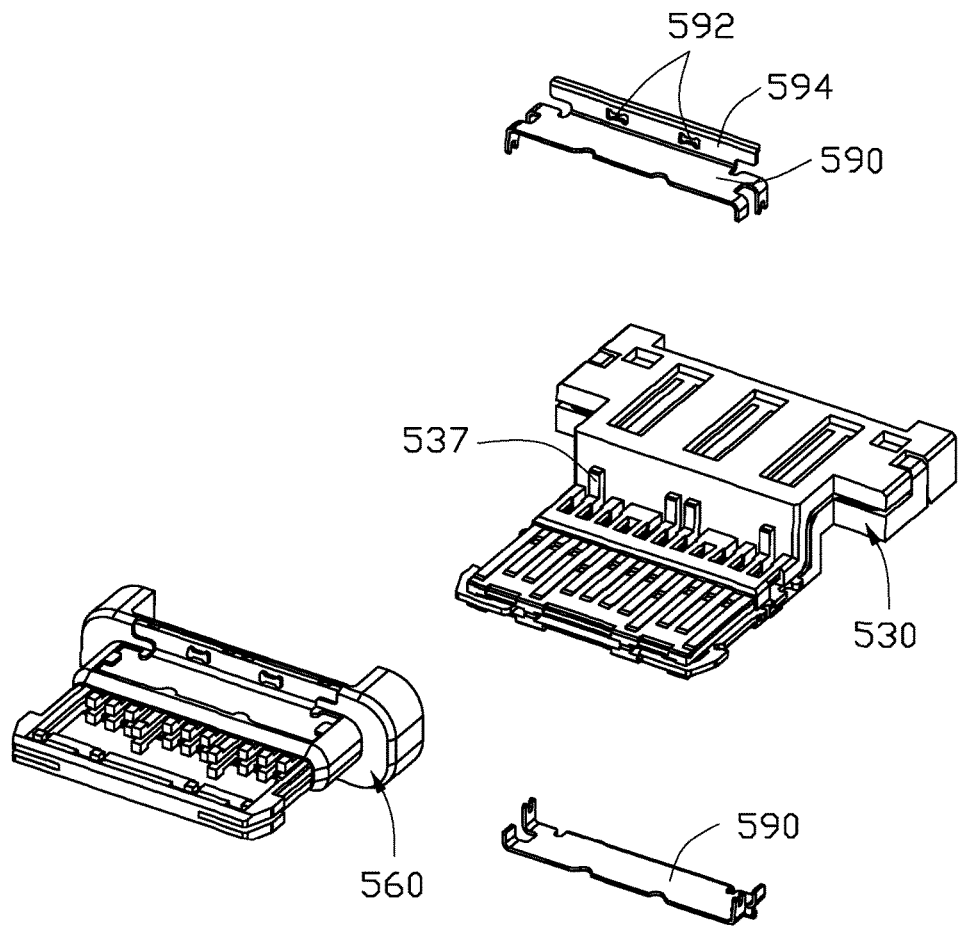
FIG. 35(A) is a further front exploded view of the terminal module of the receptacle connector of FIG. 34.
Figure 35B:
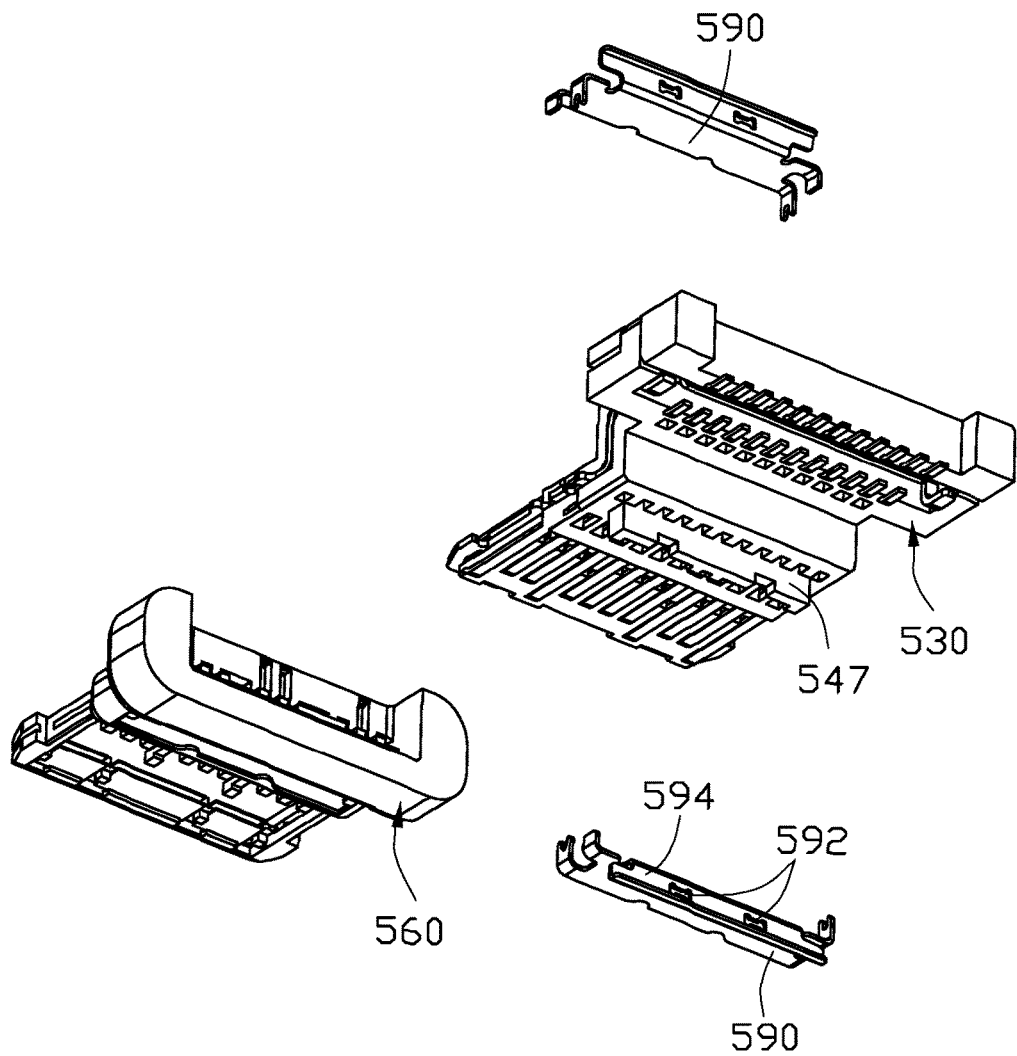
FIG. 35(B) is a further rear exploded view of the terminal module of the receptacle connector of FIG. 34.
Figure 36A:
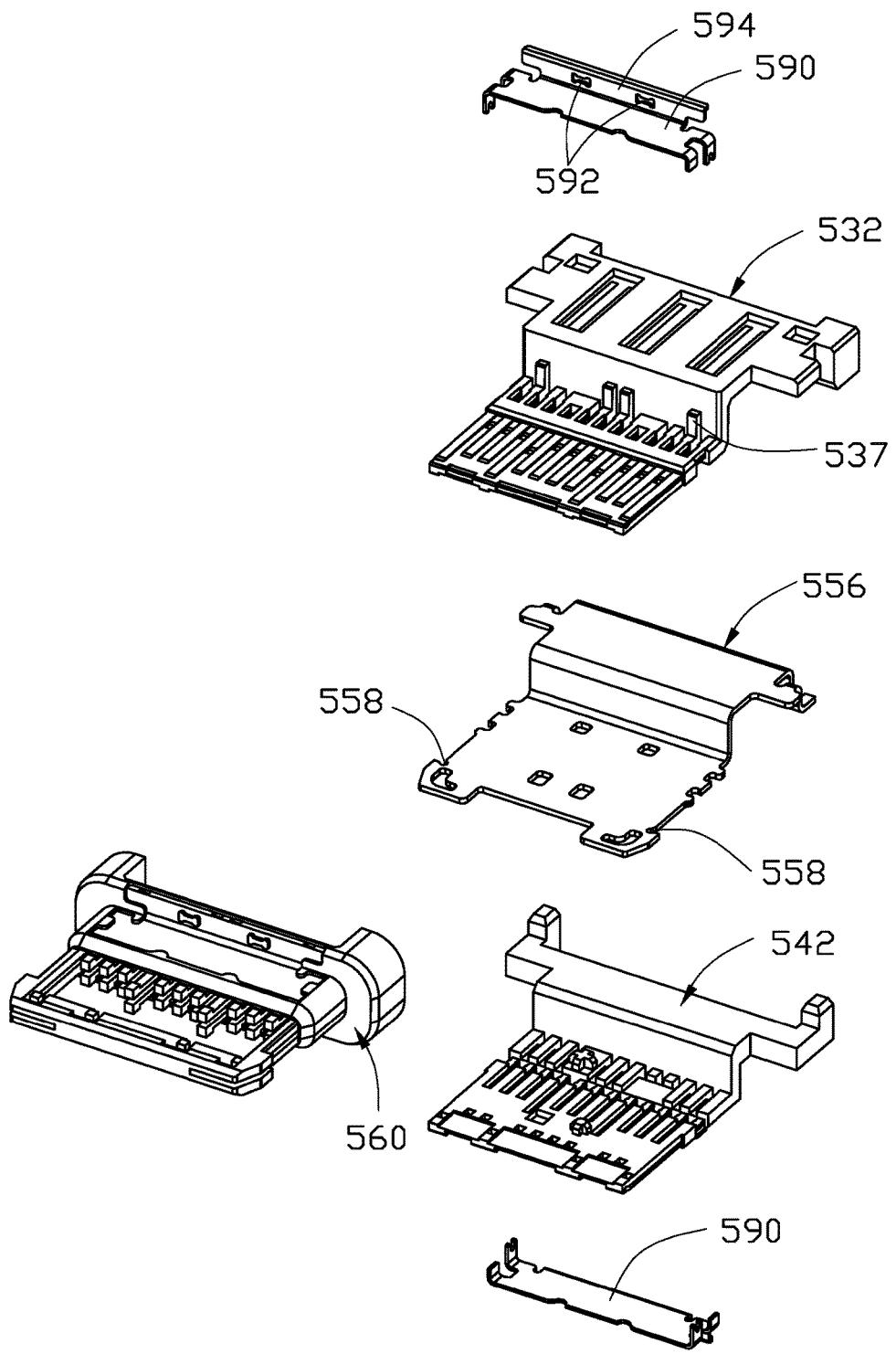
FIG. 36(A) is a further front exploded view of the terminal module of the receptacle connector of FIG. 35(A)
Figure 36B:
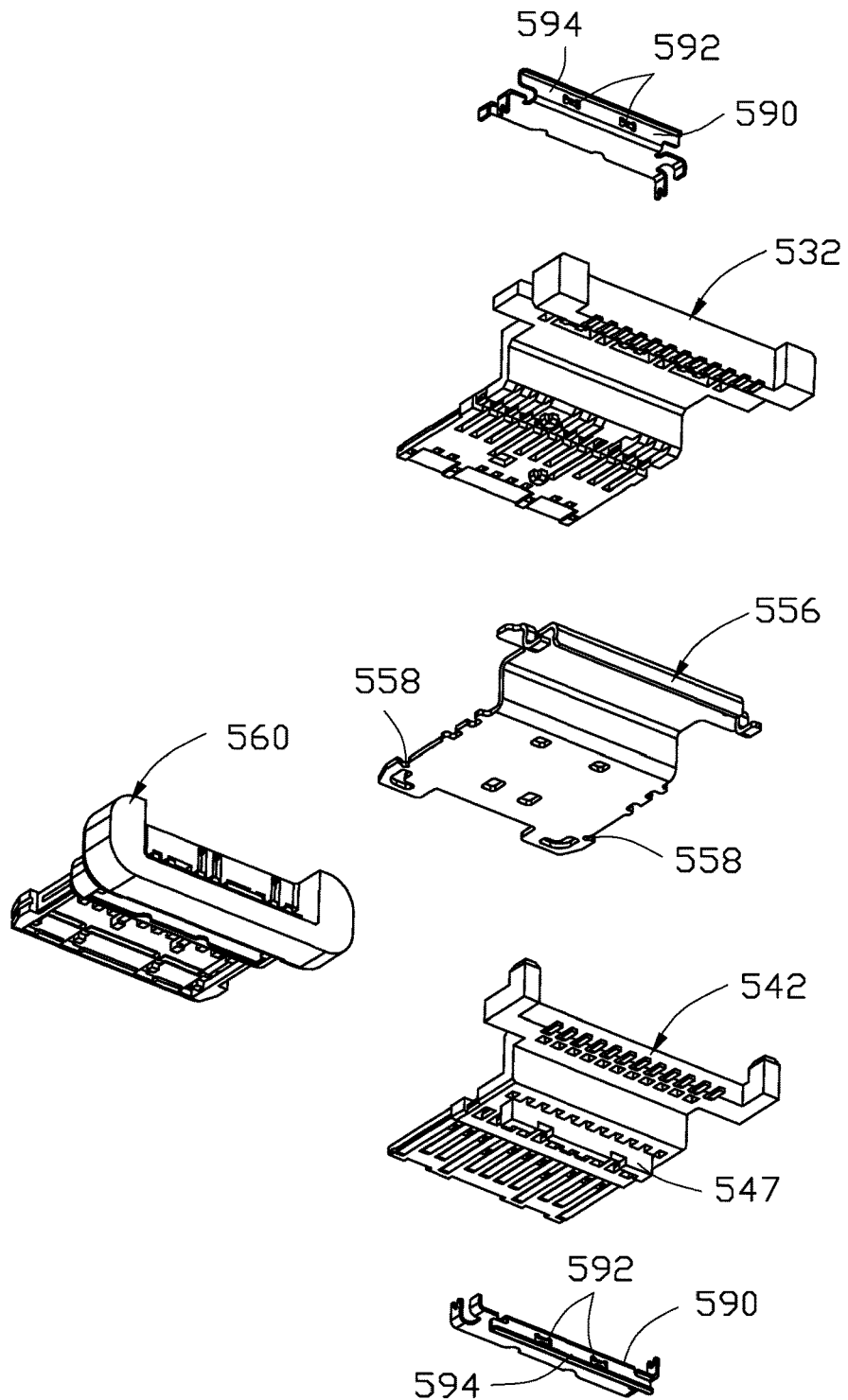
FIG. 36(B) is a further rear exploded view of the terminal module of the receptacle connector FIG. 35(B)

Because the filler 360 fills everywhere of the main basis 330 in three dimensions internally and/or externally under the second insert molding process, the whole terminal module 320 is efficiently consolidated including the front mating tongue 399, the area around the collars 390 and the rear main body behind the collars 390. Therefore, the so-call two-shot or double insert moldings method, i.e., the initial one for forming each of upper part 332 and lower part 342 and the successive one for integrating the terminal module 320, used in this embodiment achieves the strong structure than the assembling type. An advantage of this embodiment is to prevent the tip of the contacting sections of the contacts from pop-up via the first molding process while having the through holes, which are used to receive core pins for holding/supporting the contacting sections of the contacts in position during the first insert molding process, filled with the filler 260 during the second insert molding process so as to assure the sufficient strength of the mating tongue. Similar to the first embodiment, after assembled the mating tongue 399 extends in the capsular mating cavity 311 defined in the shield 310 for allowing the corresponding plug connector to be inserted therein in a flippable manner, i.e., concerning no orientations. The rear wall 319 of the shield 310, which cover the back side of the lower portion of the lower insulator 346 may efficiently prevent EMI which invades through the mating cavity 311, from rearwardly entering an interior of the computer around the printed circuit board 103. As shown in FIG. 27, the rear wall 319 of the shield 310 may shield EMI at or below the level of the printed circuit board 103 while the rear wall 317 of the bracket 312 may shield EMI above the printed circuit board 103 along the front-to-back direction. Thus, by cooperation of those two rear walls, the EMI may be efficiently prevented along the front-to-back direction. Notably, the lateral extension 315 covering the originally exposed corresponding portion of the housing, i.e., the upper insulator, also provides EMI prevention along the front-to-back direction.

Figure 37:
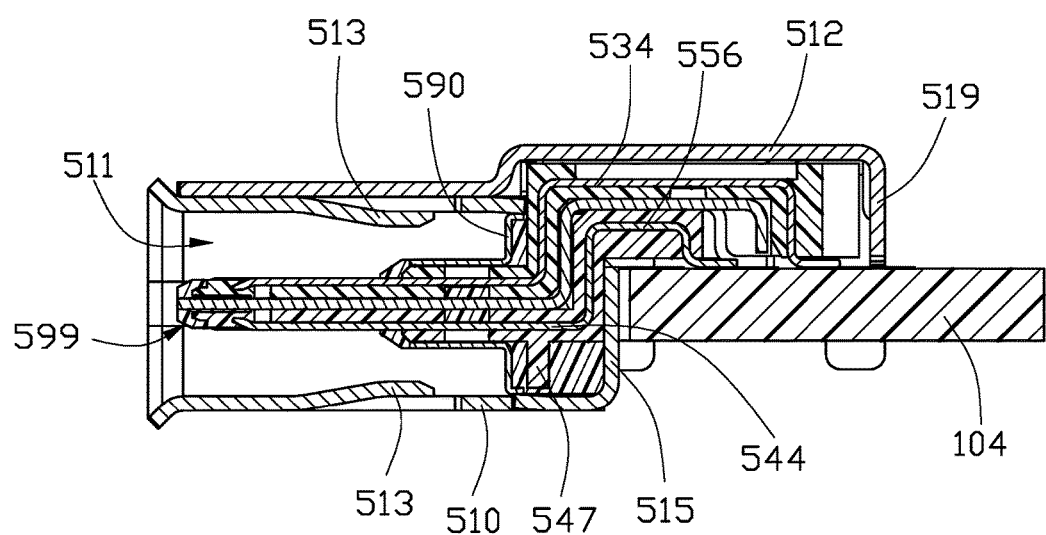
FIG. 37 is a cross-sectional view of the receptacle connector mounted upon the printed circuit board of FIG. 40.
Figure 38:
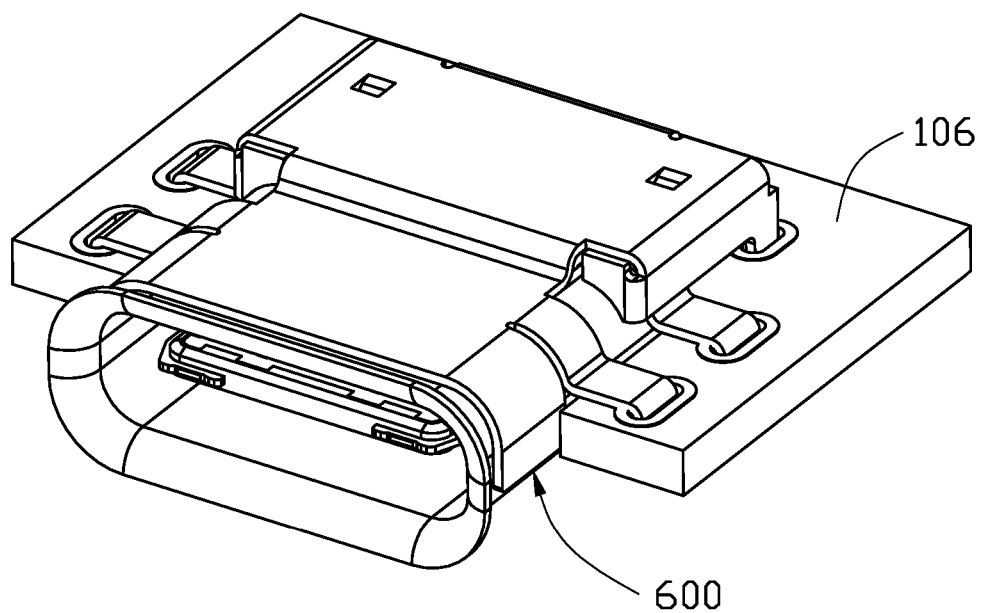
FIG. 38 is a front assembled perspective view of a fifth embodiment of the receptacle connector mounted to the printed circuit board.
Figure 39:
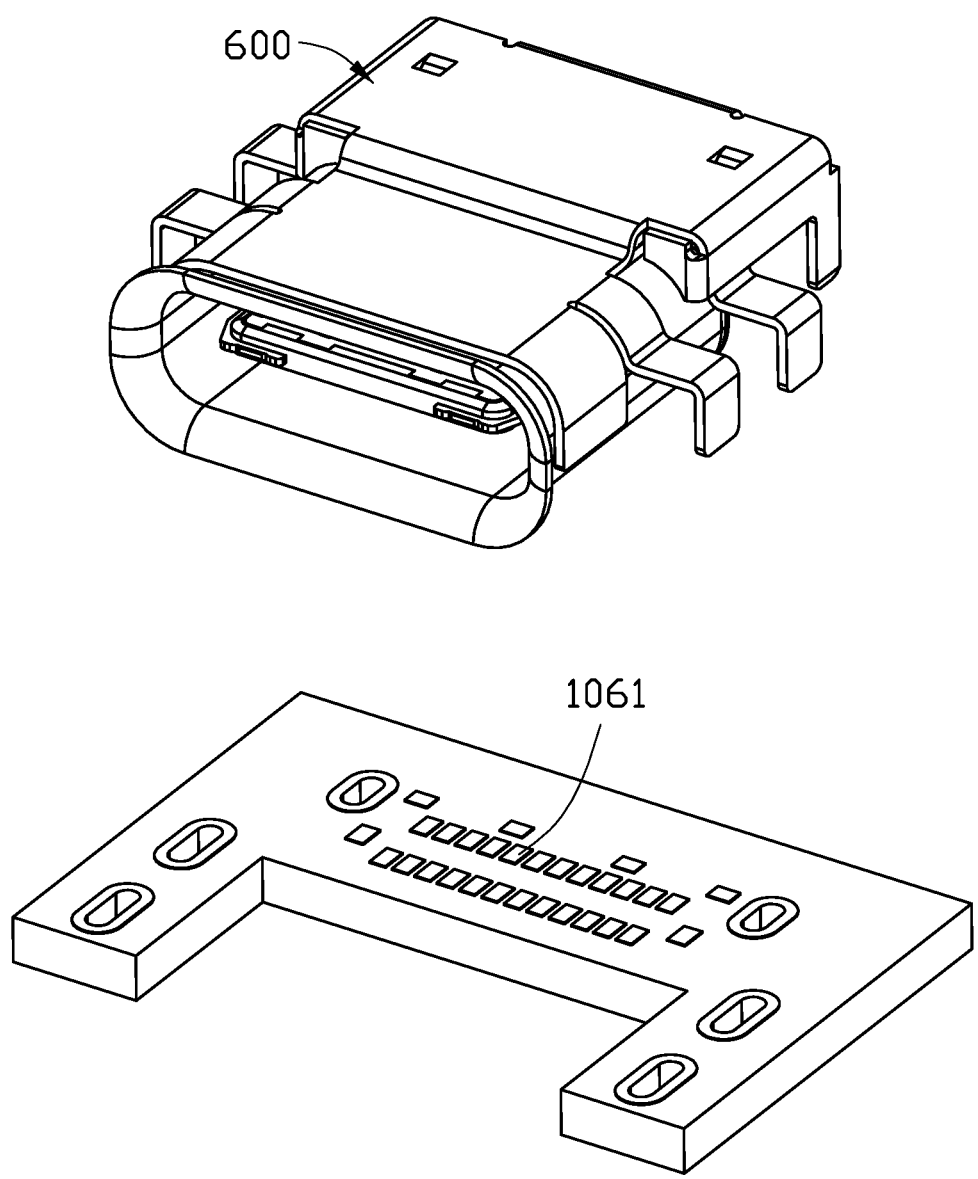
FIG. 39 is a front exploded perspective view of the receptacle connector moved away from the printed circuit board of FIG. 38.
Figure 40:
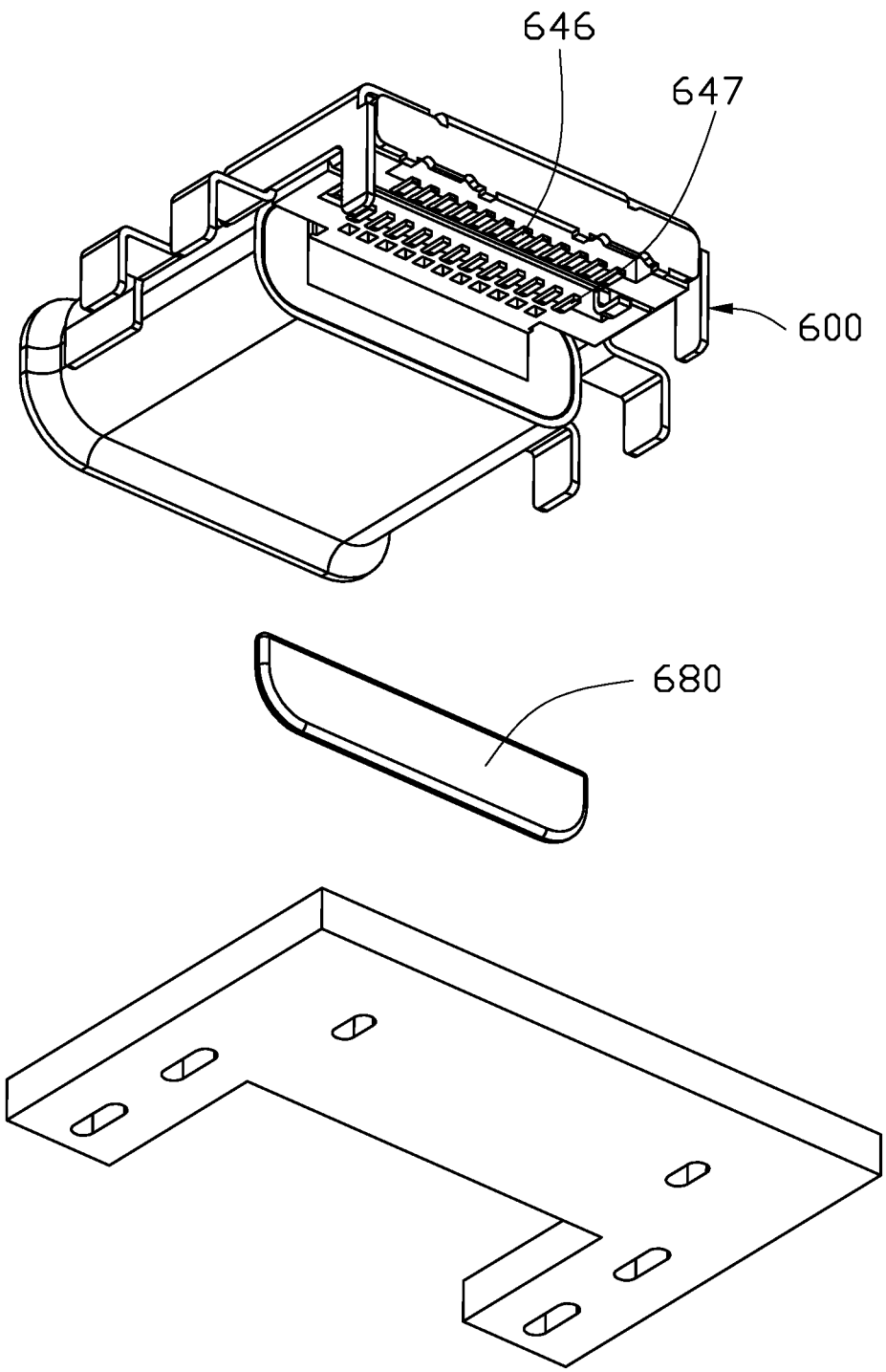
FIG. 40 is a rear partially exploded perspective view of the receptacle connector of FIG. 38.
Figure 41:
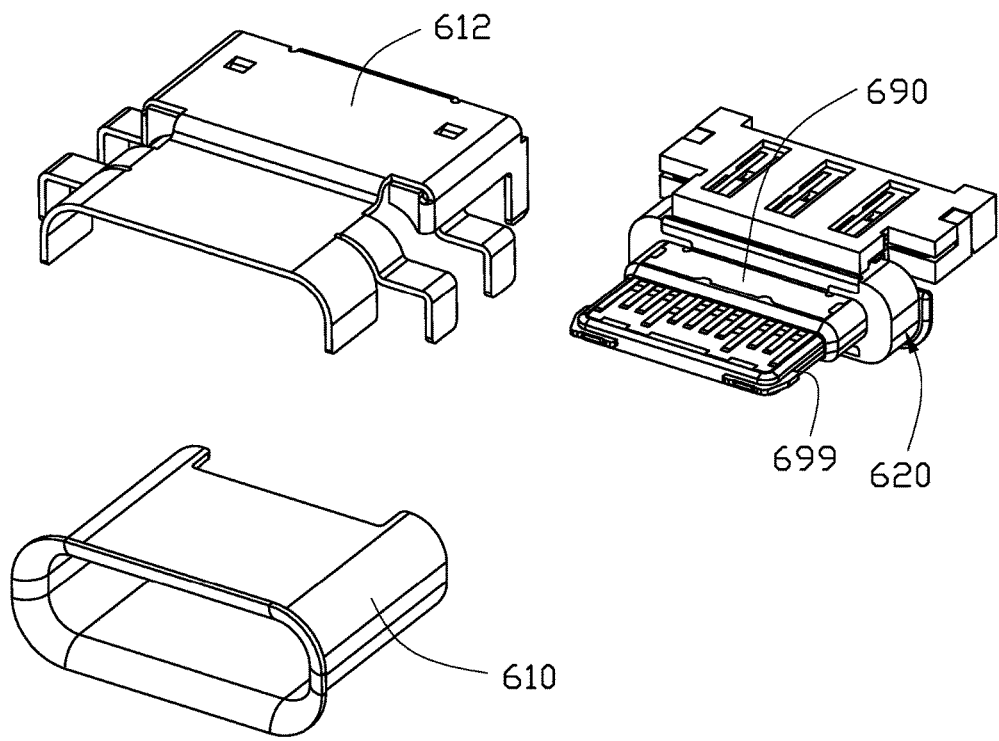
FIG. 41 is a further front partially exploded perspective view of the receptacle connector of FIG. 38 after the second insert molding process.
Figure 42:
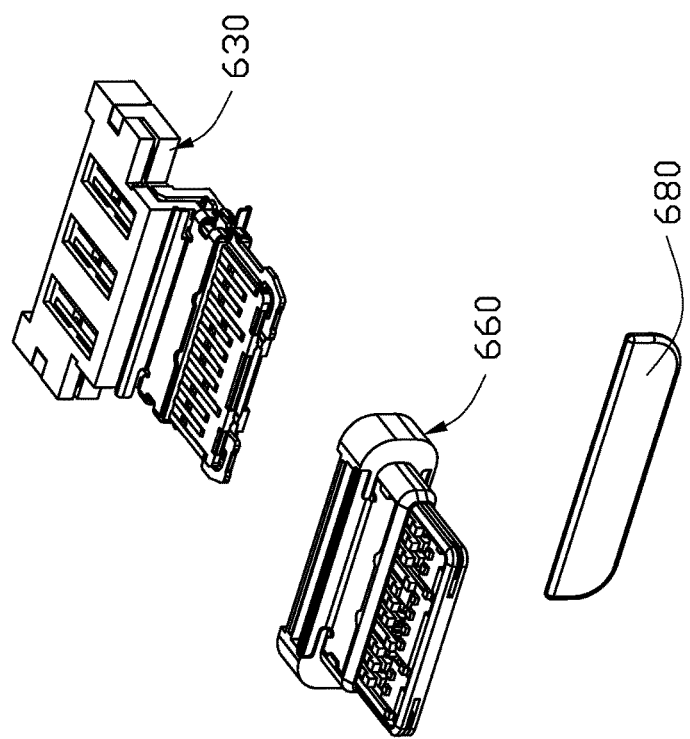
FIG. 42 is a further front partially exploded perspective view of the receptacle connector of FIG. 41 after the first insert molding process.
Figure 42:
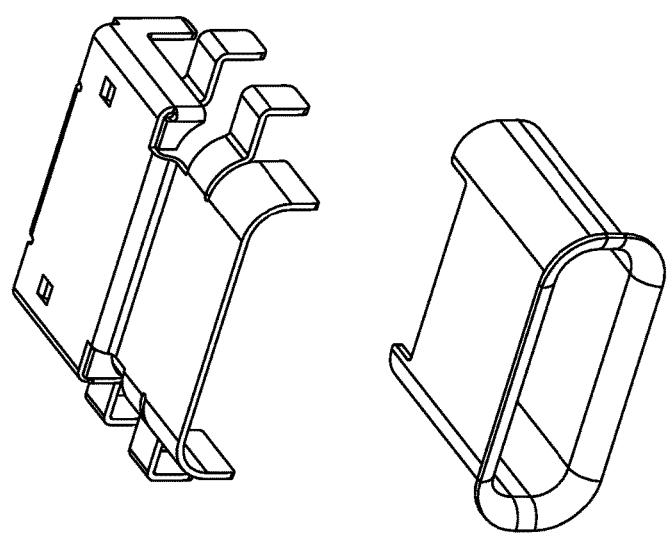
Figure 43:
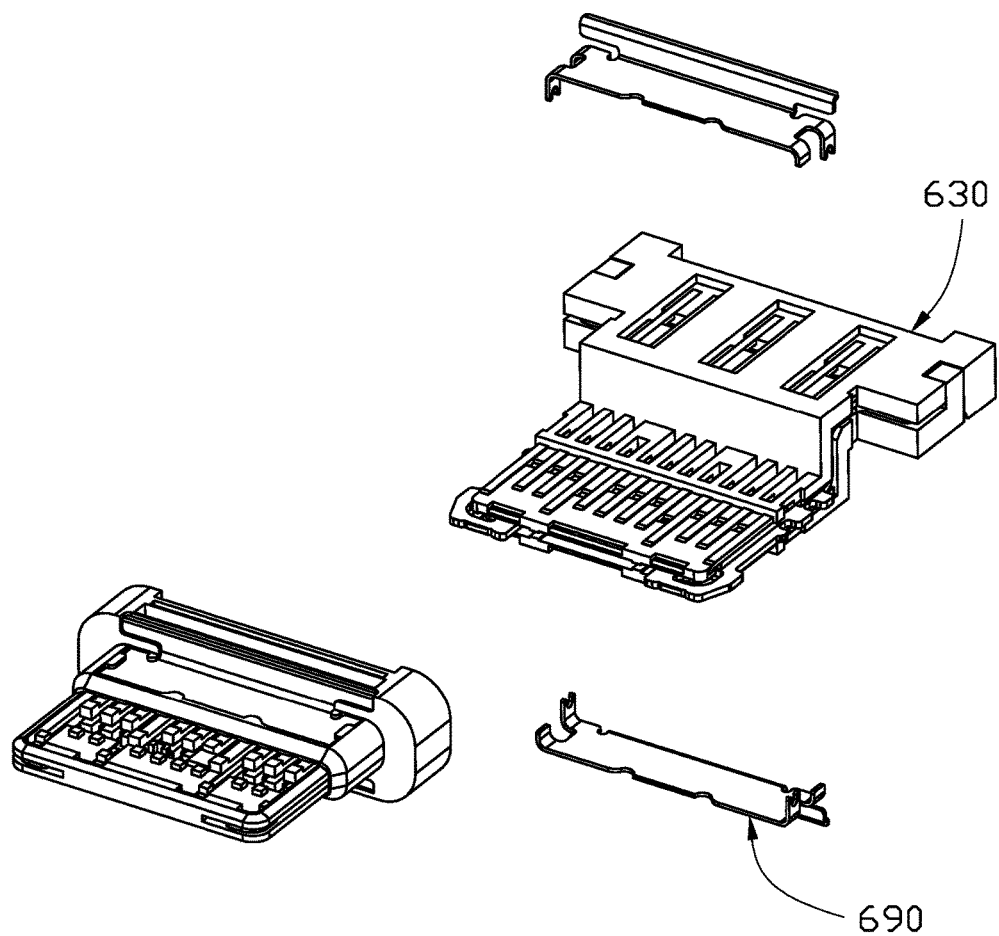
FIG. 43 is a front exploded perspective view of the terminal module of the receptacle connector of FIG. 42 after the first insert molding process.
Figure 44A:
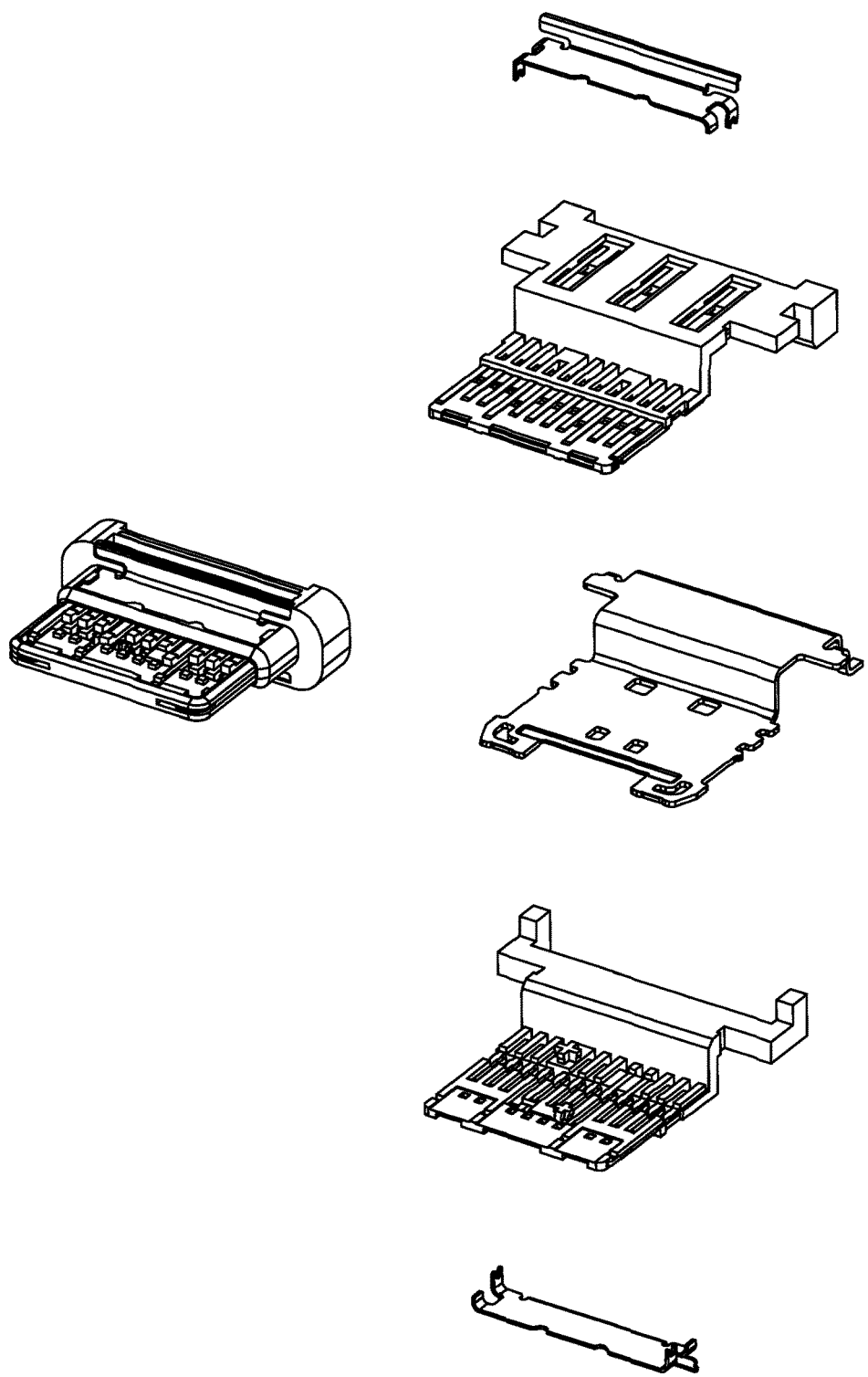
FIG. 44(A) is a further front exploded perspective view of the terminal module of the receptacle connector of FIG. 43 after the first insert molding process.
Figure 44B:
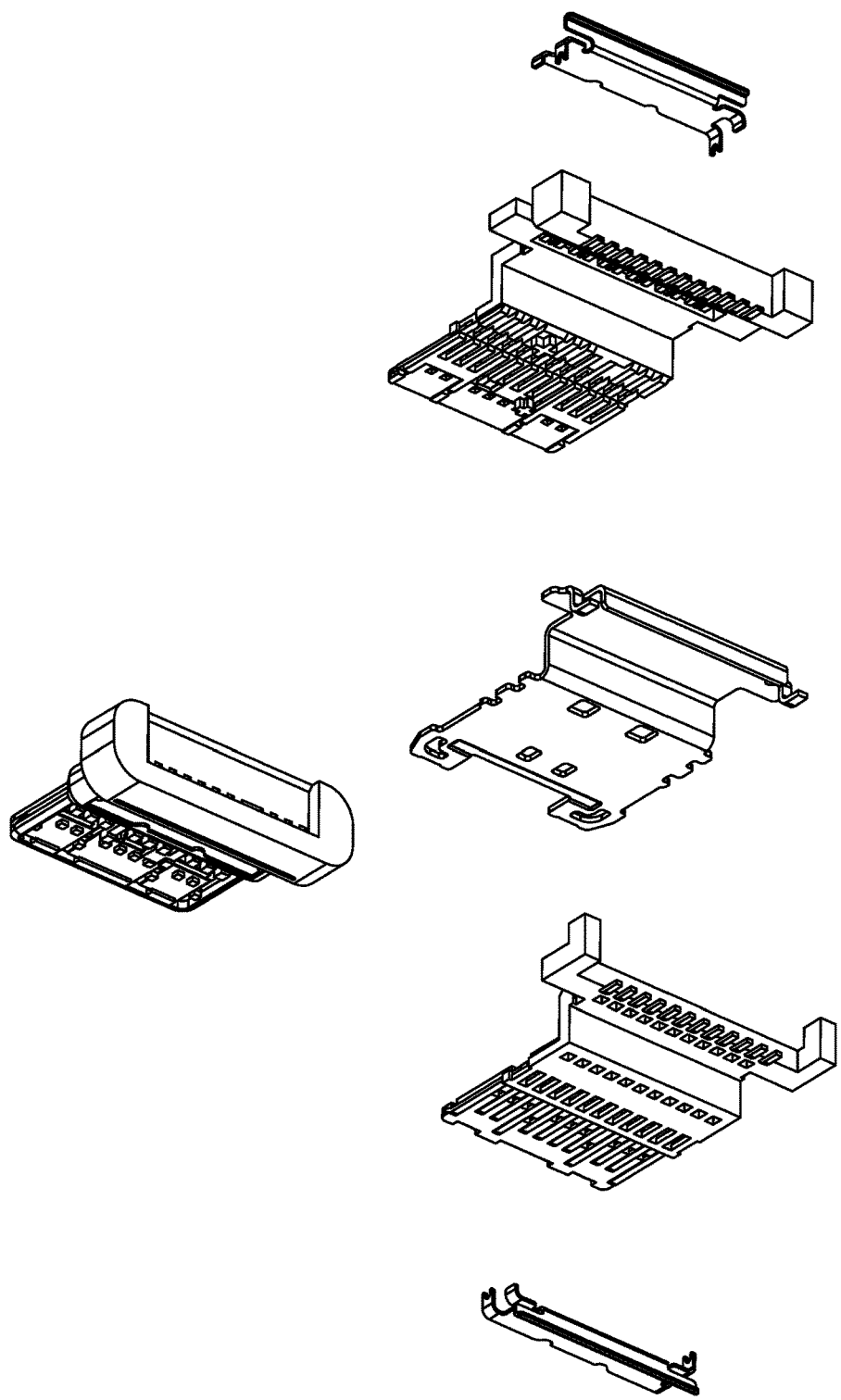
FIG. 44(B) is a further rear exploded perspective view of the terminal module of the receptacle connector of FIG. 43 after the first insert molding process.
Figure 45:
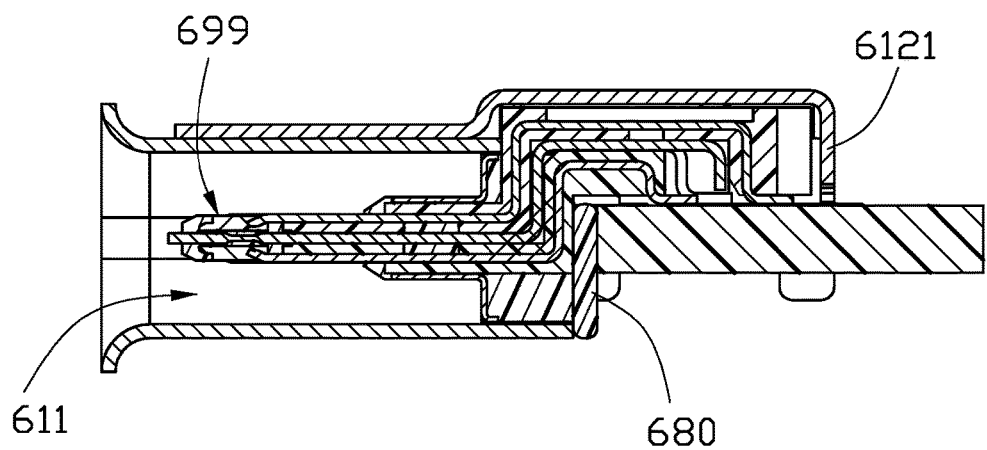
FIG. 45 is a cross-sectional view of the receptacle connector on the printed circuit board of FIG. 38.
Figure 46:
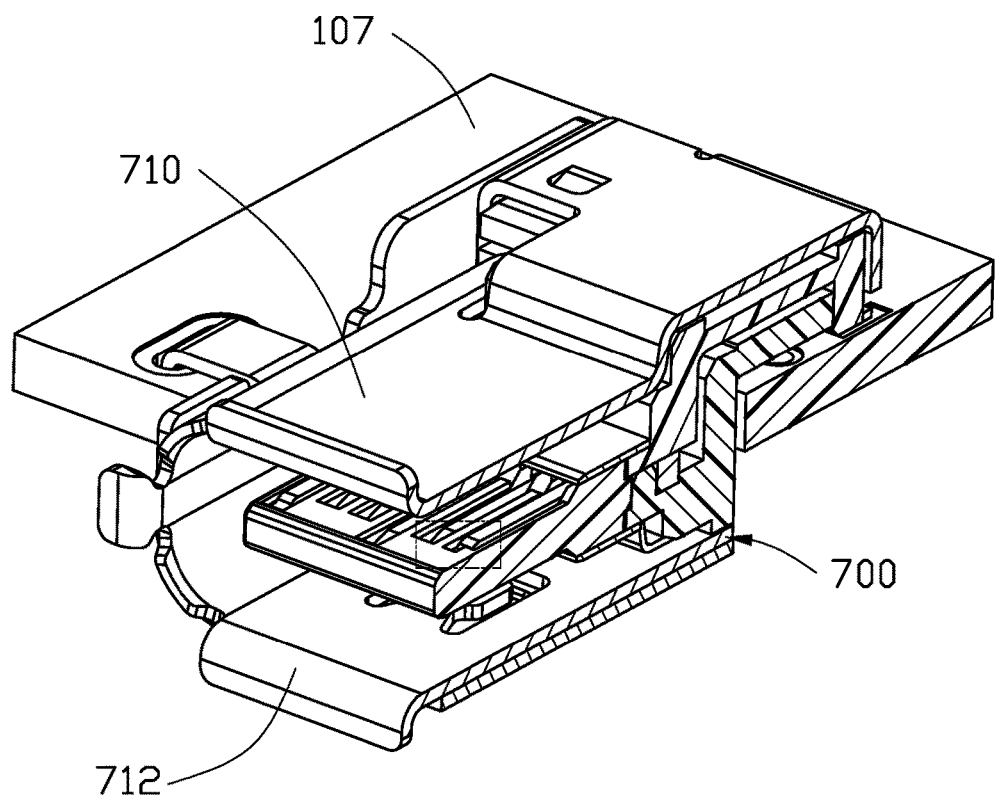
FIG. 46 is a cut-out, i.e., one half, front assembled perspective view of the receptacle connector mounted upon the printed circuit board according to a six embodiment of the invention.
Figure 47A:
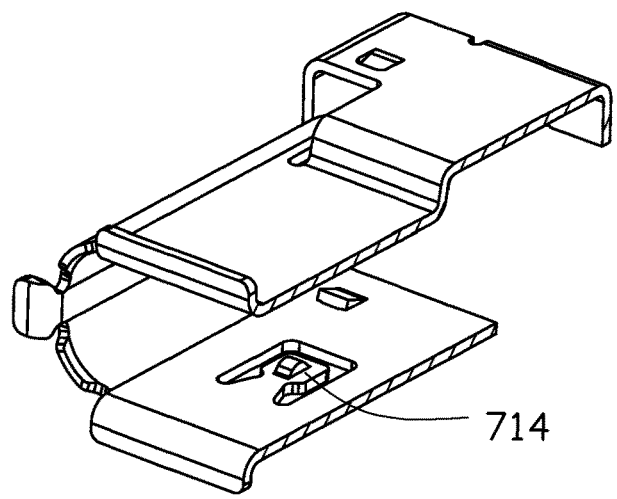
FIG. 47(A) is a front exploded downward perspective view of the receptacle connector of FIG. 46.
Figure 47A:
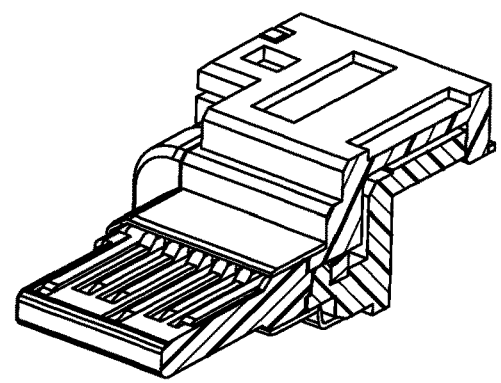
Figure 47A:
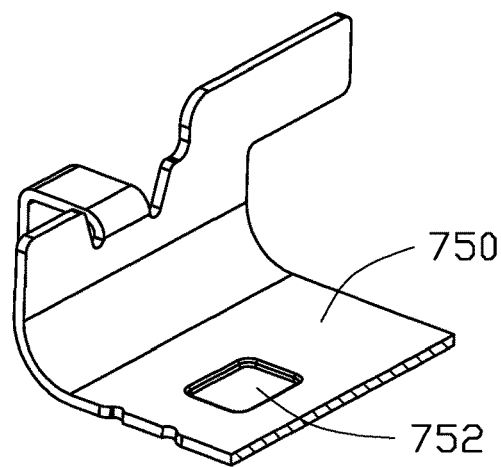
Figure 47B:
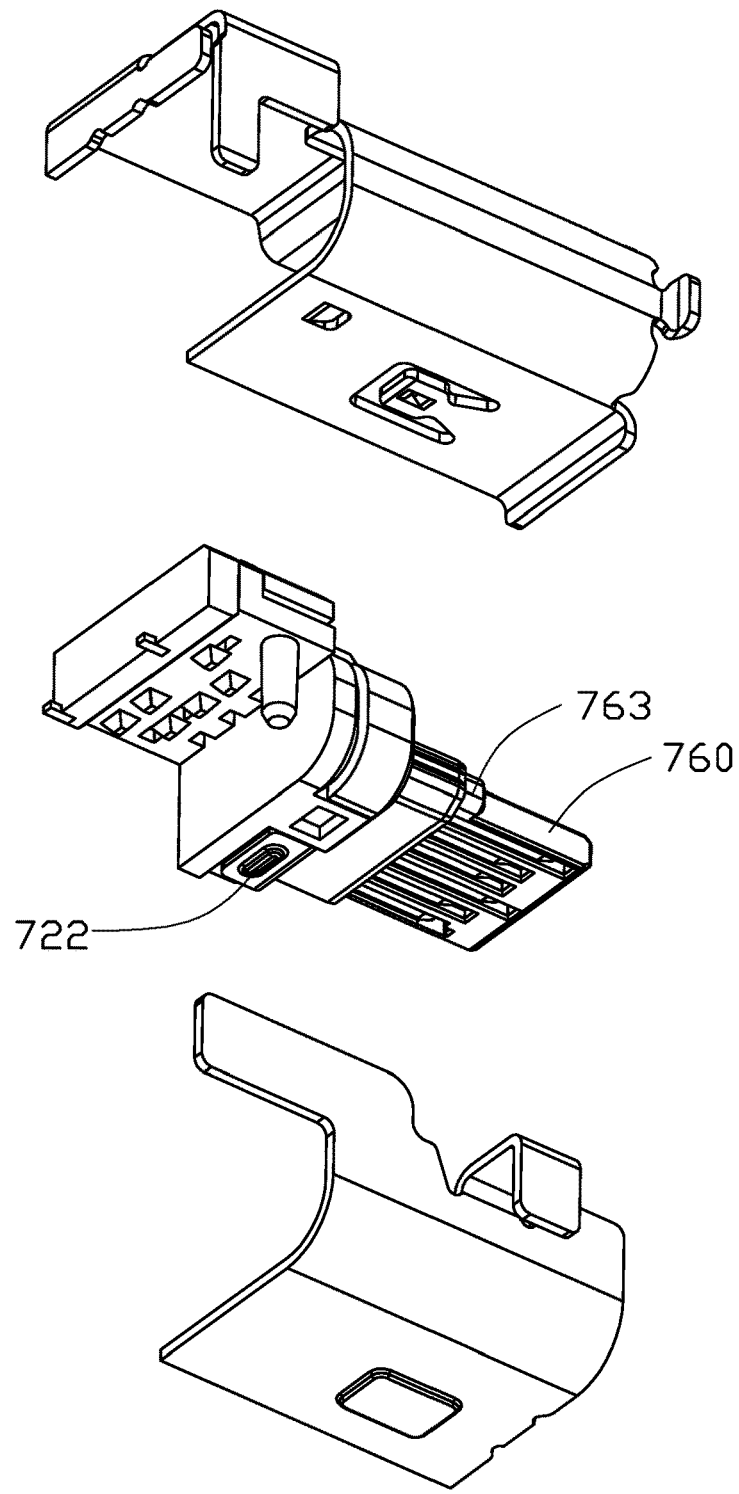
FIG. 47(B) is a rear exploded upward perspective view of the receptacle connector of FIG. 46.
Figure 48:
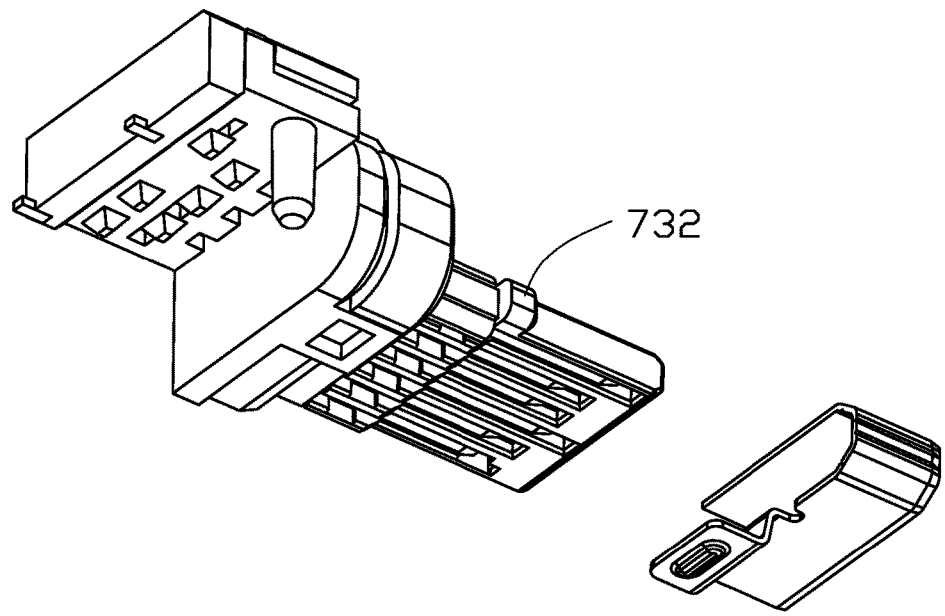
FIG. 48 is a rear further exploded upward perspective view of the receptacle connector of FIG. 47(B)

FIGS. 30-37 show a fourth embodiment similar to the previous embodiments wherein the receptacle connector 500 mounted upon and within a cutout 1041 of the printed circuit board 104. The connector 500 includes a metallic shield 510 enclosing the terminal module 520 and attached/soldered to a metallic bracket 512 above which is mounted to the printed circuit board via mounting legs 516. The shield 510 is equipped with the flared flange 514 in the front opening for easy insertion of the plug connector is made via the stamping from sheet metal with spring tangs 513 for engagement with the inserted plug connector. A rear wall 515 is unitarily formed with the shield 510 to prevent EMI invasion along the front-to-back direction around a lower half portion of the connector 500 wherein the rear wall 515 extends from a bottom wall 517 of the shield 510, located behind the terminal module 520, and terminates around an upper surface of the printed circuit board 104 as shown in FIG. 37. Similar to the previous embodiment, the bracket 512 is equipped with a rear wall 519 extending downward from a top wall (not labeled), located behind the terminal module 520, and terminates at an upper surface of the printed circuit board 600. Thus, by cooperation of both the rear wall 515 of the shield 510 and the rear wall 519 of the bracket 512, no EMI through the connector 500 may invade an interior of the computer around the printed circuit board 600 in the front-to-back direction. Notably, in this embodiment, the rear wall 515 is unitarily formed with the shield 510.

Similar to the previous embodiment, the terminal module 520 includes a main basis 530 and a filler 560 assembled to each other via a second insert molding process. The main basis 530 includes an upper part 532 essentially consisting of a plurality of upper contacts 534 embedded within an upper insulator 536 via a first insert molding process, a lower part 542 essentially consisting of a plurality of lower contacts 544 embedded within a lower insulator 546 via a second insert molding process, and metallic shield plate 556 sandwiched between the upper part 532 and the lower part 542. The man basis 530 and the filler 560 are very similar to those in the previous embodiment disclosed in FIG. 20-29 except some tiny differences. For example, several ribs 537 are formed on the upper insulator 536 and an upstanding wall 547 is formed on the lower insulator 546 for interacting with the filler 560. The collar 590 further forms a pair of through holes 592 in the vertical extension 594 for filling of the filler 560. The filler 560 defines a contour in compliance with that of the shielding plate 556 so that the locking side edge 558 of the shielding plate 556 and the front edge of the shielding plate 556 no longer protrude out of the mating tongue 599 of the terminal module 530 in an exposed manner wherein the mating tongue 599 extends in the capsular mating cavity 511 in the shield 510. Notably, the filler 560 may have less material than that disclosed in the previous embodiment due to the different contact carrier arrangement which may block some injection paths of the second insert molding process. The whole assembling process is similar to that in the previous embodiment by two insert molding processes wherein the rear wall 515 of the shield 510 and the rear wall 519 of the bracket 512 are bent to their final vertical positions after the terminal module 530 has been assembled into the shield 510. Alternately, the bracket 512 may be formed with its final shape and soldered to the shield 510 after the terminal module 530 is assembled into the shield 510. Understandably, in this embodiment, a metallic bottom bracket similar to that in the first embodiment while with an additional rear wall, may not be required because the shield 510 already provides. At the same time, the continuous flared flange 514 around the front opening of the shield 510, which is required for mating and generally provided by the drawing method, is also constituted via stamping and forming sheet metal economically. In this embodiment, the boundary line 597 of the shield 510 is located on a top wall (not labeled) of the shield 510, compared with that in the previous embodiment located on the bottom wall. Understandably, this reverse arrangement with regard to the previous embodiment may provide a complete/unitary structure of the rear wall advantageously without a slit/boundary line of the rear wall around the middle area which is shown in the previous embodiment.

Referring to FIGS. 38-45, according to a fifth embodiment of the invention the receptacle connector 600 mounted upon the printed circuit board 106, includes a terminal module 620 enclosed in the metallic shield 610 which is soldered to a metallic bracket 612. The terminal module 620 essentially includes a main basis 630 as a semi-finished part, and a filler 660 applied upon and filled within the main basis 660 via a second insert molding process, which is similar to the previous embodiments. It is noted that compared with the similar second embodiment described in the previously filed application 61/989,508 which implements the two insert molding processes while still leaving shortened tips of the corresponding contacting sections at the front, in this embodiment the upper insulator 636 fully covers the front tips of the contacting sections 633 of the corresponding contacts 634, the lower insulator 636 fully covers the front tips of the contacting sections 634 of the corresponding contacts 644, thus avoiding the possible tilting of the front tips of the contacting sections of the corresponding contact during the second insert molding process.

One important feature of the embodiment is to provide an EMI (Electro-Magnetic Interference) gasket 680 behind the lower insulator 646 and the filler 660 while in front of the printed circuit board 106 so as to be sandwiched between the electrical connector 600 and the printed circuit board 106. The EMI gasket 680 is made of conductive elastomer consists of a silicone, fluorosilicone, EPDM or fluorocarbon-fluorosilicone binder with a filler of pure silver, silver-plated copper, silver-plated aluminum, silver-plated nickel, silver-plated glass, nickel-plated graphite, nickel-plated aluminum or unplated graphite particles. For those materials containing silver, both packaging and storage conditions should be similar to those for other silver-containing components, such as relays or switches. They should be stored in sheet plastic, such as polyester or polyethylene, and kept away from sulfur-containing materials, such as sulfur-cured neoprene, cardboard, etc.

Because the filler 660 fills everywhere of the main basis 630 in three dimensions internally and/or externally under the second insert molding process, the whole terminal module 620 is efficiently consolidated including the front mating tongue 699, the area around the collars 690 and the rear main body behind the collars 690. Therefore, the so-call two-shot or double insert moldings method, i.e., the initial one for forming each of upper part and lower part and the successive one for integrating the terminal module 620, used in this embodiment achieves the strong structure than the assembling type. An advantage of this embodiment is to prevent the tip of the contacting sections of the contacts from pop-up via the first molding process while having the through holes, which are used to receive core pins for holding/supporting the contacting sections of the contacts in position during the first insert molding process, filled with the filler 60 during the second insert molding process so as to assure the sufficient strength of the mating tongue. Similar to the first embodiment, after assembled the mating tongue 699 extends in the capsular mating cavity 611 defined in the shield 610 for allowing the corresponding plug connector to be inserted therein in a flippable manner, i.e., concerning no orientations. Different from the previous embodiment, the shield 610 of the receptacle connector 600 is equipped with the flared flanges 612 for easy mating with the plug connector. As mentioned before, the EMI gasket 680 may efficiently prevent EMI which invades through the mating cavity 611, from rearwardly entering an interior of the computer around the printed circuit board 150. Understandably, because the whole receptacle connector 600 is essentially fully enclosed within a space surrounded by the metallic shield 610, the metallic bracket 612, the EMI gasket 680, and the printed circuit board 106, there is less EMI concern. Notably, the mounting posts of the lower insulator used for mounting to the printed circuit board in the first embodiment no longer exists in this embodiment for assuring no EMI leakage thereabouts. The surface mounting structure of the tail sections 637, 647 of both the contacts instead of the through hole type for mounting to the corresponding pads 1061 on the printed circuit board 106, is another approach for achieving the EMI protection. One important feature of this embodiment is to provide a continuous flared flange structure 1061 on the shield 610 via a deep drawing process so as to not only ease insertion of the plug connector but also assure no leakage radially. Understandably, in this embodiment the shield 610 is made by a drawing process so no rear wall at the rear opening can be formed for blocking communication along the front-to-back direction. This is the reason why the additional EMI gasket is required. Differently, if the shield of the receptacle connector is made via stamping sheet metal with successive forming, the rear wall of the shield may be unitarily formed instead of the discrete EMI gasket.

Figure 50:
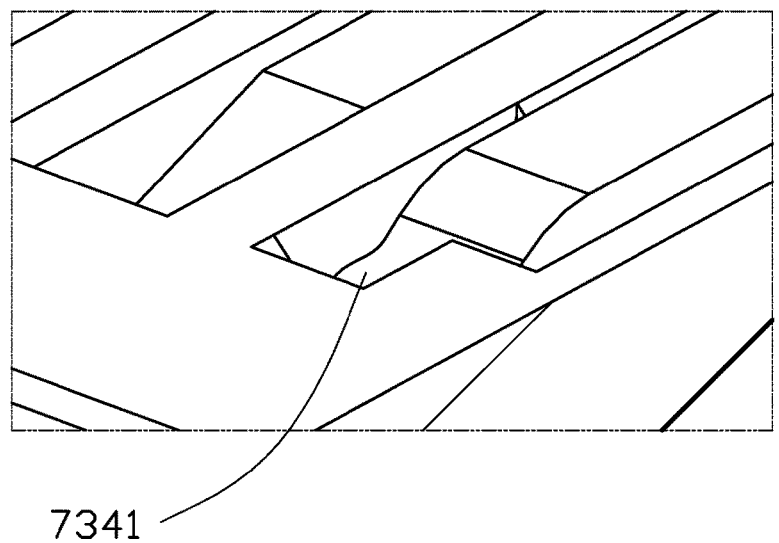
FIG. 50 is a partial perspective view of the receptacle connector of FIG. 46 to show the tip of the contacting section is pressed by the housing.
Figure 49:
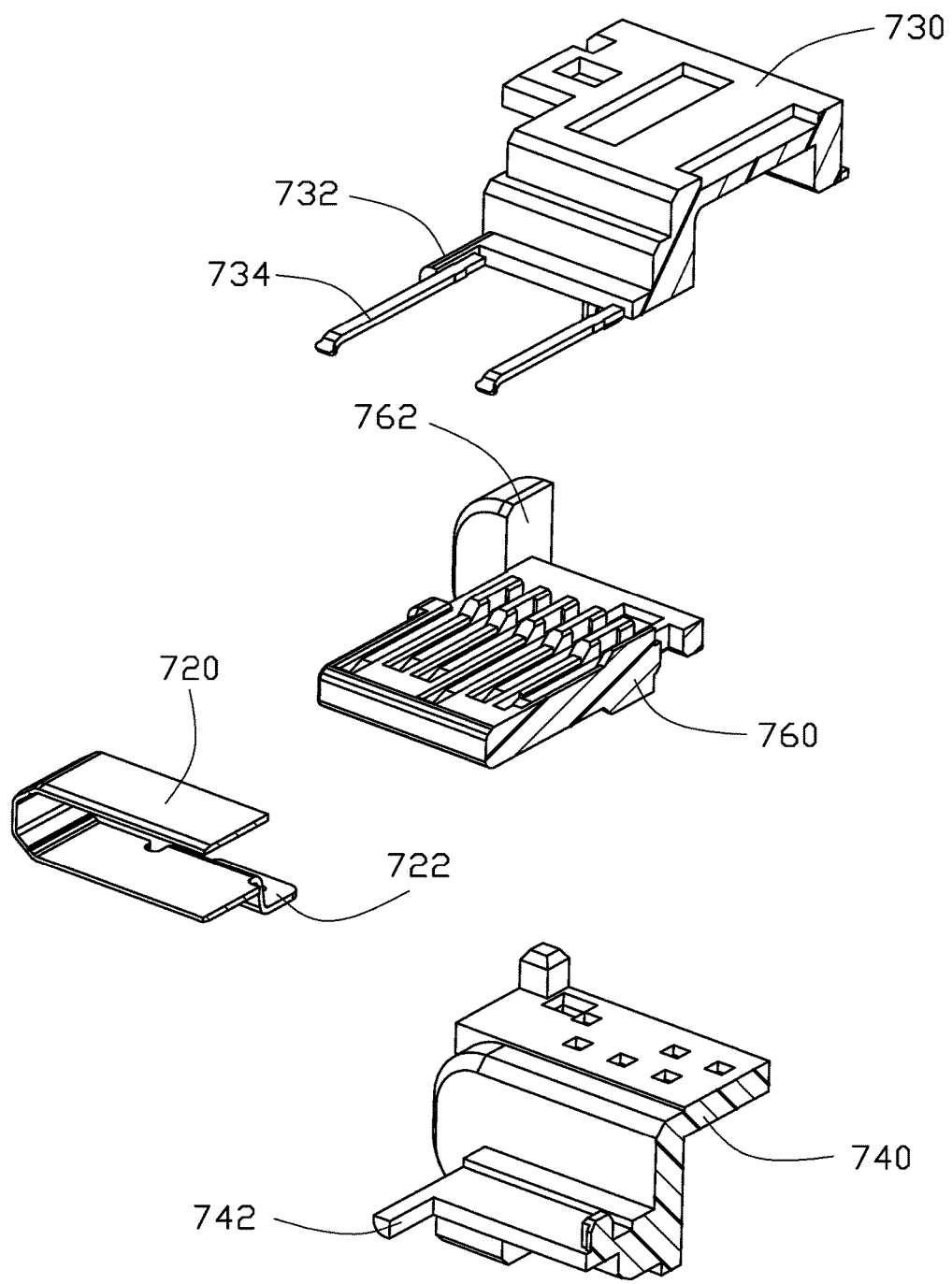
FIG. 49 is a front further exploded downward perspective view of the receptacle connector of FIG. 47(A)
Figure 51:
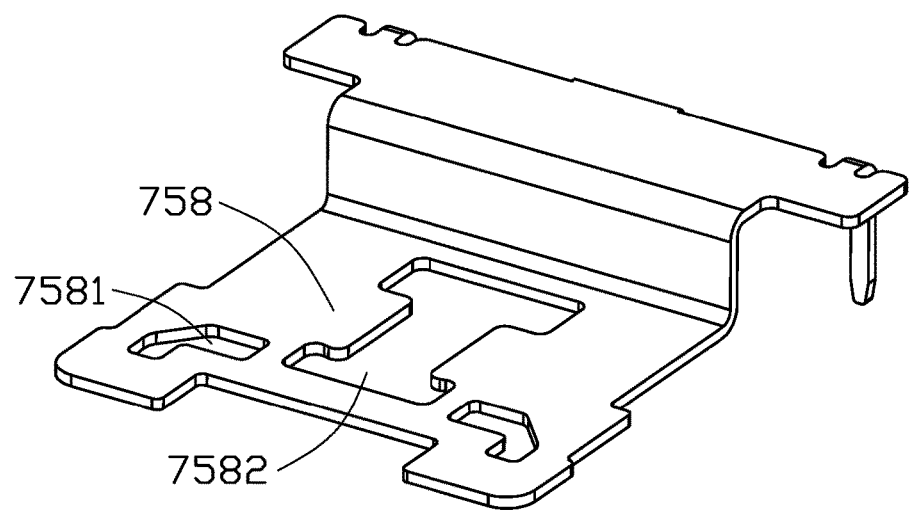
FIG. 51 is a perspective view of the shielding plate of the receptacle connector of FIG. 46 to show with the openings for insert molding.
Figure 52:
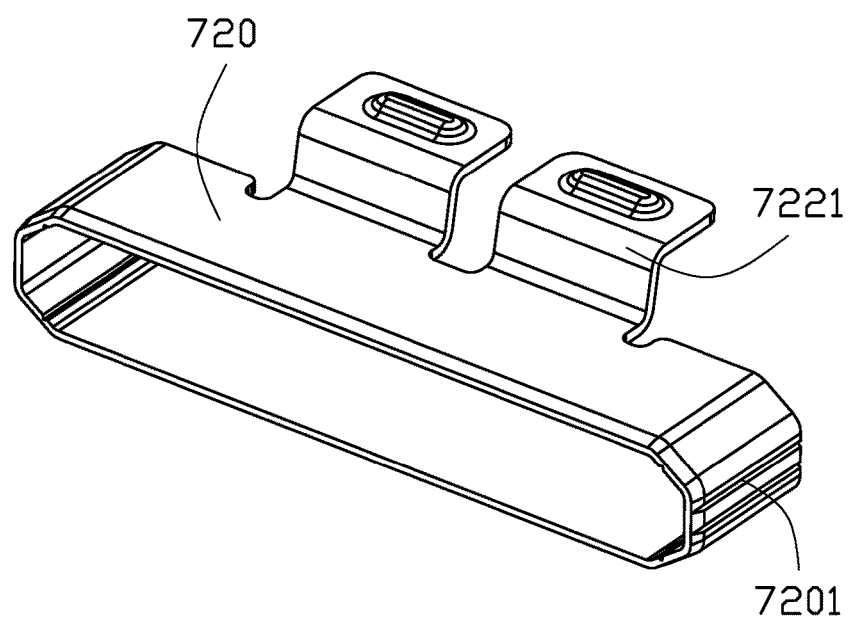
FIG. 52 is a perspective view of the collar of the receptacle connector of FIG. 46 to show a slot formed therein.
Figure 53:
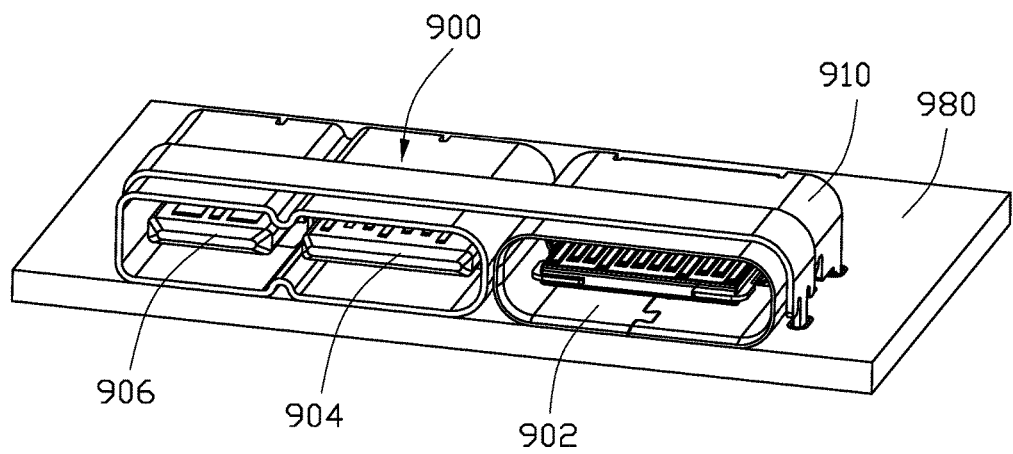
FIG. 53 is a perspective view of a seventh embodiment of a combo receptacle connector mounted upon a printed circuit board according to the invention.
Figure 54:
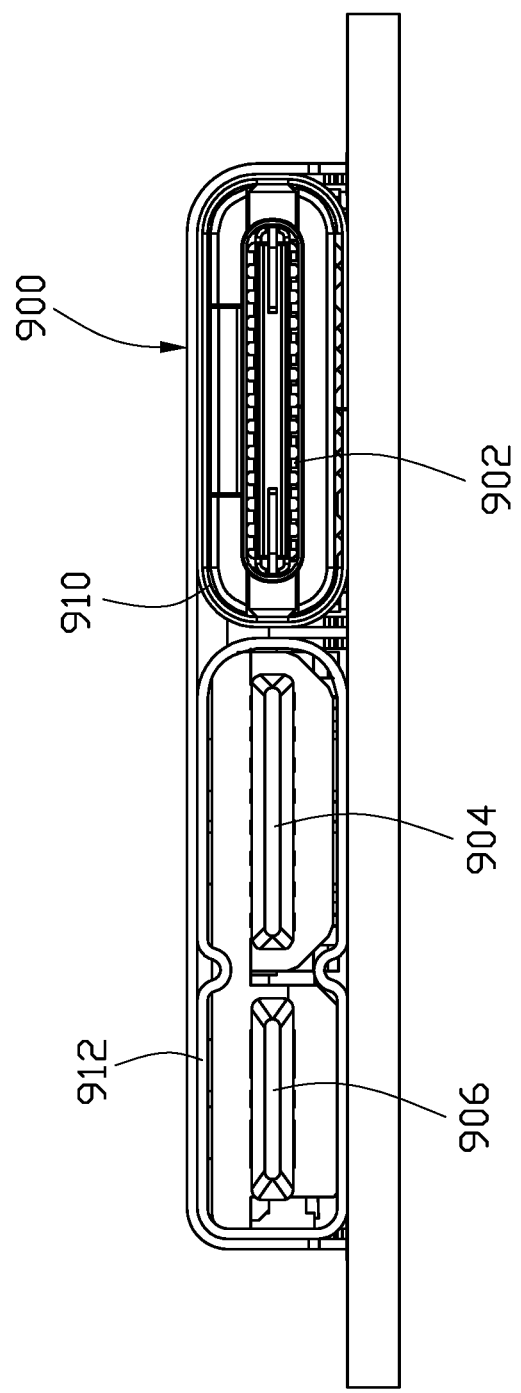
FIG. 54 is a front view of the combo receptacle connector on the printed circuit board of FIG. 53.
Figure 55:
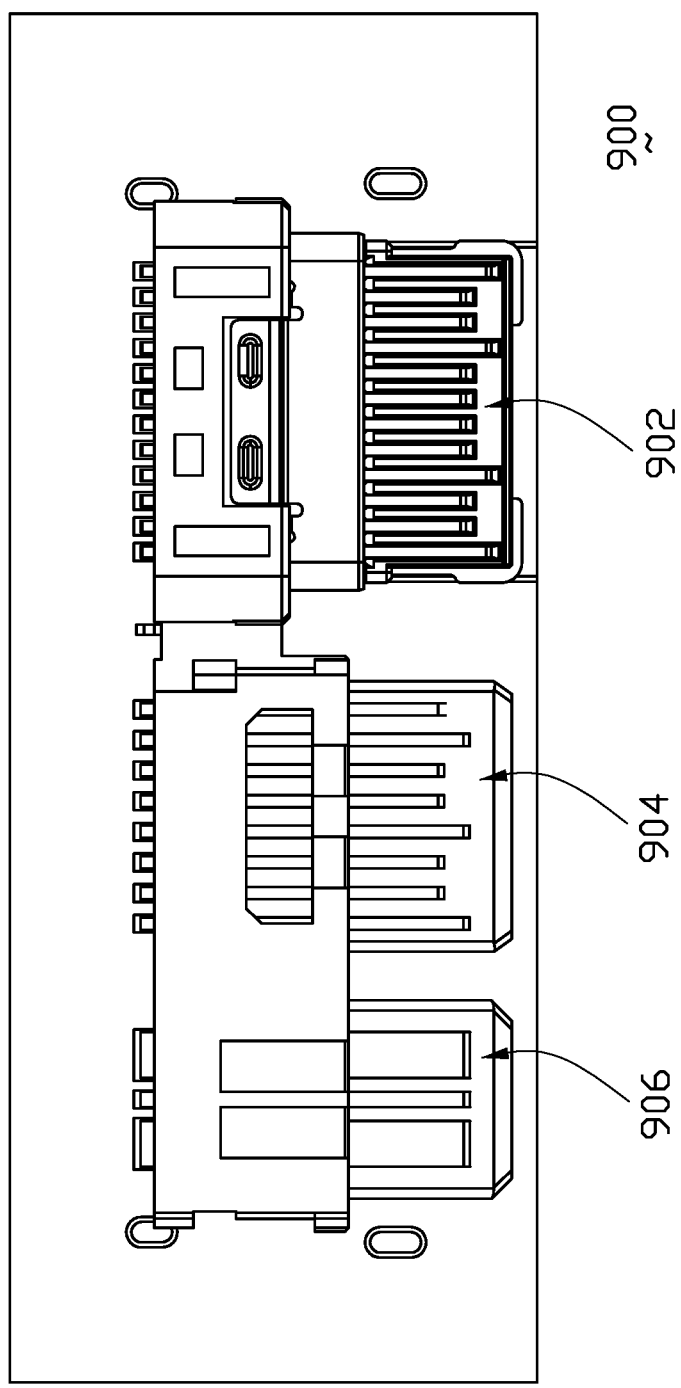
FIG. 55 is a. top view of the combo receptacle connector on the printed circuit board of FIG. 53 wherein the shield is shown in a transparent way to expose the inner contact arrangement.
Figure 56A:
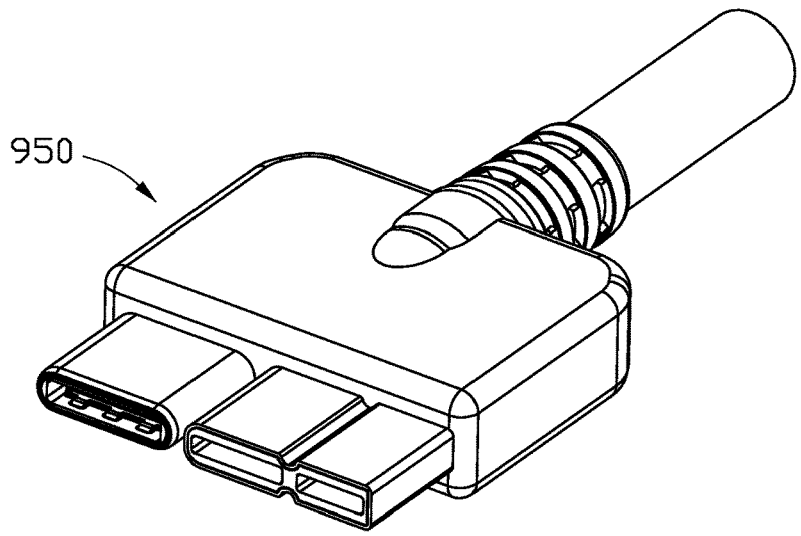
FIG. 56(A) is a perspective view of the full featured cable connector for use with the combo receptacle connector of FIG. 53.
Figure 56B:
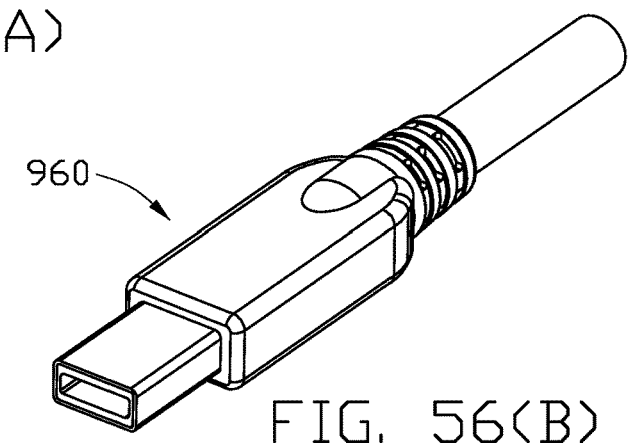
FIG. 56(B) is a perspective view of the flippable power cable connector for use with the combo receptacle connector of FIG. 53.
Figure 56C:
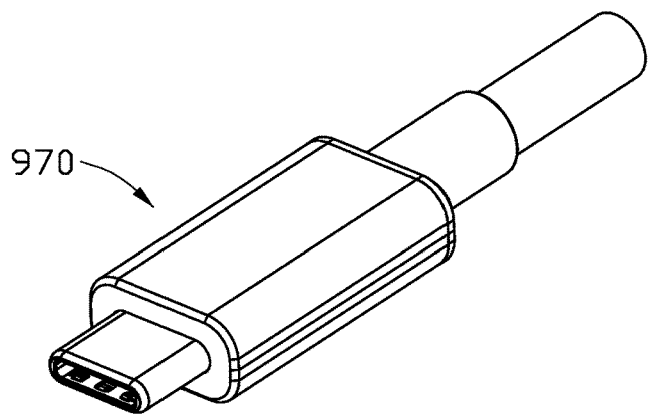
FIG. 56(C) is a perspective view of the flippable Type C cable connector for use with the combo receptacle connector of FIG. 53.
Figure 57A:
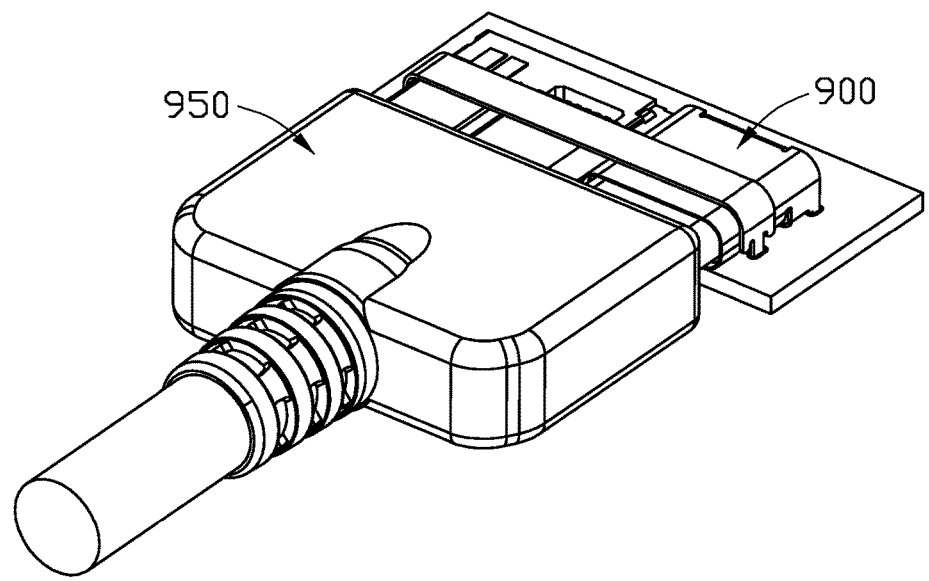
FIG. 57(A) is a perspective view of the cable connector of FIG. 56(A) used with the combo receptacle connector of FIG. 53.
Figure 57B:
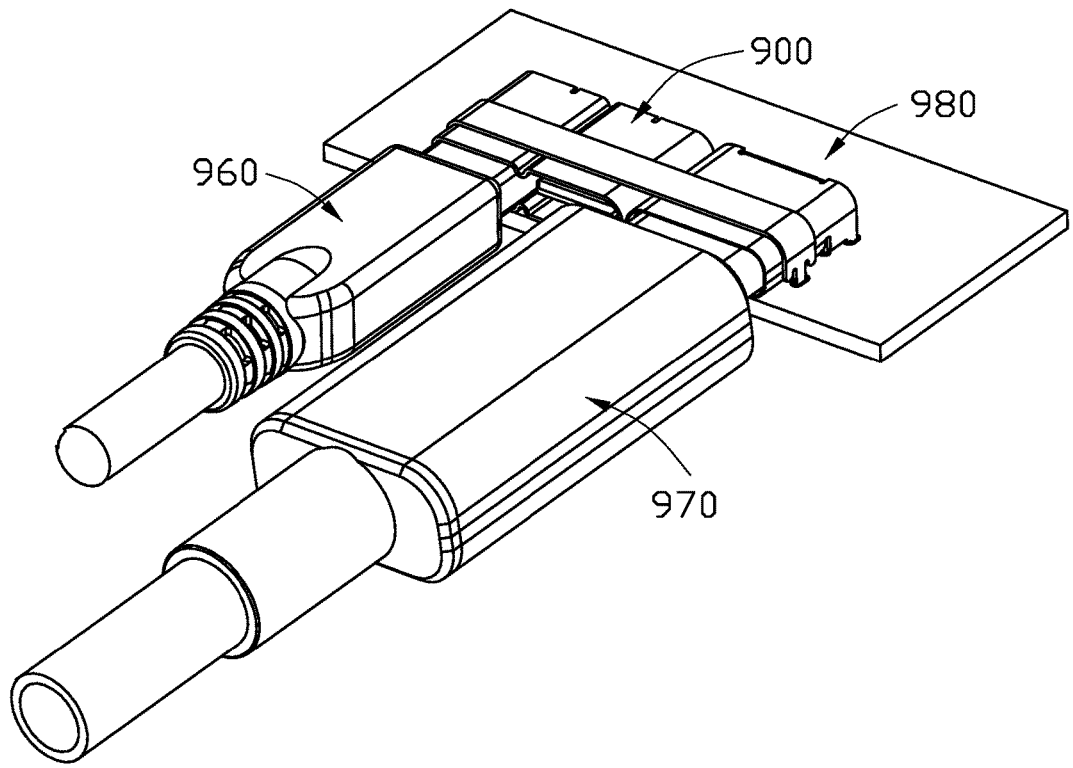
FIG. 57(B) is a perspective view of the cable connectors of FIGS. 56(B) & 56(C) simultaneously used with the combo receptacle connector of FIG. 53.

FIGS. 46-52 show a six embodiment of the receptacle connector 700 mounted upon the printed circuit board 107 according to a sixth embodiment wherein the metallic shield 710 includes the flared edges 712 for easy insertion of the corresponding plug connector. Notably, FIGS. 46-49 do not show the complete detailed structure while only illustrating the primary portions related to the emphasized features; anyhow, the whole structures may be easily gotten via referring to the previous embodiments. The bracket 750 forms a recession 752 to receive deflection of the spring tang 714 during mating with the plug connector. The inner metallic collar 720 includes the rearwardly extending plate 722 with a notch, i.e., the retention plate 722 is split into two pieces 7221 each with a bump as shown in FIG. 52, to increase resiliency thereof. The upper piece 730 forms a laterally bulged portion 732 in front of the collar 720 to protect the contacting section 734 of the outmost contact. The lower piece 740 also forms the similar laterally bulged portion 742 in front of collar 720 to protect the contacting section of the outmost contact (not shown). The middle piece 760 forms a vertically expanded portion 762 so as to efficiently retain/align the upper piece 730, the lower piece 740 and the middle piece 760 together, and a front stop 763 to stop the collar 760. One half of the width of the front tip 7341 of the contacting section 734 of the upper contact is pressed by the middle piece 760 for retention as shown in FIG. 50. Same is to the lower contact. Understandably, to have the front tip of the contacting section of the contact pressed by the insulator requires a rotational assembling between the upper/lower piece 730/740 with regard to the middle piece 760, instead of along the pure vertical direction. On the other hand, two lateral sides 7201 of the collar 720 may be inwardly crimped to secure to the middle piece 760 as shown in FIG. 52 and. The shielding plate 758 has different openings 7581, 7582 to benefit flow of the insulative material during forming process.

FIGS. 53-58(C) show a seventh embodiment of the invention wherein a combo receptacle connector 900 is mounted upon a printed circuit board 980. The combo receptacle connector 900, in this embodiment, includes an unitary insulative housing defining first, second and third mating tongues 902, 904, 906 spaced from each other in a transverse direction with the contacting sections of the corresponding contacts thereon (not labeled), and a first metallic shield 910 encloses the first mating tongue 902 to define a first mating port categorized as the Type C port, while a second metallic shield 912 encloses both the second mating tongue 904 and the third mating tongue 906 to define the second mating port and the third mating port which are categorized as the Micro DisplayPort port and the power port transversely communicating with each other. The combo receptacle connector 900 can mated with the all featured cable connector 950 in one orientation for all three mating ports (FIG. 57(A)), or with the power cable connector 760 and the Type C cable connector 770 respectively while simultaneously in the corresponding ports in a flippable way (FIG. 57(B)), or with the Micro DisplayPort cable connector (not shown) only. Understandably, to achieve the flippable way, the two rows of contacts in both the receptacle connector 500 and the cable connectors 960, 970 are required to be in a diagonally symmetrical way as shown in the pin assignment charts of FIGS. 58(A)-58(C). Notably, the housing may be divided into two pieces by breaking the bridge section to separate the first mating port fully from the remaining second and third mating ports and to be mounted upon the printed circuit board 780 independently instead of simultaneously. On the other hand, the joined second and third mating ports are essentially of a D-shaped configuration which can be altered to other shapes, if necessary.

However, the disclosure is illustrative only, changes may be made in detail, especially in matter of shape, size, and arrangement of parts within the principles of the invention.

What is claimed is:

1. A receptacle connector, comprising:
an insulating housing comprising a base and a mating tongue extending from the base, the mating tongue defining a thickened step portion at a root near to the base;
two rows of contacts with contacting section exposed to opposite surfaces of the mating tongue in front of the step portion and tail sections extending out of the base;
a pair of separate metallic collars respectively disposed upon the opposite surfaces of the step portion;
wherein two opposite ends of each metallic collar are embedded in the step portion of the insulating housing via an insert molding process.

2. The receptacle as claimed in claim 1, comprising a shielding plate, wherein the shielding plate defines a pair of locking side edges for locking with corresponding latches of a corresponding plug connector, the pair of locking side edge is in front of the opposite ends of the collars.

3. The receptacle as claimed in claim 2, wherein each collar defines retention lugs at opposite ends thereof which bend toward the shielding plate and are embedded in the step portion.

4. The receptacle as claimed in claim 3, wherein each retention lug includes a first lug with a half-circle notch at a free end of the first lug and a second lug shorter than the first lug.

5. The receptacle as claimed in claim 3, wherein the shielding plate defines two notches along a side-projecting portion of each lateral side thereof, the first lugs of the pair of the retention lugs are received in the notches.

6. The receptacle as claimed in claim 1, wherein the mating tongue includes a front section and a rear section, the front section shares a same boundary molding line with the rear section.

7. The receptacle connector as claimed in claim 1, wherein the step portion has a front portion located in front of the collars to resist the collars and the front portion.

8. The receptacle connector as claimed in claim 7, wherein the front portion has a front tilt face and a horizontal face flush with the collars.

9. The receptacle connector as claimed in claim 1, wherein each collar further forms a vertical extension in the front face of the base.

10. The receptacle connector as claimed in claim 9, wherein the vertical extension defines a pair of through holes therein.

11. A receptacle connector adapted for mounting on a printed circuit board, comprising:
- an insulating housing defining a base and a mating tongue forwardly extending therefrom in a front-to-back direction with a thicken step structure formed around a root thereof in transverse direction and a vertical direction perpendicular to the front-to-back direction, the mating tongue defining upper and lower surfaces thereof;
- a row of upper contacts and a row of lower contacts disposed in the insulative housing with contacting sections exposed upon the upper and lower surfaces of the mating tongue respectively;
- a shielding plate embedded in the mating tongue and the base, the shielding plate defines a pair of lateral locking side edges, and
- a metallic shield retained on the base and surrounding the mating tongue to define a mating cavity around the metallic shield and the mating tongue;
- wherein a rear wall of the metallic shield covers a back side of a lower portion of the base of the insulative housing so as to efficiently prevent EMI which invades through the mating cavity from rearwardly entering an interior around the printed circuit board.

12. The receptacle connector as claimed in claim 11, wherein the rear wall unitarily extends from the metallic shield.

13. The receptacle connector as claimed in claim 11, wherein the rear wall is separated from the metallic shield and made from an EMI (Electro-Magnetic Interference) gasket.

14. The receptacle connector as claimed in claim 11, wherein the receptacle connector comprises an upper bracket, the upper bracket includes a rear wall covering a back side of an upper portion of the base of the insulating housing so as to shield EMI above the printed circuit board along the front-to-back direction.

15. The receptacle connector as claimed in claim 11, wherein the rear wall of the upper bracket includes a plurality of tabs electrically and mechanically connected to corresponding pads on the printed circuit board.

16. A receptacle connector, comprising:
- an insulating housing defining a base and a mating tongue forwardly extending therefrom in a front-to-back direction with a thickened step structure formed around a root thereof in transverse direction and a vertical direction perpendicular to the front-to-back direction, the mating tongue defining upper and lower surfaces thereof;
- a row of upper contacts and a row of lower contacts disposed in the insulating housing with contacting sections exposed upon the upper and lower surfaces of the mating tongue respectively;
- a shielding plate embedded in the mating tongue and the base, the shielding plate defines a pair of lateral locking side edges, and
- a metallic shield retained on the base and surrounding the mating tongue to define a mating cavity around the metallic shield and the mating tongue, the mating cavity is for mating with a plug connector in a flippable manner;
- wherein the metallic shield has no slits thereon.

17. The receptacle connector as claimed in claim 16, wherein the metallic shield is equipped with flared flanges for easy mating with the plug connector.

18. The receptacle connector as claimed in claim 16, wherein the receptacle connector comprises an upper bracket, the upper bracket is attached on the metallic shield and includes mounting legs for mounting to a printed circuit board on which the receptacle connector is seated.

* * * * *